US012310055B2

(12) United States Patent
Choi et al.

(10) Patent No.: US 12,310,055 B2
(45) Date of Patent: May 20, 2025

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Kyungin Choi, Seoul (KR); Dongmyoung Kim, Suwon-si (KR); Haejun Yu, Osan-si (KR); Ki-Hyung Ko, Suwon-si (KR); Jiho Yoo, Seongnam-si (KR); Soonwook Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 508 days.

(21) Appl. No.: 17/718,924

(22) Filed: Apr. 12, 2022

(65) Prior Publication Data
US 2023/0068364 A1 Mar. 2, 2023

(30) Foreign Application Priority Data
Aug. 25, 2021 (KR) ........................ 10-2021-0112180

(51) Int. Cl.
*H10D 30/67* (2025.01)
*H01L 21/02* (2006.01)
(Continued)

(52) U.S. Cl.
CPC ..... *H10D 30/6713* (2025.01); *H01L 21/0259* (2013.01); *H10D 30/031* (2025.01);
(Continued)

(58) Field of Classification Search
CPC ......... H01L 29/66553; H01L 29/66742; H01L 29/045; H01L 29/42392; H01L 21/0259; H01L 29/165; H01L 29/66545; H01L 29/0665; H01L 29/775; H01L 21/823814; H01L 29/78618; H01L 29/78696; H01L 21/823807; H01L 29/0847; H01L 29/0673; H01L 27/092; H01L 21/823864; H01L 29/66439; H01L 21/823431; H01L 23/5286; H01L 23/5226; H01L 29/41791; H01L 27/0886; H01L 27/0207;
(Continued)

(56) References Cited

U.S. PATENT DOCUMENTS 9,443,769 B2 9/2016 Wang et al.
10,026,838 B2 7/2018 Wu et al.
(Continued)

*Primary Examiner* — Mouloucoulaye Inoussa
(74) *Attorney, Agent, or Firm* — Sughrue Mion, PLLC

(57) ABSTRACT

A semiconductor device includes an active pattern provided on a substrate, a source/drain pattern provided on the active pattern, a channel pattern configured to be connected to the source/drain pattern, a gate electrode configured to be extended in a first direction and to cross the channel pattern, and a first spacer provided on a side surface of the gate electrode. The first spacer includes a fence portion provided on a side surface of the active pattern and below the source/drain pattern. The source/drain pattern includes a body portion and a neck portion between the body portion and the active pattern. The body portion includes a crystalline surface configured to be slantingly extended from the neck portion. The crystalline surface is configured to be spaced apart from an uppermost portion of the fence portion.

20 Claims, 59 Drawing Sheets

(51) Int. Cl.
*H10D 30/01* (2025.01)
*H10D 62/10* (2025.01)
*H10D 64/01* (2025.01)
*H10D 84/01* (2025.01)
*H10D 84/03* (2025.01)
*H10D 84/85* (2025.01)

(52) U.S. Cl.
CPC ..... *H10D 30/6735* (2025.01); *H10D 30/6757* (2025.01); *H10D 62/118* (2025.01); *H10D 64/017* (2025.01); *H10D 64/018* (2025.01); *H10D 84/0167* (2025.01); *H10D 84/017* (2025.01); *H10D 84/038* (2025.01); *H10D 84/85* (2025.01)

(58) Field of Classification Search
CPC ............ H01L 27/0924; H01L 29/0649; H01L 29/7843; H01L 21/823821; H01L 29/7848; H01L 29/6656; H01L 29/42372; H01L 27/1211; H01L 21/845; H01L 29/1608; H01L 29/161; H01L 29/0653; H01L 21/823878; H01L 21/823871; H01L 29/66636; B82Y 10/00; H03K 3/0372; H10B 10/18; H10B 10/12
See application file for complete search history.

(56) References Cited

U.S. PATENT DOCUMENTS

| | | | |
|---|---|---|---|
| 10,128,333 | B2 | 11/2018 | Wong et al. |
| 10,256,243 | B2 | 4/2019 | Li |
| 10,319,721 | B2 | 6/2019 | Seo |
| 10,756,170 | B2 | 8/2020 | Cheng et al. |
| 2015/0318399 | A1 | 11/2015 | Jeong et al. |
| 2016/0315081 | A1 | 10/2016 | Park et al. |
| 2017/0148914 | A1* | 5/2017 | Lee ...................... H01L 29/0649 |
| 2017/0345911 | A1 | 11/2017 | Yu et al. |
| 2018/0277543 | A1 | 9/2018 | Kim et al. |
| 2020/0066869 | A1 | 2/2020 | Tsai et al. |
| 2020/0111789 | A1 | 4/2020 | Li |
| 2021/0043730 | A1* | 2/2021 | Lee ...................... H01L 29/7851 |
| 2021/0075406 | A1* | 3/2021 | Kim ................ H01L 21/823431 |

* cited by examiner

SEMICONDUCTOR DEVICE AND METHOD OF FABRICATING THE SAME

CROSS-REFERENCE TO RELATED APPLICATION(S)

This application claims priority under 35 U.S.C. § 119 to Korean Patent Application No. 10-2021-0112180, filed on Aug. 25, 2021, in the Korean Intellectual Property Office, the entire contents of which are hereby incorporated by reference.

BACKGROUND

1. Field

The disclosure relates generally to a semiconductor device and a method of fabricating the same, and in particular, to a semiconductor device including a field effect transistor (FET) and a method of fabricating the same.

2. Description of Related Art

A semiconductor device may include an integrated circuit including metal-oxide-semiconductor (MOS) field-effect transistors (FETs) (MOSFETs). To meet an increasing demand for a semiconductor device with a small pattern size and a reduced design rule, the MOSFETs are being aggressively scaled down. The scale-down of the MOSFETs may lead to deterioration in operational properties of the semiconductor device. A variety of studies are being conducted to overcome technical limitations associated with the scale-down of the semiconductor device and to realize the semiconductor devices with high performance.

SUMMARY

Provided is a semiconductor device and a method of fabricating a semiconductor device with improved electric and reliability characteristics.

Additional aspects will be set forth in part in the description which follows and, in part, will be apparent from the description, or may be learned by practice of the presented embodiments.

In accordance with an aspect of the disclosure, a semiconductor device may include an active pattern provided on a substrate, a source/drain pattern provided on the active pattern, a channel pattern configured to be connected to the source/drain pattern, a gate electrode configured to be extended in a first direction and to cross the channel pattern, and a first spacer provided on a side surface of the gate electrode. The first spacer may include a fence portion provided on a side surface of the active pattern and below the source/drain pattern. The source/drain pattern may include a body portion and a neck portion between the body portion and the active pattern. The body portion may include a crystalline surface configured to be slantingly extended from the neck portion. The crystalline surface may be configured to be spaced apart from an uppermost portion of the fence portion.

In accordance with an aspect of the disclosure, a semiconductor device may include an active pattern provided on a substrate, a source/drain pattern provided on the active pattern, a channel pattern configured to be connected to the source/drain pattern, a gate electrode configured to be extended in a first direction and to cross the channel pattern, a first spacer provided on the active pattern, and a second spacer provided on the source/drain pattern. The source/drain pattern may include a body portion and a neck portion between the body portion and the active pattern. The body portion may include a crystalline surface configured to be slantingly extended from the neck portion. A top surface of the neck portion may be exposed between the crystalline surface and the first spacer. The second spacer may be configured to cover the top surface of the neck portion.

In accordance with an aspect of the disclosure, a semiconductor device may include a first active pattern and a second active pattern which are respectively provided on p-type metal-oxide-semiconductor (MOS) field-effect transistor (FET) (MOSFET) (PMOSFET) and n-type MOSFET (NMOSFET) regions of a substrate, a device isolation layer configured to fill a trench between the first active pattern and the second active pattern, a first source/drain pattern and a second source/drain pattern provided on the first active pattern and the second active pattern, respectively, a first channel pattern provided on the first active pattern and configured to be connected to the first source/drain pattern, a second channel pattern provided on the second active pattern and configured to be connected to the second source/drain pattern, where the first channel pattern includes a first semiconductor pattern, a second semiconductor pattern, and a third semiconductor pattern, configured to be sequentially stacked to be spaced apart from each other, and where the second channel pattern includes a fourth semiconductor pattern, a fifth semiconductor pattern, and a sixth semiconductor pattern configured to be sequentially stacked to be spaced apart from each other, a gate electrode configured to be extended from a first region on the first channel pattern to a second region on the second channel pattern, the gate electrode configured to enclose each of the first to sixth semiconductor patterns, a gate insulating layer provided between the channel patterns and the gate electrode, a spacer provided on a side surface of the gate electrode, a gate capping pattern provided on a top surface of the gate electrode, a first interlayer insulating layer provided on the gate capping pattern, an active contact configured to penetrate the first interlayer insulating layer and configured to be coupled to at least one of the first source/drain pattern and the second source/drain pattern, a gate contact configured to penetrate the first interlayer insulating layer and configured to be coupled to the gate electrode, a second interlayer insulating layer provided on the first interlayer insulating layer, a first metal layer provided in the second interlayer insulating layer, the first metal layer including first interconnection lines configured to be electrically connected to the active contact and the gate contact, a third interlayer insulating layer provided on the second interlayer insulating layer, and a second metal layer provided in the third interlayer insulating layer. The second metal layer may include second interconnection lines configured to be electrically connected to the first interconnection lines. The spacer may include a first spacer and a second spacer provided on the first spacer. A dielectric constant of the first spacer may be less than a dielectric constant of the second spacer. The first spacer may be configured to be extended from a side surface of the first active pattern to a side surface of the second active pattern while covering a top surface of the device isolation layer. The second spacer may be configured to be extended from the first source/drain pattern to the second source/drain pattern along the first spacer.

In accordance with an aspect of the disclosure, a method of fabricating a semiconductor device may include alternately stacking sacrificial layers and active layers on a substrate, forming a stacking pattern on an active pattern by patterning the sacrificial layers and the active layers, forming a sacrificial pattern to cross the stacking pattern, forming a first spacer on the sacrificial pattern, forming a recess by etching the stacking pattern, which is located at a side of the sacrificial pattern, using the first spacer as an etch mask, forming a source/drain pattern in the recess, forming an oxide layer on a surface of the source/drain pattern by selectively oxidizing the surface of the source/drain pattern, removing the first spacer, forming a second spacer.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 2:
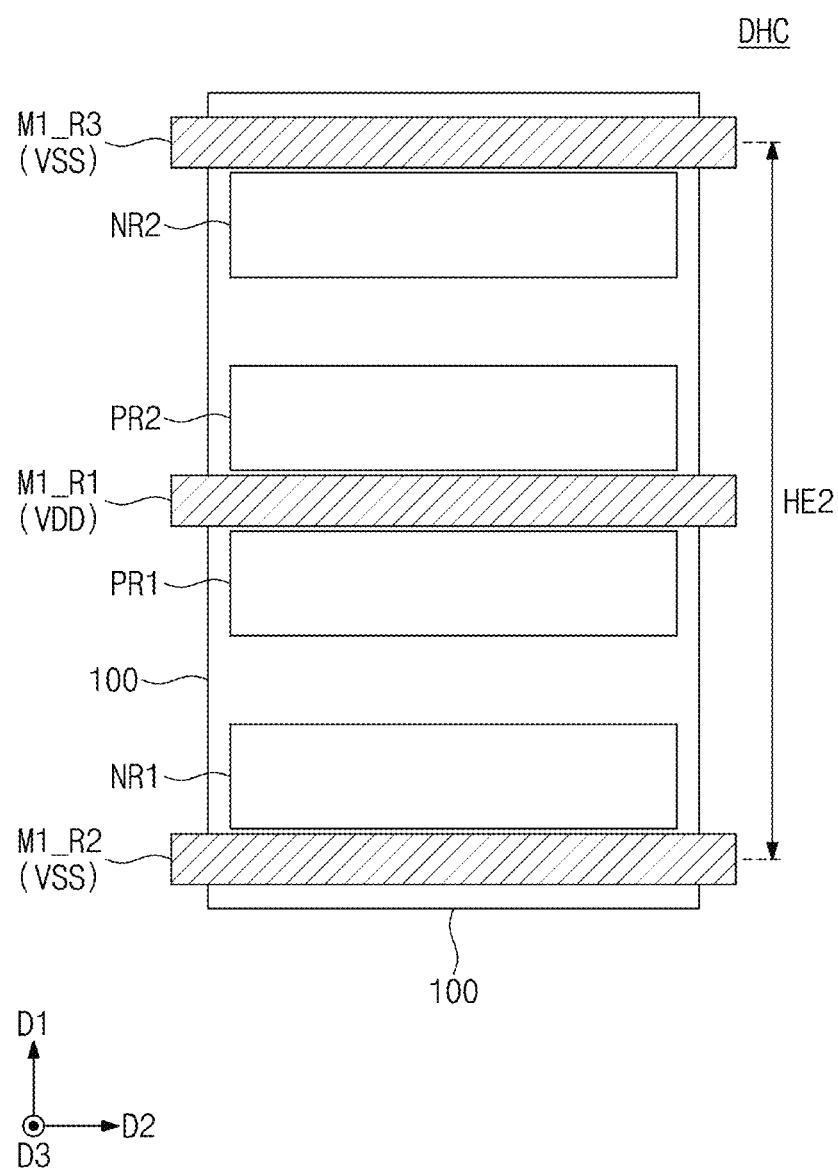
Figure 3:
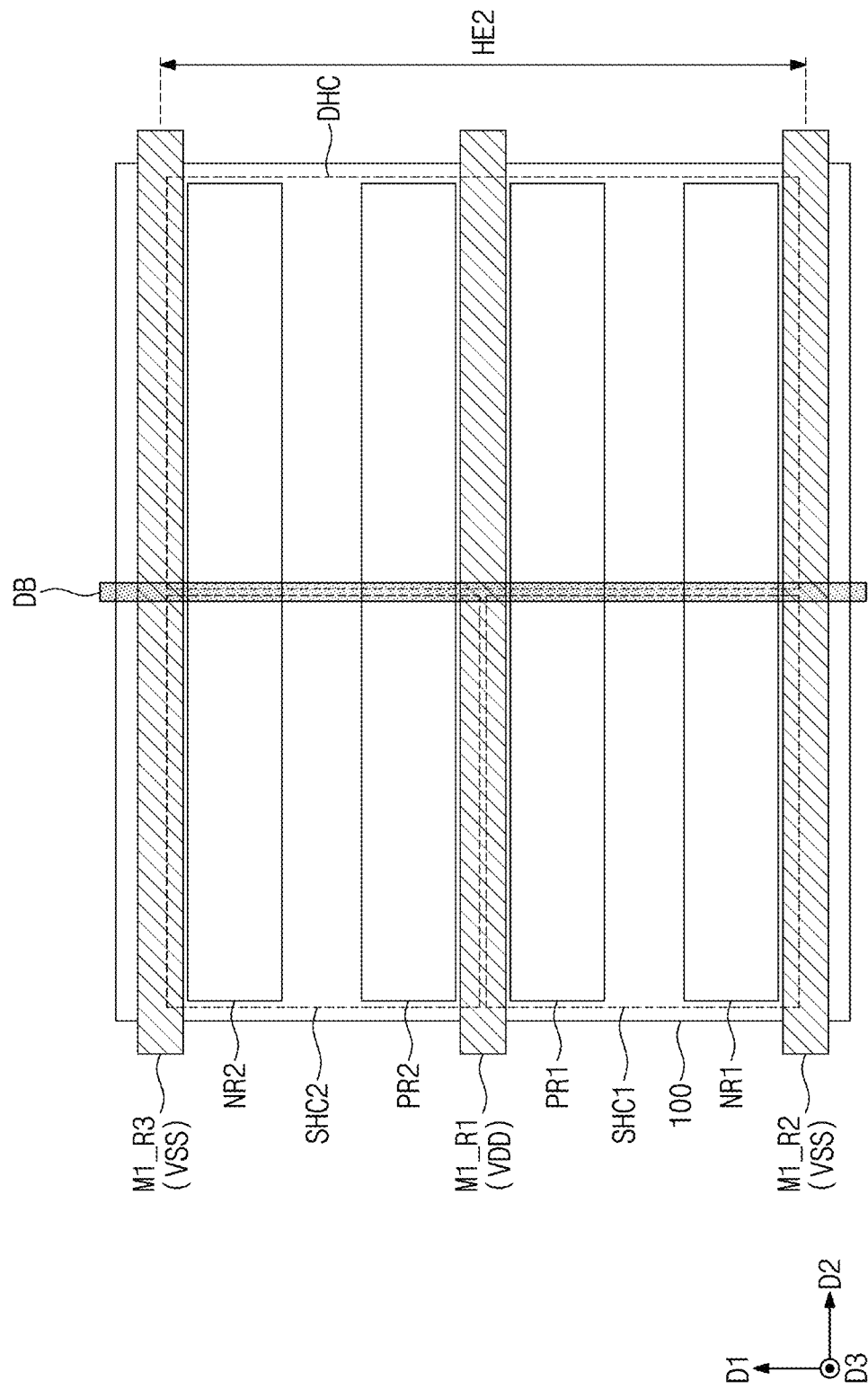

Hereinafter, various embodiments of the inventive concept are described with reference to the accompanying drawings. The embodiments described herein are example embodiments, and thus, the inventive concept is not limited thereto and may be realized in various other forms. As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. In the present specification, the pattern signal may refer to a signal having a waveform that is periodically repeated, FIGS. 1, 2 and 3 are diagrams illustrating logic cells of a semiconductor device according to an embodiment.

Figure 1:
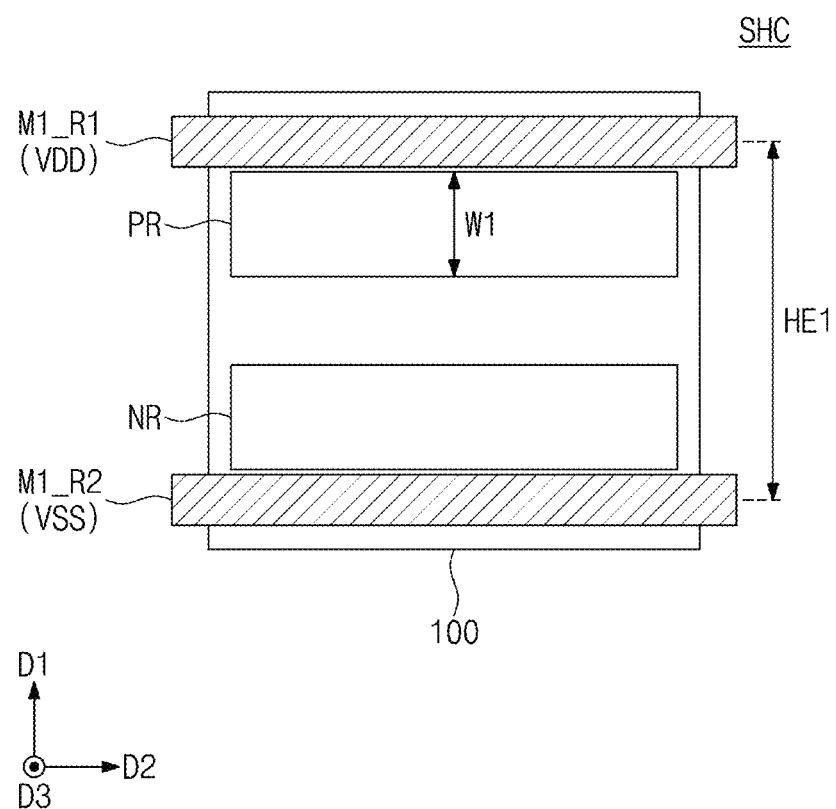
FIGS. 1, 2 and 3 are diagrams illustrating logic cells of a semiconductor device according to an embodiment.

Referring to FIG. 1, a single height cell SHC may be provided. In detail, a first power line M1_R1 and a second power line M1_R2 may be provided on a substrate 100. The first power line M1_R1 may be a conduction path, to which a drain voltage VDD (e.g., a power voltage) is provided. The second power line M1_R2 may be a conduction path, to which a source voltage VSS (e.g., a ground voltage) is provided.

The single height cell SHC may be defined between the first power line M1_R1 and the second power line M1_R2. The single height cell SHC may include one p-type metal-oxide-semiconductor (MOS) field-effect transistor (FET) (MOSFET) (PMOSFET) region PR and one n-type MOSFET (NMOSFET) region NR. In other words, the single height cell SHC may have a CMOS structure provided between the first and second power lines M1_R1 and M1_R2.

Each of the PMOSFET and NMOSFET regions PR and NR, respectively, may have a first width W1 in a first direction D1. A length of the single height cell SHC in the first direction D1 may be defined as a first height HE1. The first height HE1 may be substantially equal to a distance (e.g., a pitch) between the first and second power lines M1_R1 and M1_R2.

The single height cell SHC may constitute a single logic cell. The logic cell may refer to a logic device (e.g., AND, OR, XOR, XNOR, inverter, and so forth), which is configured to execute a specific function. In other words, the logic cell may include transistors constituting the logic device and interconnection lines connecting transistors to each other.

Referring to FIG. 2, a double height cell DHC may be provided. In detail, the first power line M1_R1, the second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the drain voltage VDD is provided.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R1. When viewed in a plan view, the first power line M1_R1 may be disposed between the first and second PMOSFET regions PR1 and PR2.

A length of the double height cell DHC in the first direction D1 may be defined as a second height HE2. The second height HE2 may be about two times the first height HE1 of FIG. 1. The first and second PMOSFET regions PR1 and PR2 of the double height cell DHC may be combined to serve as a single PMOSFET region.

Thus, a channel size of a p-type MOS (PMOS) transistor of the double height cell DHC may be greater than a channel size of a PMOS transistor of the single height cell SHC previously described with reference to FIG. 1. For example, the channel size of the PMOS transistor of the double height cell DHC may be about two times the channel size of the PMOS transistor of the single height cell SHC. In this case, the double height cell DHC may be operated at a higher speed than the single height cell SHC. In an embodiment, the double height cell DHC shown in FIG. 2 may be defined as a multi-height cell. The multi-height cell may include a triple height cell whose cell height is about three times that of the single height cell SHC.

Referring to FIG. 3, a first single height cell SHC1, a second single height cell SHC2, and the double height cell DHC may be two-dimensionally disposed on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. The active region of the double height cell DHC may be electrically separated from the active region of each of the first and second single height cells SHC1 and SHC2 by the division structure DB.

Figure 4:
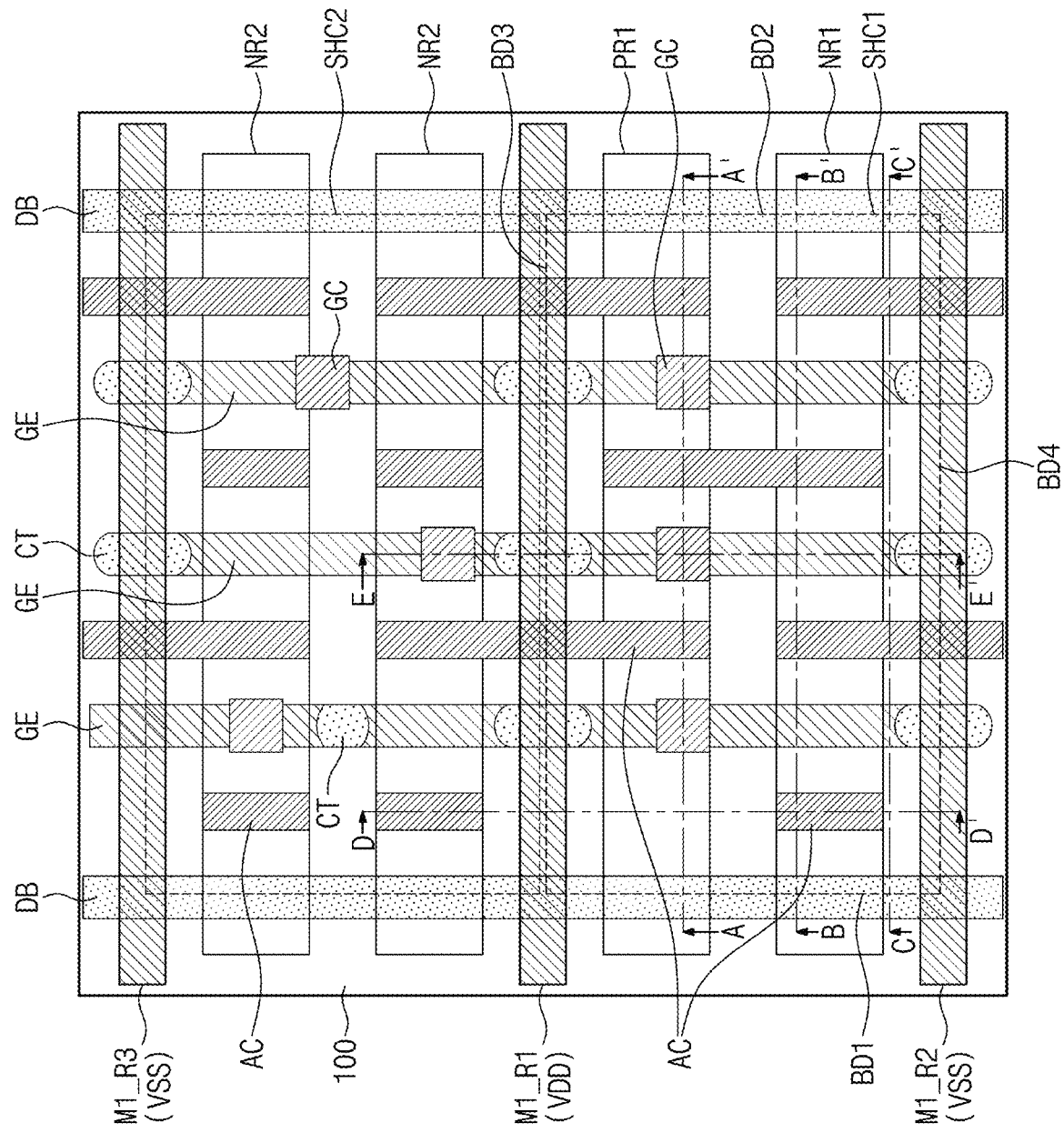
FIG. 4 is a plan view illustrating a semiconductor device according to an embodiment.

FIG. 4 is a plan view illustrating a semiconductor device according to an embodiment. FIGS. 5A, 5B, 5C and 5D are sectional views taken along lines A-A', B-B', C-C', and D-D', respectively, of FIG. 4 according to an embodiment. FIG. 6A is an enlarged sectional view illustrating a portion 'L' of FIG. 5C according to an embodiment. FIG. 6B is a top plan view, which is taken at a level M-M' of FIG. 5A and a level N-N' of FIG. 5B, according to an embodiment. FIGS. 4 and 5A to 5D illustrate an example of a detailed structure of the first and second single height cells SHC1 and SHC2 of FIG. 3.

Referring to FIGS. 4 and 5A to 5D, the first and second single height cells SHC1 and SHC2 may be provided on the substrate 100. Logic transistors constituting the logic circuit may be disposed on each of the first and second single height cells SHC1 and SHC2. The substrate 100 may be a semiconductor substrate that is formed of or includes silicon (Si), germanium (Ge), silicon germanium (SiGe), a compound semiconductor material, or the like. In an embodiment, the substrate 100 may be a silicon wafer.

The substrate 100 may include the first PMOSFET region PR1, the second PMOSFET region PR2, the first NMOSFET region NR1, and the second NMOSFET region NR2. Each of the first PMOSFET region PR1, the second PMOSFET region PR2, the first NMOSFET region NR1, and the second NMOSFET region NR2 may be extended in the second direction D2. The first single height cell SHC1 may include the first NMOSFET region NR1 and the first PMOSFET region PR1, and the second single height cell SHC2 may include the second PMOSFET region PR2 and the second NMOSFET region NR2.

A first active pattern AP1 and a second active pattern AP2 may be defined by a trench TR, which is formed in an upper portion of the substrate 100. The first active pattern AP1 may be provided on each of the first and second PMOSFET regions PR1 and PR2. The second active pattern AP2 may be provided on each of the first and second NMOSFET regions NR1 and NR2. The first and second active patterns AP1 and AP2 may be extended in the second direction D2. Each of the first and second active patterns AP1 and AP2 may be a vertically-protruding portion of the substrate 100.

A device isolation layer ST may be provided to fill the trench TR. The device isolation layer ST may include a Si oxide layer. The device isolation layer ST may not cover first and second channel patterns CH1 and CH2 to be described below.

The first channel pattern CH1 may be provided on the first active pattern AP1. The second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or include at least one of Si, Ge, or SiGe. In an embodiment, each of the first to third semiconductor patterns SP1, SP2, and SP3 may be formed of or include crystalline Si.

A plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked first to third semiconductor patterns SP1, SP2, and SP3.

A plurality of second source/drain patterns SD2 may be provided on the second active pattern AP2. A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. In other words, each pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. As an example, a top surface of each of the first and second source/drain patterns SD1 and SD2 may be located at substantially the same level as a top surface of the third semiconductor pattern SP3. Alternatively, the top surface of each of the first and second source/drain patterns SD1 and SD2 may be higher than the top surface of the third semiconductor pattern SP3.

The first source/drain patterns SD1 may include a semiconductor material (e.g., SiGe) having a lattice constant greater than that of the substrate 100. In this case, the pair of the first source/drain patterns SD1 may exert a compressive stress on the first channel patterns CH1 therebetween. The second source/drain patterns SD2 may be formed of or include the same semiconductor element (e.g., Si) as the substrate 100.

Each of the first source/drain patterns SD1 may include a first semiconductor layer SEL1 and a second semiconductor layer SEL2, which are sequentially stacked. A sectional shape of the first source/drain pattern SD1 in the second direction D2 will be described in more detail with reference to FIG. 5A.

The first semiconductor layer SEL1 may cover an inner surface of the first recess RS1. The first semiconductor layer SEL1 may have a decreasing thickness in an upward direction. For example, the thickness of the first semiconductor layer SEL1, which is measured in the third direction D3 at the bottom level of the first recess RS1, may be greater than the thickness of the first semiconductor layer SEL1, which is measured in the second direction D2 at the top level of the first recess RS1. The first semiconductor layer SEL1 may have a 'U'-shaped section, due to a sectional profile of the first recess RS1.

The second semiconductor layer SEL2 may fill a remaining space of the first recess RS1 excluding the first semiconductor layer SEL1. A volume of the second semiconductor layer SEL2 may be greater than a volume of the first semiconductor layer SEL1. In other words, a ratio of the volume of the second semiconductor layer SEL2 to a total volume of the first source/drain pattern SD1 may be greater than a ratio of the volume of the first semiconductor layer SEL1 to the total volume of the first source/drain pattern SD1.

Each of the first and second semiconductor layers SEL1 and SEL2 may be formed of or include SiGe. In detail, the first semiconductor layer SEL1 may be provided to have a relatively low Ge concentration. In another embodiment, the first semiconductor layer SEL1 may be provided to contain only Si and not Ge. The Ge concentration of the first semiconductor layer SEL1 may range from about 0% to about 10%.

The second semiconductor layer SEL2 may be provided to have a relatively high Ge concentration. As an example, the Ge concentration of the second semiconductor layer SEL2 may range from about 30% to about 70%. The Ge concentration of the second semiconductor layer SEL2 may increase in the third direction D3. For example, the Ge concentration of the second semiconductor layer SEL2 may be about 40% near the first semiconductor layer SEL1 but may be about 60% at its top level.

The first and second semiconductor layers SEL1 and SEL2 may include impurities (e.g., boron), allowing the first source/drain pattern SD1 to have the p-type conductivity. In an embodiment, a concentration of impurities in the second semiconductor layer SEL2 (in %) may be greater than that in the first semiconductor layer SEL1.

The first semiconductor layer SEL1 may prevent a stacking fault from occurring between the substrate 100 and the second semiconductor layer SEL2 and between the first to third semiconductor patterns SP1, SP2, and SP3 and the second semiconductor layer SEL2. The stacking fault may lead to an increase of a channel resistance. The stacking fault may easily occur on the bottom of the first recess RS1. Thus, to prevent the stacking fault, the first semiconductor layer SEL1 may be provided to have a relatively large thickness near the bottom of the first recess RS1.

The first semiconductor layer SEL1 may protect the second semiconductor layer SEL2, in a process of replacing sacrificial layers SAL with first to third portions PO1, PO2, and PO3 of a gate electrode GE, which will be described below. For example, the first semiconductor layer SEL1 may prevent the second semiconductor layer SEL2 from being undesirably etched by an etching material, which is used to remove the sacrificial layers SAL.

The gate electrodes GE (hereinafter, each gate electrode may be referred to as GE) may be provided to cross the first and second channel patterns CH1 and CH2 and to extend in the first direction D1. The gate electrodes GE may be arranged at a first pitch in the second direction D2. The gate electrodes GE may be vertically overlapped with the first and second channel patterns CH1 and CH2.

Each gate electrode GE may include a first portion PO1 interposed between the active pattern AP1 or the active pattern AP2 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Referring back to FIG. 5A, the first to third portions PO1, PO2, and PO3 of the gate electrode GE on the PMOSFET region PR may have different widths from each other. For example, the largest width of the third portion PO3 in the second direction D2 may be larger than the largest width of the second portion PO2 in the second direction D2. The largest width of the first portion PO1 in the second direction D2 may be larger than the largest width of the third portion PO3 in the second direction D2.

Referring back to FIG. 5D, the gate electrode GE may be provided on a top surface TS, a bottom surface BS, and opposite side surfaces SW1 and SW2 of each of the first to third semiconductor patterns SP1, SP2, and SP3. That is, the transistor according to an embodiment may be a three-dimensional field effect transistor (e.g., multi-bridge channel FET (MBCFET) or gate-all-around FET (GAAFET)) in which the gate electrode GE is provided to three-dimensionally surround the channel pattern.

As an example, the first single height cell SHC1 may have a first border BD1 and a second border BD2, which are opposite to each other in the second direction D2. The first and second borders BD1 and BD2 may be extended in the first direction D1. The first single height cell SHC1 may have a third border BD3 and a fourth border BD4, which are opposite to each other in the first direction D1. The third and fourth borders BD3 and BD4 may be extended in the second direction D2.

Gate cutting patterns CT may be disposed on a border, which is parallel to the second direction D2, of each of the first and second single height cells SHC1 and SHC2. For example, the gate cutting patterns CT may be disposed on the third and fourth borders BD3 and BD4 of the first single height cell SHC1. The gate cutting patterns CT may be arranged at the first pitch along the third border BD3. The gate cutting patterns CT may be arranged at the first pitch along the fourth border BD4. When viewed in a plan view, the gate cutting patterns CT on the third and fourth borders BD3 and BD4 may be disposed to be overlapped with the gate electrodes GE, respectively. The gate cutting patterns CT may be formed of or include at least one insulating material (e.g., Si oxide, Si nitride, or combinations thereof).

The gate electrode GE on the first single height cell SHC1 (e.g., GE2) may be separated from the gate electrode GE on the second single height cell SHC2 (e.g., GE1) by the gate cutting pattern CT. The gate cutting pattern CT may be interposed between the gate electrodes GE on the first and second single height cells SHC1 and SHC2 which are aligned to each other in the first direction D1. In other words, the gate electrode GE extending in the first direction D1 may be divided into a plurality of the gate electrodes by the gate cutting patterns CT.

Referring back to FIG. 4, at least one of the gate cutting patterns CT may be located in a cell, not on a border of the cell. For example, the gate cutting pattern CT may be disposed between the second PMOSFET and NMOSFET regions PR2 and NR2 of the second single height cell SHC2.

Referring back to FIGS. 4 and 5A to 5D, spacers GS may be respectively disposed on opposite side surfaces of the fourth portion PO4 of the gate electrode GE. The spacer GS may be extended along the gate electrode GE and in the first direction D1. A top surface of the spacer GS may be higher than the top surface of the gate electrode GE. The top surface of the spacer GS may be coplanar with a top surface of a first interlayer insulating layer 110, which will be described below. The spacer GS may be formed of or include at least one of Si carbon-nitride (SiCN), Si carbon-oxygen-nitride (SiCON), or Si nitride (SiN). In an embodiment, the spacers GS may be a multi-layered structure, which is formed of or includes at least two different materials selected from SiCN, SiCON, and SiN.

In an embodiment, the spacer GS may include a first spacer GS1 on a side surface of the gate electrode GE and a second spacer GS2 on the first spacer GS1. Each of the first and second spacers GS1 and GS2 may be formed of or include a Si-containing insulating material.

In detail, the first spacer GS1 may be formed of or include a Si-containing low-k dielectric material (e.g., SiCON). Referring to FIG. 5C, the first spacer GS1 may cover a top surface of the device isolation layer ST and an upper side surface of each of the first and second active patterns AP1 and AP2. The first spacer GS1 may cover a lower side surface of each of the first and second source/drain patterns SD1 and SD2. A portion of the first spacer GS1, which covers the lower side surface of each of the first and second source/drain patterns SD1 and SD2, may be defined as a fence portion FEP.

The second spacer GS2 may be formed of or include a Si-containing insulating material (e.g., SiN) having a good etch resistant property. The second spacer GS2 may be extended from the first spacer GS1 to cover an upper portion of each of the first and second source/drain patterns SD1 and SD2. The second spacer GS2 may be used as an etch stop layer in a process of forming active contacts AC, which will be described below.

The spacer GS on the first and second PMOSFET regions PR1 and PR2 may have substantially the same structure and thickness as the spacer GS on the first and second NMOSFET regions NR1 and NR2.

Referring back to FIGS. 4 and 5A to 5D, a gate capping pattern GP may be provided on the gate electrode GE. The gate capping pattern GP may be extended along the gate electrode GE or in the first direction D1. The gate capping pattern GP may be formed of or include a material having an etch selectivity with respect to first and second interlayer insulating layers 110 and 120, which will be described below. In detail, the gate capping pattern GP may be formed of or include at least one of Si-oxynitride (SiON), SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and opposite side surfaces SW1 and SW2 of each of the first to third semiconductor patterns SP1, SP2, and SP3. The gate insulating layer GI may cover the top surface of the device isolation layer ST below the gate electrode GE (e.g., FIG. 5D).

In an embodiment, the gate insulating layer GI may include a Si oxide layer, a Si oxynitride layer, and/or a high-k dielectric layer. The high-k dielectric layer may be formed of or include at least one high-k dielectric materials whose dielectric constants are higher than that of Si oxide. For example, the high-k dielectric material may include at least one of hafnium (Hf) oxide, Hf Si oxide, Hf zirconium (Zr) oxide, Hf tantalum (Ta) oxide, lanthanum (La) oxide, Zr oxide, Zr Si oxide, Ta oxide, titanium (Ti) oxide, barium strontium (Sr) Ti oxide, barium Ti oxide, Sr Ti oxide, lithium oxide, aluminum (Al) oxide, lead scandium Ta oxide, or lead zinc niobate.

In another embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, Hf oxide, Hf Zr oxide, barium strontium titanium oxide, barium titanium oxide, and/or lead Zr titanium oxide. Here, the Hf Zr oxide may be Hf oxide that is doped with Zr. Alternatively, the Hf Zr oxide may be a compound composed of Hf, Zr, and/or oxygen (O).

The ferroelectric layer may further include dopants. For example, the dopants may include at least one of Al, Ti, niobium (Nb), La, yttrium (Y), magnesium (Mg), Si, calcium (Ca), cerium (Ce), dysprosium (Dy), erbium (Er), gadolinium (Gd), Ge, scandium (Sc), Sr, and/or tin (Sn). The kind of the dopants in the ferroelectric layer may vary depending on a ferroelectric material included in the ferroelectric layer.

In the case where the ferroelectric layer includes Hf oxide, the dopants in the ferroelectric layer may include at least one of, for example, Gd, Si, Zr, Al, and/or Y.

In the case where the dopants are Al, a content of Al in the ferroelectric layer may range from about 3% to about 8% (atomic percentage). Here, the content of the dopants (e.g., Al atoms) may be a ratio of the number of Al atoms to the number of Hf and Al atoms.

In the case where the dopants are Si, a content of Si in the ferroelectric layer may range from about 2% to about 10%. In the case where the dopants are Y, a content of Y in the ferroelectric layer may range from about 2% to about 10%. When the dopants are Gd, a content of Gd in the ferroelectric layer may range from about 1% to about 7%. In the case where the dopants are Zr, a content of Zr in the ferroelectric layer may range from about 50% to about 80%.

The paraelectric layer may have the paraelectric property. The paraelectric layer may be formed of or include at least one of, for example, Si oxide and/or high-k metal oxides. The metal oxides, which can be used as the paraelectric layer, may include at least one of, for example, Hf oxide, Zr oxide, and/or Al oxide, but the embodiments are not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain Hf oxide, a crystal structure of the Hf oxide in the ferroelectric layer may be different from a crystal structure of the Hf oxide in the paraelectric layer.

The ferroelectric layer may exhibit the ferroelectric property, only when its thickness is in a specific range. In an embodiment, the ferroelectric layer may have a thickness ranging from about 0.5 to about 10 nm, but the embodiments are not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work-function metal.

The first metal pattern may include a metal nitride layer. For example, the first metal pattern may include a layer that is composed of at least one metallic material, which is selected from the group including Ti, Ta, Al, tungsten (W) and molybdenum (Mo), and N. In an embodiment, the first metal pattern may further include carbon (C). The first metal pattern may include a plurality of stacked work-function metal layers.

The second metal pattern may be formed of or include a metallic material whose resistance is lower than the first metal pattern. For example, the second metal pattern may include at least one metallic material, which is selected from the group consisting of W, Al, Ti, and Ta. The fourth portion PO4 of the gate electrode GE may include the first metal pattern and the second metal pattern on the first metal pattern.

Referring back to FIG. 5B, inner spacers IP may be provided on the first and second NMOSFET regions NR1 and NR2. The inner spacers IP may be respectively interposed between the first to third portions PO1, PO2, and PO3 of the gate electrode GE and the second source/drain pattern SD2. The inner spacers IP may be in direct contact with the second source/drain pattern SD2. Each of the first to third portions PO1, PO2, and PO3 of the gate electrode GE may be spaced apart from the second source/drain pattern SD2 by the inner spacer IP.

A first interlayer insulating layer 110 may be provided on the substrate 100. The first interlayer insulating layer 110 may cover the spacers GS and the first and second source/drain patterns SD1 and SD2. The first interlayer insulating layer 110 may have a top surface that is substantially coplanar with the top surface of the gate capping pattern GP and the top surface of the spacer GS. A second interlayer insulating layer 120 may be formed on the first interlayer insulating layer 110 to cover the gate capping pattern GP. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may include a Si oxide layer.

A pair of division structures DB may be provided at both sides of each of the first and second single height cells SHC1 and SHC2 to be opposite to each other in the second direction D2. For example, the pair of the division structures DB may be respectively provided on the first and second borders BD1 and BD2 of the first single height cell SHC1. The division structure DB may be extended in the first direction D1 to be parallel to the gate electrodes GE. A pitch between the division structure DB and the gate electrode GE adjacent thereto may be equal to the first pitch.

The division structure DB may be provided to penetrate the first and second interlayer insulating layers 110 and 120 and may be extended into the first and second active patterns AP1 and AP2. The division structure DB may be provided to penetrate an upper portion of each of the first and second active patterns AP1 and AP2. The division structure DB may electrically separate an active region of each of the first and second single height cells SHC1 and SHC2 from an active region of a neighboring cell.

The active contacts AC may be provided to penetrate the first and second interlayer insulating layers 110 and 120 and to be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern extending in the first direction D1.

The active contact AC may be a self-aligned contact. For example, the active contact AC may be formed by a self-alignment process using the gate capping pattern GP and the spacer GS. In an embodiment, the active contact AC may cover at least a portion of the side surface of the spacer GS. The active contact AC may cover a portion of the top surface of the gate capping pattern GP.

Silicide patterns SC may be respectively interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include at least one metal silicide material (e.g., Ti silicide, Ta silicide, W silicide, nickel (Ni) silicide, and cobalt (Co) silicide).

Gate contacts GC may be provided to penetrate the second interlayer insulating layer 120 and the gate capping pattern GP and to be electrically connected to the gate electrodes GE, respectively. When viewed in a plan view, the gate contacts GC on the first single height cell SHC1 may be disposed to be overlapped with the first PMOSFET region PR1. In other words, the gate contacts GC on the first single height cell SHC1 may be provided on the first active pattern AP1 (e.g., FIG. 5A).

The gate contact GC may be freely disposed on the gate electrode GE, without any limitation in its position. For example, the gate contacts GC on the second single height cell SHC2 may be respectively disposed on the second PMOSFET region PR2, the second NMOSFET region NR2, and the device isolation layer ST filling the trench TR (e.g., FIG. 4).

Figure 5A:
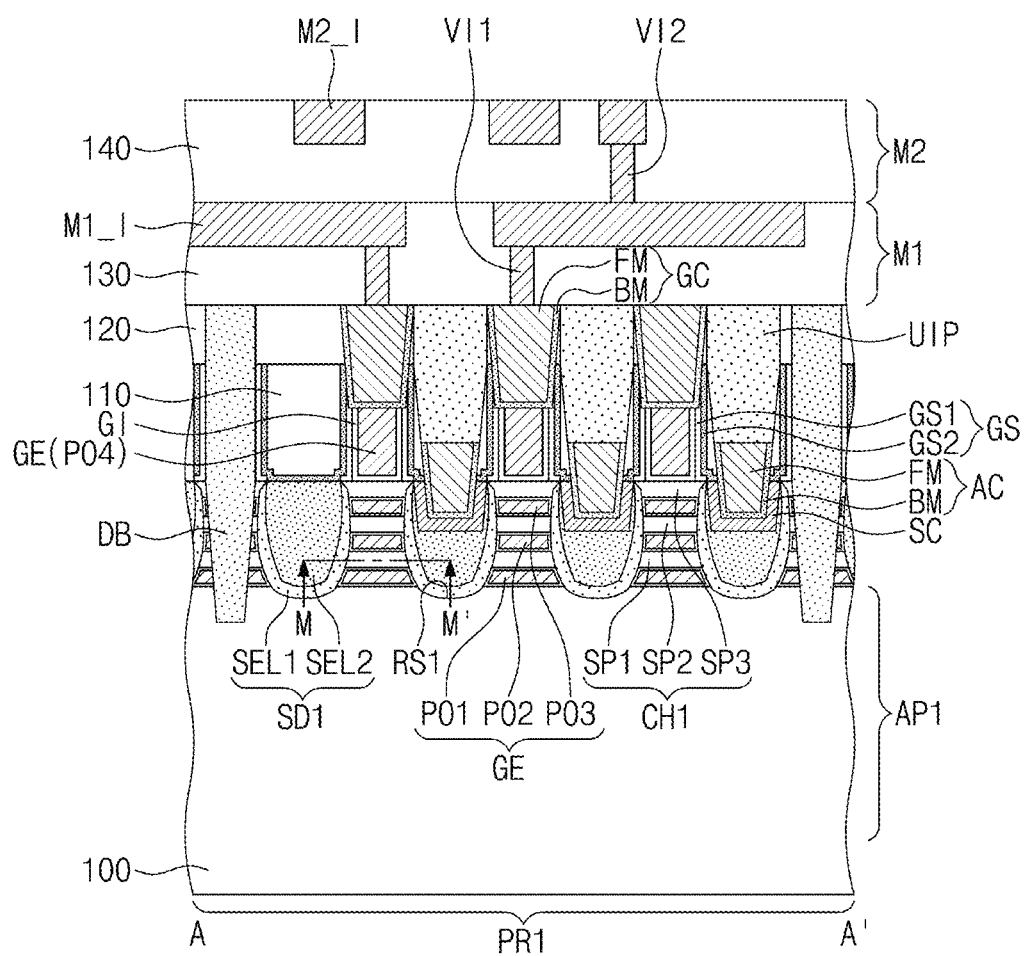
FIGS. 5A, 5B, 5C and 5D are sectional views taken along lines A-A', B-B', C-C', and D-D', respectively, of FIG. 4 according to an embodiment.
Figure 5A:
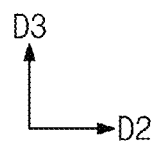
Figure 6A:
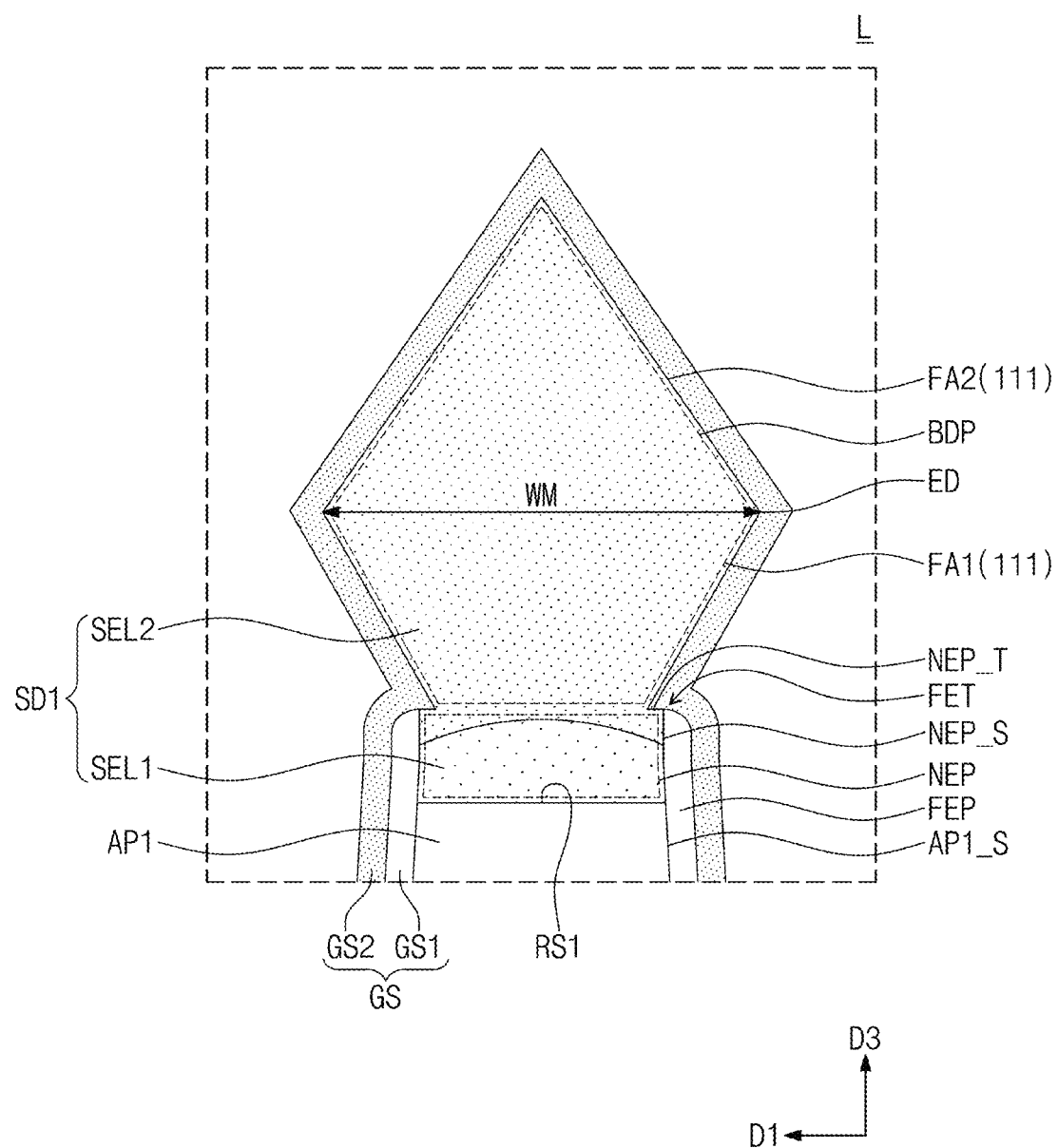
FIG. 6A is an enlarged sectional view illustrating a portion 'L' of FIG. 5C according to an embodiment.
Figure 6B:
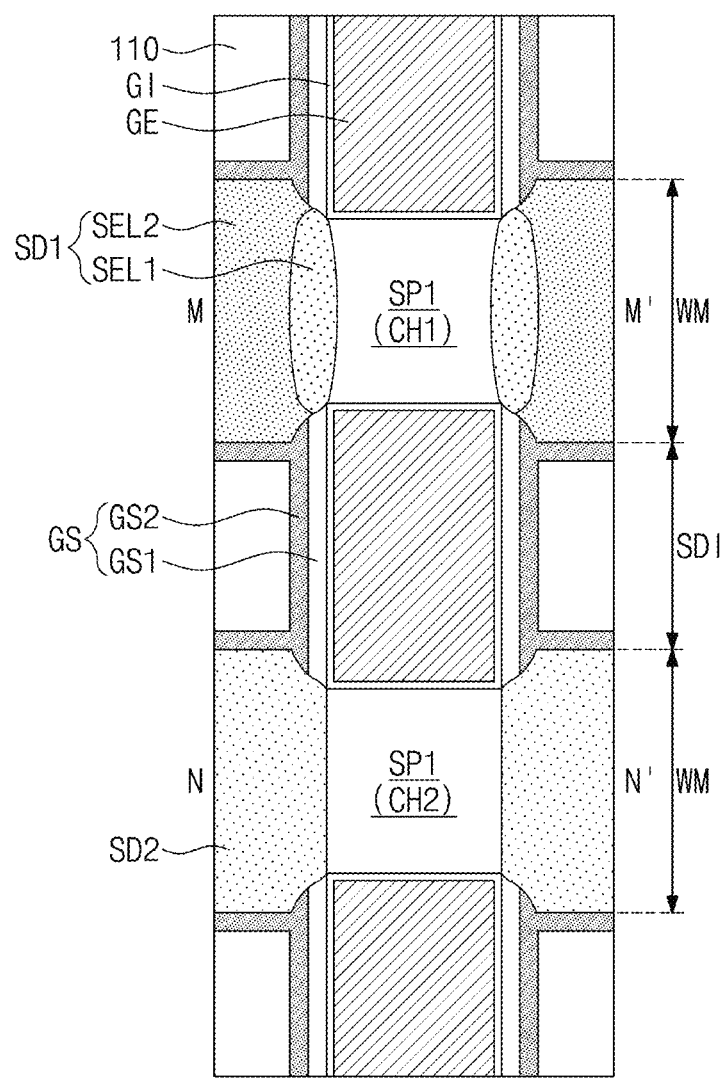
FIG. 6B is a top plan view, which is taken at a level M-M' of FIG. 5A and a level N-N' of FIG. 5B, according to an embodiment.

In an embodiment, referring to FIG. 5A, an upper portion of the active contact AC adjacent to the gate contact GC may be filled with an upper insulating pattern UIP. A bottom surface of the upper insulating pattern UIP may be lower than a bottom surface of the gate contact GC. In other words, a top surface of the active contact AC adjacent to the gate contact GC may be formed at a level, which is lower than the bottom surface of the gate contact GC, by the upper insulating pattern UIP. Accordingly, it may be possible to prevent the gate contact GC and the active contact AC, which are adjacent to each other, from being in contact with each other and thereby to prevent a short circuit issue from occurring therebetween.

Each of the active and gate contacts AC and GC may include a conductive pattern FM and a barrier pattern BM enclosing the conductive pattern FM. For example, the conductive pattern FM may be formed of or include at least one metallic material (e.g., Al, copper (Cu), W, Mo, and Co). The barrier pattern BM may be provided to cover side and bottom surfaces of the conductive pattern FM. In an embodiment, the bather pattern BM may include a metal layer and a metal nitride layer. The metal layer may be formed of or include at least one of Ti, Ta, W, Ni, Co, or Pt. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayer insulating layer 130. For example, the first metal layer M1 may include the first power line M1_R1, the second power line M1_R2, the third power line M1_R3, and first interconnection lines M1_I. The interconnection lines M1_R1, M1_R2, M1_R3, and M1_I of the first metal layer M1 may be extended in the second direction D2 to be parallel to each other.

In detail, the first and second power lines M1_R1 and M1_R2 may be provided on the third and fourth borders BD3 and BD4 of the first single height cell SHC1, respectively. The first power line M1_R1 may be extended along the third border BD3 and in the second direction D2. The second power line M1_R2 may be extended along the fourth border BD4 and in the second direction D2.

The first interconnection lines M1_I of the first metal layer M1 may be arranged at a second pitch in the first direction D1. The second pitch may be smaller than the first pitch of the gate electrodes GE. A linewidth of each of the first interconnection lines M1_I may be smaller than a linewidth of each of the first to third power lines M1_R1, M1_R2, and M1_R3.

The first metal layer M1 may further include first vias VI1. The first vias VI1 may be respectively provided below the interconnection lines M1_R1, M1_R2, M1_R3, and M1_I of the first metal layer M1. The active contact AC and the interconnection line of the first metal layer M1 may be electrically connected to each other through the first via VI1. The gate contact GC and the interconnection line of the first metal layer M1 may be electrically connected to each other through the first via VI1.

The interconnection line of the first metal layer M1 and the first via VI1 thereunder may be formed by separate processes. For example, the interconnection line and the first via VI1 of the first metal layer M1 may be independently formed by respective single damascene processes. The semiconductor device according to the present embodiment may be fabricated using a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern extending in the first direction D1. In other words, the second interconnection lines M2_I may be extended in the first direction D1 and parallel to each other.

The second metal layer M2 may further include second vias VI2, which are respectively provided below the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from that of the second metal layer M2. For example, the interconnection lines of the first and second metal layers M1 and M2 may be formed of or include at least one metallic material (e.g., Al, Cu, W, ruthenium (Ru), Mo, and Co). A plurality of metal layers (e.g., M3, M4, M5, and so forth) may be additionally stacked on the fourth interlayer insulating layer 140. Each of the stacked metal layers may include interconnection lines, which are used as routing paths between cells.

FIG. 6A is an enlarged sectional view illustrating a portion 'L' of FIG. 5C according to an embodiment. Sectional shapes of the first source/drain pattern SD1 and the spacer GS covering the same will be described in more detail with reference to FIG. 6A. The first source/drain pattern SD1 may be provided on the first active pattern AP1. More specifically, the first active pattern AP1 may be recessed to define the first recess RS1, and the first source/drain pattern SD1 may be formed in the first recess RS1. The first active pattern AP1 may be a fin-shaped pattern.

The first source/drain pattern SD1 may include a neck portion NEP and a body portion BDP on the neck portion NEP. The neck portion NEP may be in direct contact with the first active pattern AP1. The neck portion NEP may be in direct contact with an inner side surface of the first recess RS1.

The first spacer GS1 may directly cover a side surface AP1_S of the first active pattern AP1 and a side surface NEP_S of the neck portion NEP. The first spacer GS1 of FIG. 6A may include the fence portion FEP. The fence portion FEP may define the neck portion NEP of the first source/drain pattern SD1. The side surface NEP_S of the neck portion NEP and the side surface AP1_S of the first active pattern AP1 may be aligned to each other by the fence portion FEP.

The neck portion NEP may have an exposed top surface NEP_T. For example, the top surface NEP_T of the neck portion NEP may be substantially parallel to a top surface of the substrate 100. The top surface NEP_T of the neck portion NEP may be covered with the second spacer GS2. The top surface NEP_T of the neck portion NEP may be located at substantially the same level as the uppermost portion FET of the fence portion FEP.

The body portion BDP of the first source/drain pattern SD1 may vertically protrude from the neck portion NEP. The body portion BDP of the first source/drain pattern SD1 may have a diamond shape. For example, the body portion BDP may include a first facet FA1, which is slantingly extended upward from the neck portion NEP, and a second facet FA2, which is extended upward with a slope opposite to that of the first facet FA1. The first and second facets FA1 and FA2 may meet each other and may define an edge ED. Each of the first and second facets FA1 and FA2 may be a {111} crystalline facet of the first source/drain pattern SD1. The first source/drain pattern SD1 may have the largest width WM at a level of the edge ED, in the first direction D1.

The first facet FA1 of the body portion BDP may be spaced apart from the uppermost portion FET of the fence portion FEP with the second spacer GS2 interposed therebetween. The first facet FA1 may be offset from the uppermost portion FET of the fence portion FEP by the top surface NEP_T of the neck portion NEP.

A width of the body portion BDP, which is adjacent to a boundary between the body and neck portions BDP and NEP, may be smaller than a width of the neck portion NEP, which is adjacent to the boundary. In other words, a width of the first source/drain pattern SD1 in the first direction D1 may be discontinuously changed near the boundary between the body and neck portions BDP and NEP.

The second spacer GS2 may cover the first spacer GS1 and the body portion BDP of the first source/drain pattern SD1. The second spacer GS2 may cover the first and second facets FA1 and FA2 of the first source/drain pattern SD1. As described above, the second spacer GS2 may cover at least a portion of the neck portion NEP (e.g., the exposed top surface NEP_T of the neck portion NEP).

The neck portion NEP of the first source/drain pattern SD1 may include the first semiconductor layer SEL1. In an embodiment, the neck portion NEP of the first source/drain pattern SD1 may include a portion of the second semiconductor layer SEL2. The body portion BDP may include a remaining portion of the second semiconductor layer SEL2. However, the embodiments are not limited to this example. In an embodiment, the neck portion NEP may include only the first semiconductor layer SEL1.

Figure 5B:
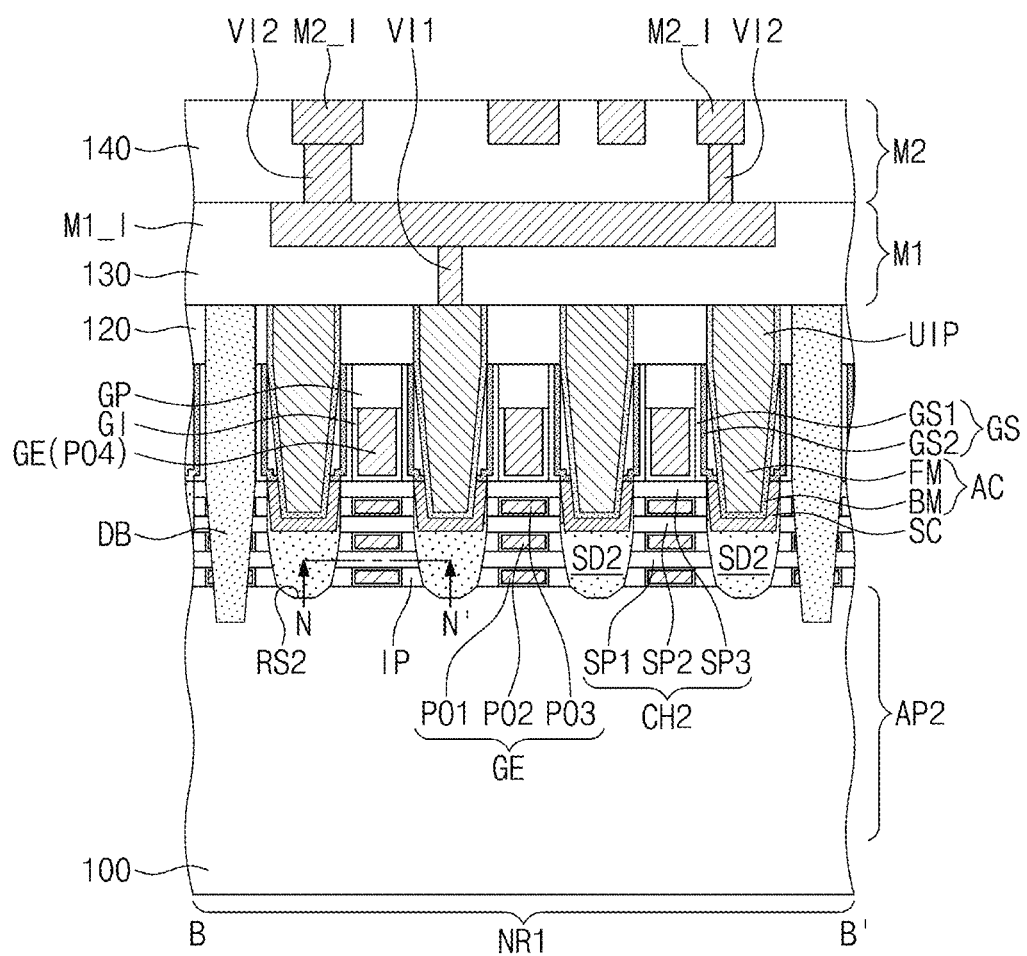
Figure 5C:
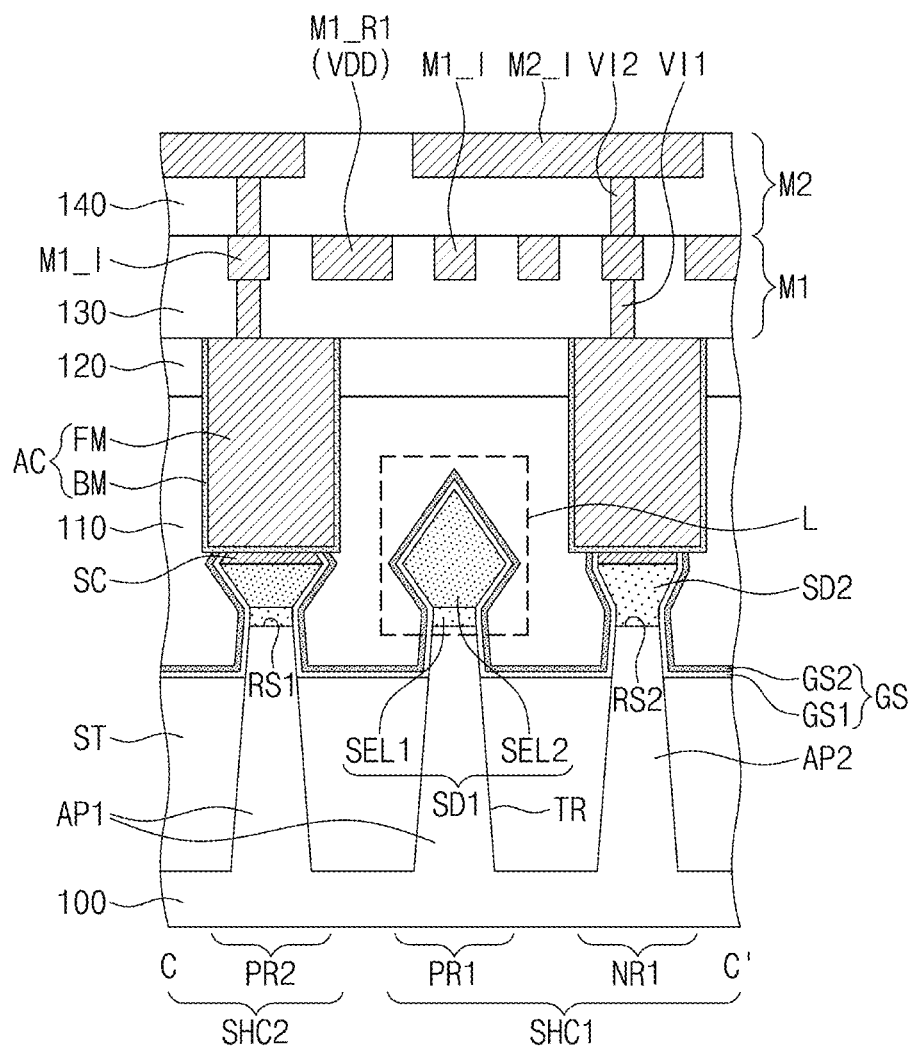
Figure 5D:
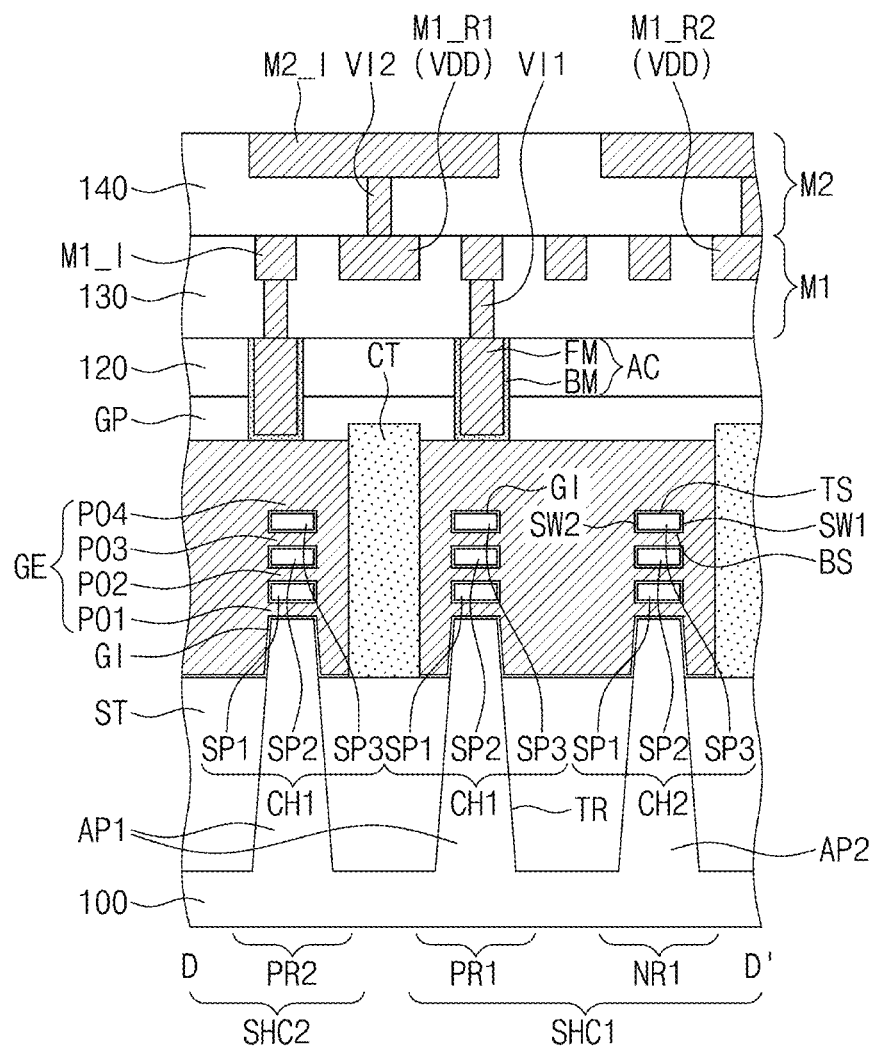

FIG. 6B is a top plan view, which is taken at a level M-M' of FIG. 5A and a level N-N' of FIG. 5B, according to an embodiment. Planar shapes of the first and second source/drain patterns SD1 and SD2 and the spacer GS covering them will be described in more detail with reference to FIG. 6B. In detail, FIG. 6B is a plan view of a semiconductor device which is obtained a level of the first semiconductor pattern SP1 when the semiconductor device is planarized to the level of the first semiconductor pattern SP1 of each of the first and second channel patterns CH1 and CH2.

The first source/drain patterns SD1 may be respectively provided at both sides of the first semiconductor pattern SP1 of the first channel pattern CH1. Each of opposite side surfaces of the first semiconductor pattern SP1 may be in direct contact with the first semiconductor layer SEL1 of the first source/drain pattern SD1. The first semiconductor pattern SP1 may connect the first source/drain patterns SD1 to each other.

The second source/drain patterns SD2 may be respectively provided at both sides of the first semiconductor pattern SP1 of the second channel pattern CH2. The first semiconductor pattern SP1 may connect the second source/drain patterns SD2 to each other.

The gate electrode GE may be provided on the first semiconductor pattern SP1. The spacer GS may be provided on the side surface of the gate electrode GE. The spacer GS may include the first and second spacers GS1 and GS2.

The first spacer GS1 may cover at least a portion of each of the first and second source/drain patterns SD1 and SD2. The second spacer GS2 may be extended from the first spacer GS1 to cover the side surface of each of the first and second source/drain patterns SD1 and SD2.

The first and second source/drain patterns SD1 and SD2, which are adjacent to each other, may be spaced apart from each other by a distance SDI in the first direction D1. As the semiconductor device is highly integrated, a cell height (e.g., HE1 of FIG. 1) of a logic cell is being reduced. The reduction of the cell height may lead to a reduction in the distance SDI between the source/drain patterns. Furthermore, the reduction of the distance SDI may increase the risk of a process defect, in which the first and second source/drain patterns SD1 and SD2 are in contact with each other.

Each of the first and second source/drain patterns SD1 and SD2 may have the largest width WM, in the first direction D1. By reducing the largest width WM of each of the first and second source/drain patterns SD1 and SD2, it may be possible to increase the distance SDI described above.

According to an embodiment, by performing a selective oxidation process on the first and second source/drain patterns SD1 and SD2, it may be possible to reduce the largest width WM of each of the first and second source/drain patterns SD1 and SD2. Accordingly, it may be possible to prevent a process defect, such as contact between adjacent ones of the source/drain patterns, and thereby to improve the reliability of the device.

According to an embodiment, it may be possible to realize the spacer GS of the same shape on both of the PMOSFET and NMOSFET regions, as shown in FIG. 6B. In other words, the spacer GS on the PMOSFET region may include the first and second spacers GS1 and GS2, and the spacer GS on the NMOSFET region may also include the first and second spacers GS1 and GS2 that are the same as those on the PMOSFET region.

According to an embodiment, since the spacers GS on the PMOSFET/NMOSFET regions have the same structure, it may be possible to improve electric characteristics of the semiconductor device. Furthermore, it may be possible to effectively prevent a process failure, which may occur in a process of forming the spacers GS of the same structure on the PMOSFET/NMOSFET regions; for example, it may be possible to prevent an un-etch defect, in which the second recess RS2 is not formed to a sufficient depth, or a pitting failure, in which a lower portion of the gate electrode GE penetrates a lower portion of the spacer GS and has a protruding shape. That is, the semiconductor device according to an embodiment may have high reliability.

FIGS. 7A, 7B, 8A, 8B, 8C, 9A, 9B, 9C, 9D, 10A, 10B, 10C, 11A, 11B, 11C, 12A, 12B, 12C, 13A, 13B, 13C, 14A, 14B, 14C, 15A, 15B, 15C, 15D, 16A, 16B, 16C, 16D, 17A, 17B, 17C and 17D are sectional views illustrating a method of fabricating a semiconductor device according to an embodiment. In detail, FIGS. 7A, 8A, 9A, 10A, 11A, 12A, 13A, 14A, 15A, 16A, and 17A are sectional views corresponding to the line A-A' of FIG. 4. FIGS. 9B, 10B, 11B, 12B, 13B, 14B, 15B, 16B, and 17B are sectional views corresponding to the line B-B' of FIG. 4. FIGS. 7B, 8B, 9C, 10C, 11C, 12C, 13C, 14C, 15C, 16C, and 17C are sectional views corresponding to the line C-C' of FIG. 4. FIGS. 8C, 9D, 15D, 16D, and 17D are sectional views corresponding to the line D-D' of FIG. 4.

Figure 7A:
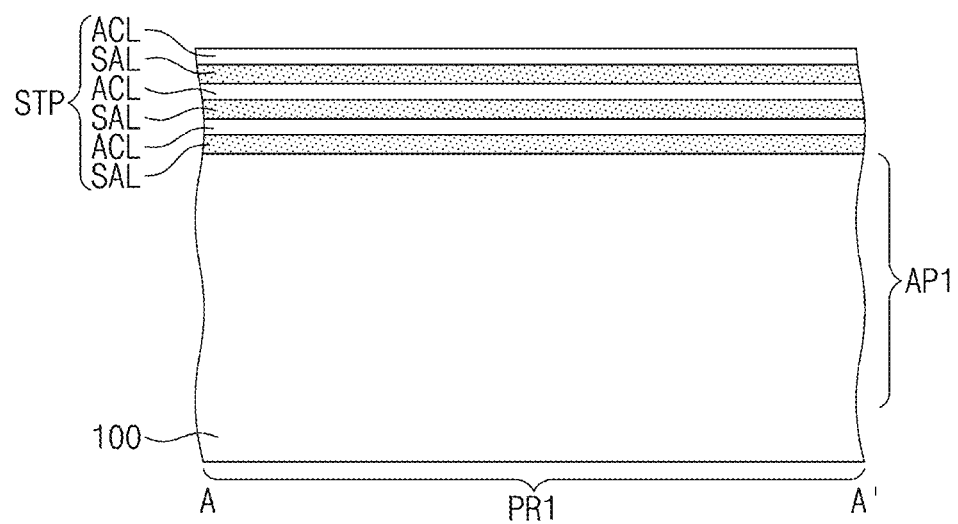
FIGS. 7A, 7B, 8A, 8B, 8C, 9A, 9B, 9C, 9D, 10A, 10B, 10C, 11A, 11B, 11C, 12A, 12B, 12C, 13A, 13B, 13C, 14A, 14B, 14C, 15A, 15B, 15C, 15D, 16A, 16B, 16C, 16D, 17A, 17B, 17C and 17D are sectional views illustrating a method of fabricating a semiconductor device according to an embodiment.
Figure 7A:
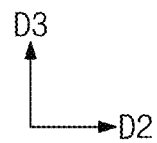
Figure 7B:
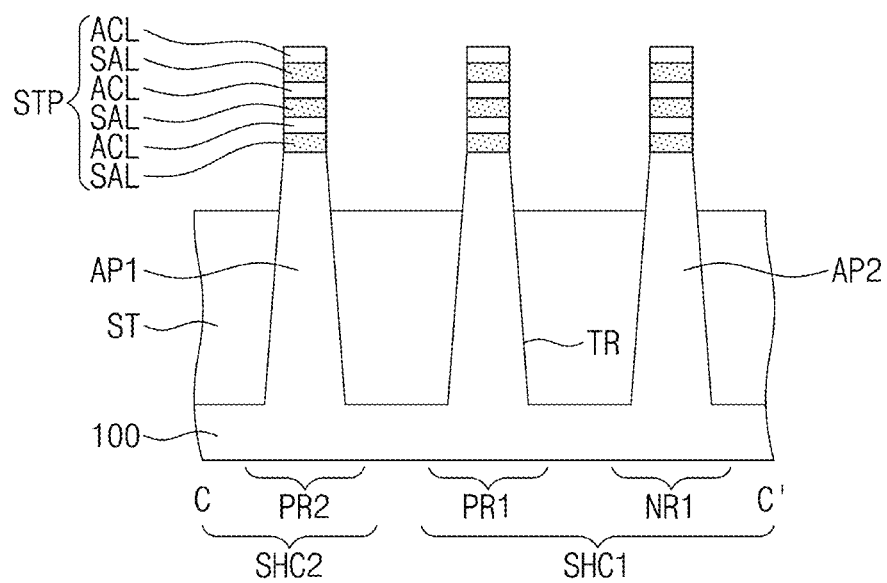

Referring to FIGS. 7A and 7B, the substrate 100 including the first and second PMOSFET regions PR1 and PR2 and the first and second NMOSFET regions NR1 and NR2 may be provided. The sacrificial layers SAL and active layers ACL may be formed to be alternately stacked on the substrate 100. The sacrificial layers SAL may be formed of or include one of Si, Ge, and SiGe, and the active layers ACL may be formed of or include another one of Si, Ge and SiGe.

For example, the sacrificial layers SAL may be formed of or include SiGe, and the active layers ACL may be formed of or include Si. A Ge concentration of each of the sacrificial layers SAL may range from about 10% to about 30%.

Mask patterns may be respectively formed on the first and second PMOSFET regions PR1 and PR2 and the first and second NMOSFET regions NR1 and NR2 of the substrate 100. The mask pattern may be a line- or bar-shaped pattern extending in the second direction D2.

A patterning process, in which the mask patterns are used as an etch mask, may be performed to form the trench TR defining the first active pattern AP1 and the second active pattern AP2. The first active pattern AP1 may be formed on each of the first and second PMOSFET regions PR1 and PR2. The second active pattern AP2 may be formed on each of the first and second NMOSFET regions NR1 and NR2.

A stacking pattern STP may be formed on each of the first and second active patterns AP1 and AP2. The stacking pattern STP may include the sacrificial layers SAL and the active layers ACL, which are alternatingly stacked. The stacking pattern STP may be formed by etching the sacrificial layers SAL and the active layers ACL, along with the first and second active patterns AP1 and AP2, during the patterning process.

The device isolation layer ST may be formed to fill the trench TR. In detail, an insulating layer may be formed on the substrate 100 to cover the first and second active patterns AP1 and AP2 and the stacking patterns STP. The device isolation layer ST may be formed by recessing the insulating layer to expose the stacking patterns STP.

The device isolation layer ST may be formed of or include at least one insulating material (e.g., Si oxide). The stacking patterns STP may be placed above the device isolation layer ST and may be exposed to the outside of the device isolation layer ST. For example, the stacking patterns STP may protrude vertically above the device isolation layer ST.

Figure 8A:
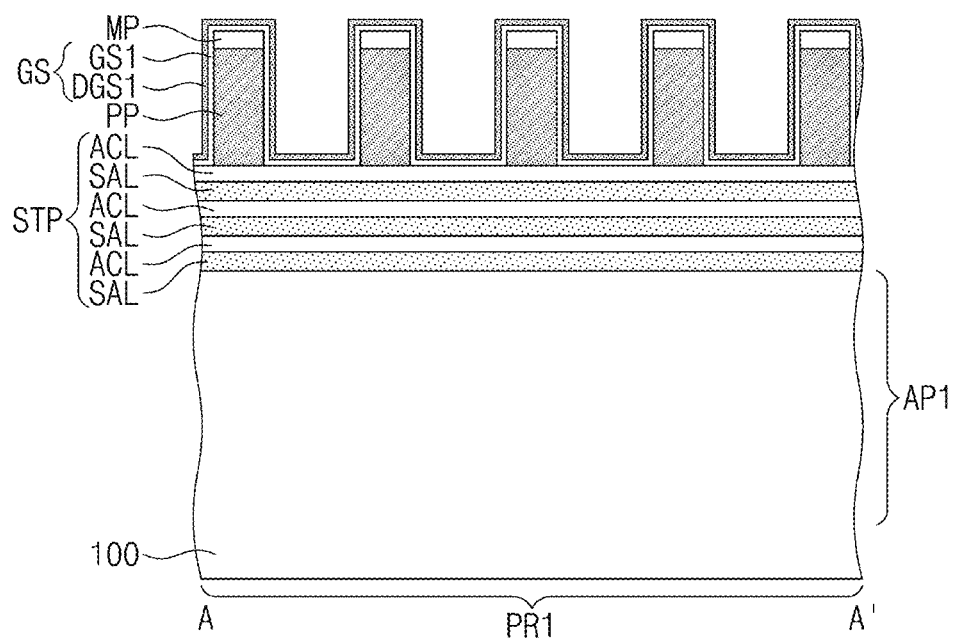
Figure 8A:
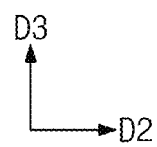
Figure 8B:
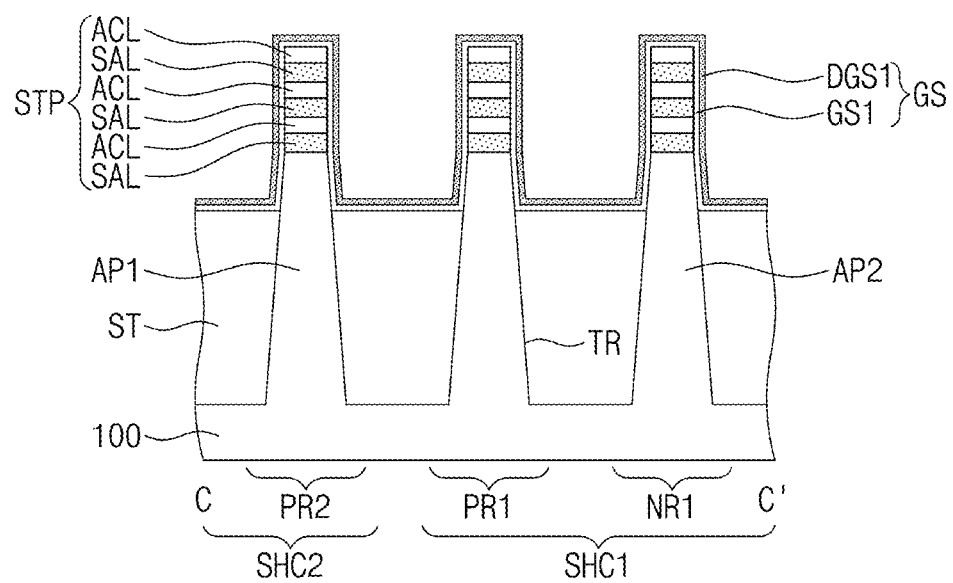
Figure 8B:
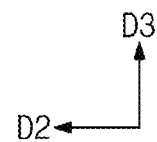
Figure 8C:
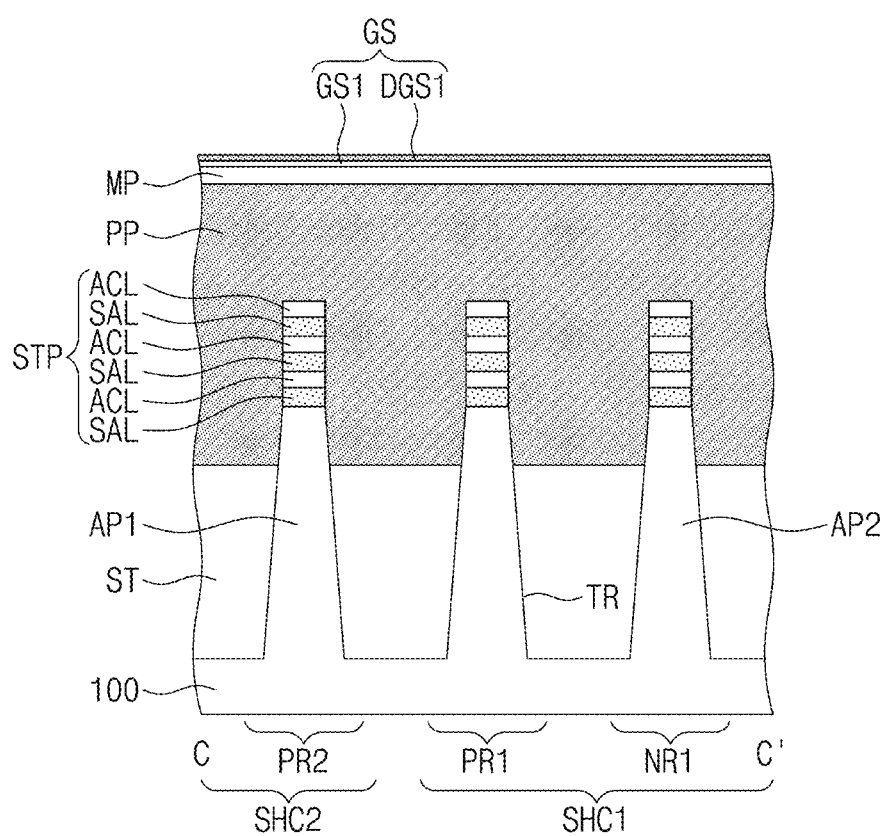

Referring to FIGS. 8A to 8C, sacrificial patterns PP may be formed on the substrate 100 to cross the stacking patterns STP. Each of the sacrificial patterns PP may be a line- or bar-shaped pattern extending in the first direction D1. The sacrificial patterns PP may be arranged, at a specific pitch, in the second direction D2.

In detail, the formation of the sacrificial patterns PP may include forming a sacrificial film on the substrate 100, forming hard mask patterns MP on the sacrificial film, and patterning the sacrificial film using the hard mask patterns MP as an etch mask. The sacrificial layer may be formed of or include amorphous Si and/or polysilicon.

The spacer GS may be formed on the sacrificial patterns PP. The spacer GS may include the first spacer GS1 and a first disposable spacer DGS1 on the first spacer GS1. In detail, the formation of the spacer GS may include conformally forming the first spacer GS1 on the substrate 100 and conformally forming the first disposable spacer DGS1 on the first spacer GS1.

The spacer GS may cover opposite side surfaces of the sacrificial pattern PP. The spacer GS may cover the top surface of the device isolation layer ST and the surface of the stacking pattern STP. For example, the first spacer GS1 may be formed of or include a Si-containing low-k dielectric material (e.g., SiCON). The first disposable spacer DGS1 may be formed of or include SiN.

Referring to FIGS. 9A to 9D, a first mask layer MAL1 may be formed on the first and second NMOSFET regions NR1 and NR2 of the substrate 100. As an example, the first mask layer MAL1 may include an amorphous carbon layer. The first mask layer MAL1 may be formed to expose the first and second PMOSFET regions PR1 and PR2.

The first recess RS1 may be formed by etching a portion of the stacking pattern STP, which is located between the sacrificial patterns PP on the first active pattern AP1, using the first mask layer MAL1 as an etch mask. The formation of the first recess RS1 may include etching the stacking pattern STP on the first active pattern AP1 using the hard mask pattern MP and the spacer GS as an etch mask. The first recess RS1 may be formed between a pair of the sacrificial patterns PP.

An upper portion of the spacer GS on the first and second PMOSFET regions PR1 and PR2 may be removed or recessed during the formation of the first recesses RS1. In detail, referring to FIG. 9C, the spacer GS on the first active pattern AP1 may be recessed to have a reduced height.

Since the spacer GS is recessed, the fence portion FEP covering an upper side surface of the first active pattern AP1 may be formed. In an embodiment, a top surface of the fence portion FEP may be higher than the bottom surface of the first recess RS1. In another embodiment, the top surface of the fence portion FEP may be lower than the bottom surface of the first recess RS1. By changing a height of the fence portion FEP, it may be possible to adjust the largest width WM of the first source/drain pattern SD1 previously described with reference to FIG. 6A. The larger the height of the fence portion FEP, the smaller the largest width WM of the first source/drain pattern SD1. The smaller the height of the fence portion FEP, the larger the largest width WM of the first source/drain pattern SD1.

The first to third semiconductor patterns SP1, SP2, and SP3, which are sequentially stacked between adjacent ones of the first recesses RS1, may be formed from the active layers ACL on the first active pattern AP1. The first to third semiconductor patterns SP1, SP2, and SP3 between adjacent ones of the first recesses RS1 may constitute the first channel pattern CH1.

Figure 10A:
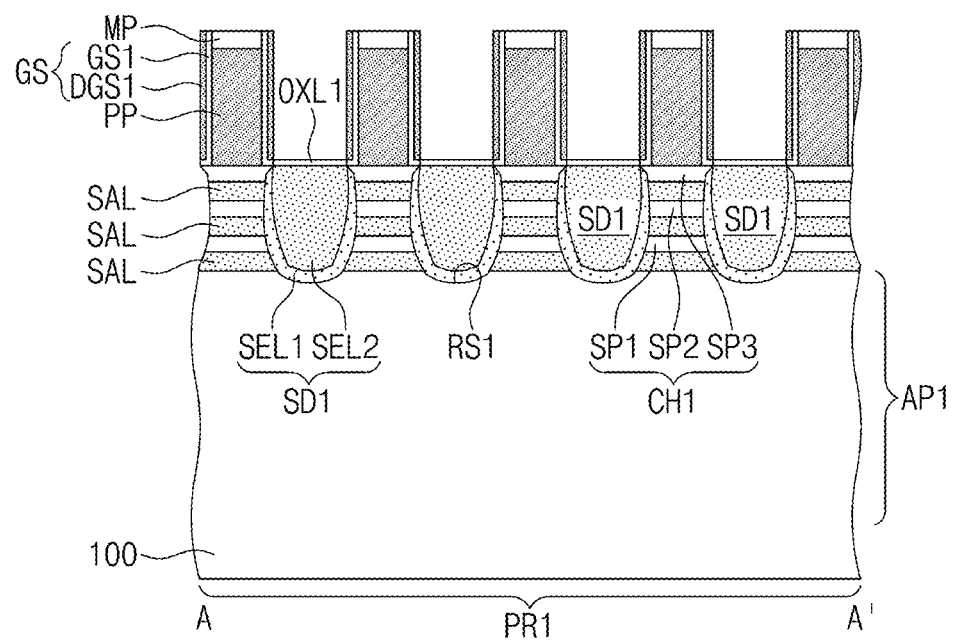
Figure 10B:
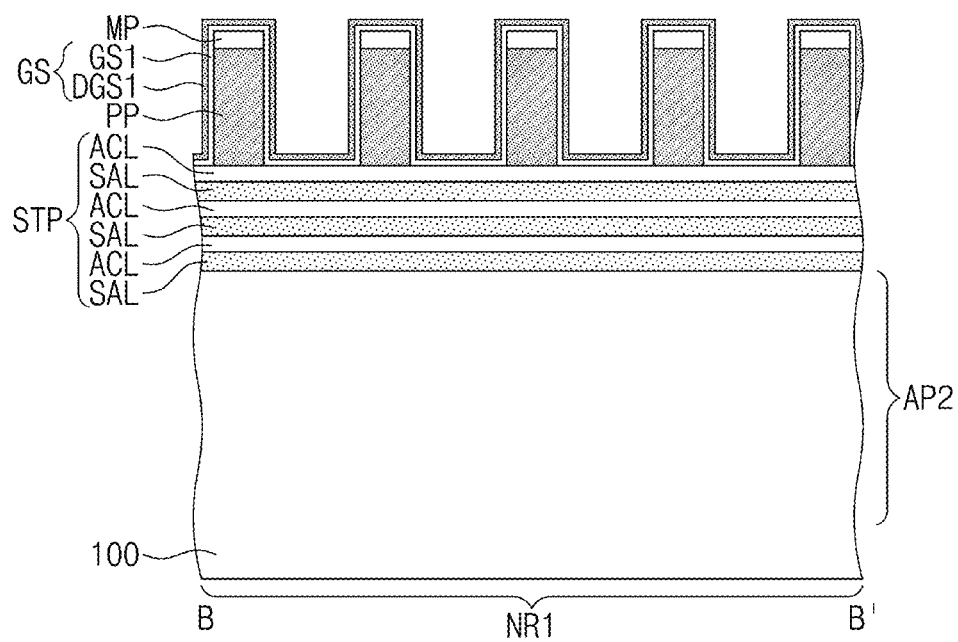
Figure 10B:
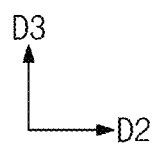
Figure 10C:
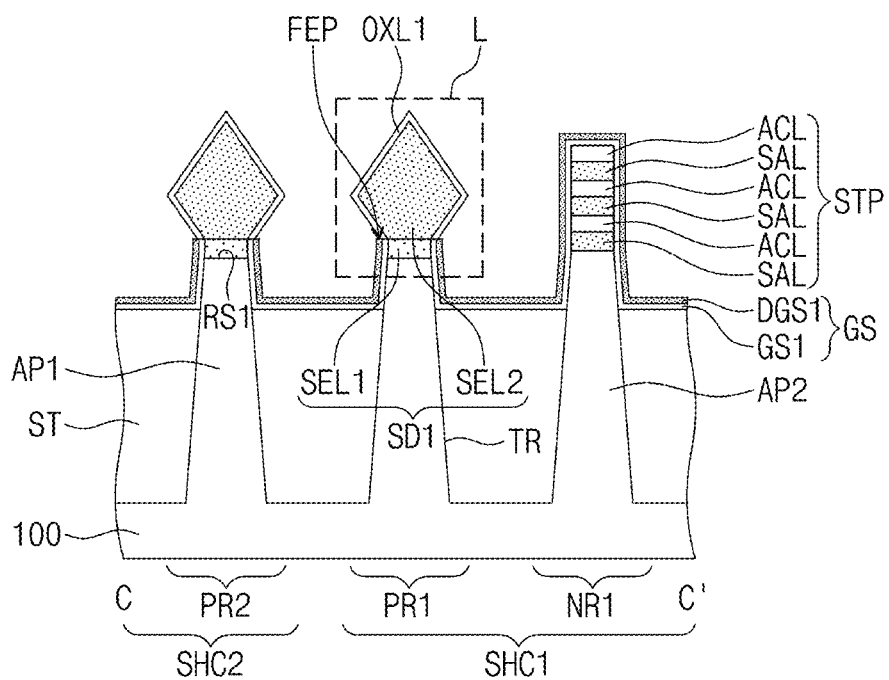

Referring to FIGS. 10A to 10C, the first mask layer MAL1 may be selectively removed. Next, the first source/drain patterns SD1 may be formed in the first recesses RS1, respectively. In detail, the first semiconductor layer SEL1 may be formed by performing a first SEG process using an inner surface of the first recess RS1 as a seed layer. The first semiconductor layer SEL1 may be grown using first to third semiconductor patterns SP1, SP2, and SP3 and the substrate 100, which are exposed through the first recesses RS1, as a seed. As an example, the first SEG process may include a chemical vapor deposition (CVD) process or a molecular beam epitaxy (MBE) process.

The first semiconductor layer SEL1 may be formed of or include a semiconductor material (e.g., SiGe) having a lattice constant greater than that of the substrate 100. The first semiconductor layer SEL1 may be formed to have a relatively low Ge concentration. In another embodiment, the first semiconductor layer SEL1 may be provided to contain only Si) and not Ge. The Ge concentration of the first semiconductor layer SEL1 may range from about 0% to about 10%.

The second semiconductor layer SEL2 may be formed by performing a second SEG process on the first semiconductor layer SEL1. The second semiconductor layer SEL2 may be formed to completely fill the first recess RS1. The second semiconductor layer SEL2 may be provided to have a relatively high Ge concentration. As an example, the Ge concentration of the second semiconductor layer SEL2 may range from about 30% to about 70%.

The first semiconductor layer SEL1 and the second semiconductor layer SEL2 may constitute the first source/drain pattern SD1. The first and second semiconductor layers SEL1 and SEL2 may be doped with impurities in situ during the first and second SEG processes. Alternatively, the first source/drain pattern SD1 may be doped with impurities, after the formation of the first source/drain pattern SD1. The first source/drain pattern SD1 may be doped to have a first conductivity type (e.g., a p-type). During the first and second SEG process, any semiconductor layer may not be grown, because the first and second NMOSFET regions NR1 and NR2 are covered with the spacer GS.

After the formation of the first source/drain patterns SD1, a selective oxidation process may be performed to selectively oxidize an exposed surface of each of the first source/drain patterns SD1. As a result of the selective oxidation of the first source/drain pattern SD1, a first oxide layer OXL1 may be selectively formed on the surface of the first source/drain pattern SD1.

In an embodiment, the selective oxidation process of the first source/drain pattern SD1 may include a high-temperature thermal process using steam ($H_2O$) and hydrogen ($H_2$). In an embodiment, the selective oxidation process may include a plasma process using steam ($H_2O$) and $H_2$. The selective oxidation process may oxidize only the first source/drain pattern SD1, but not the first disposable spacer DGS1.

Figure 18A:
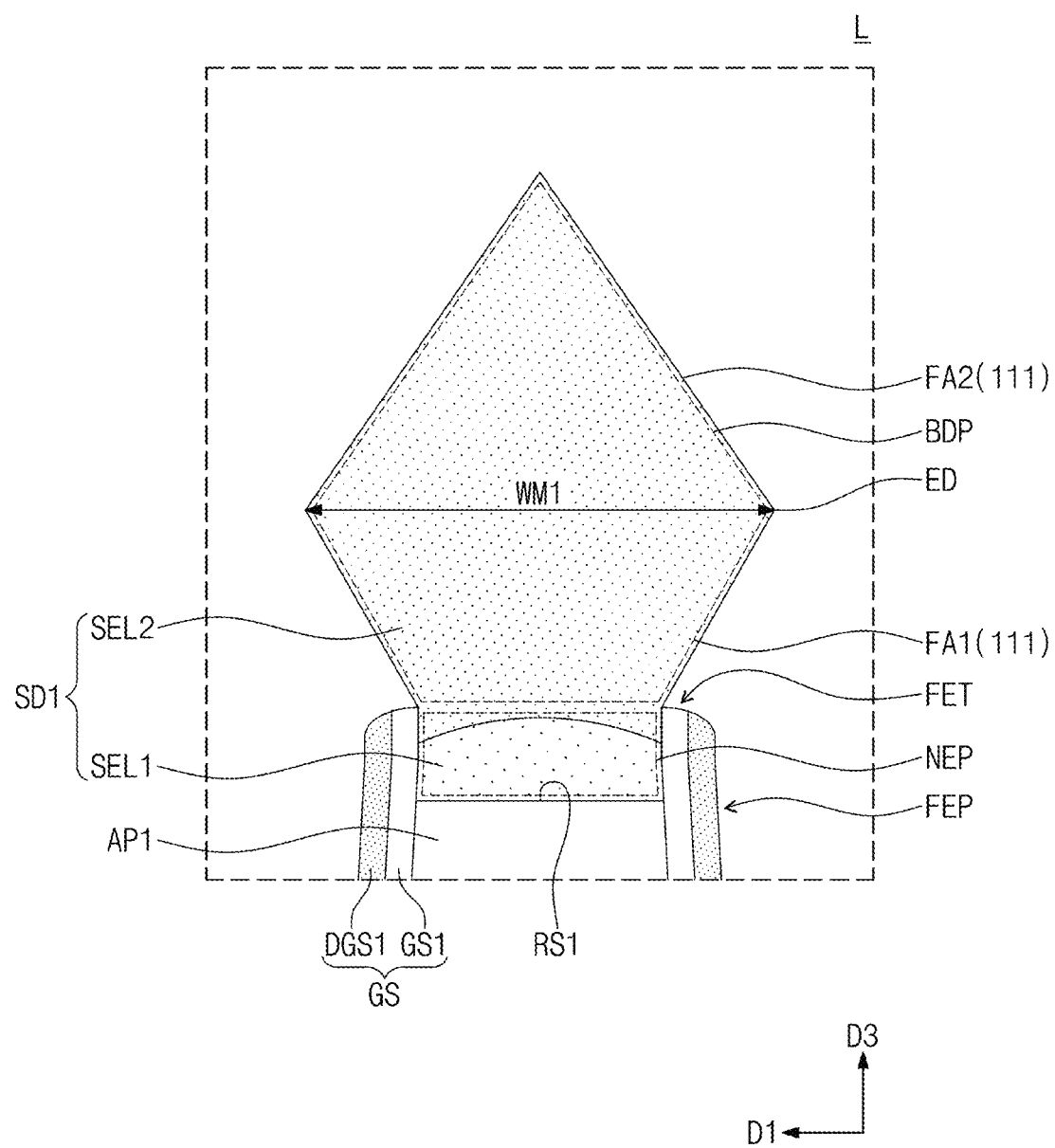
FIGS. 18A and 18B are sectional views illustrating a portion 'L' of FIG. 10C, according to an embodiment.
Figure 18B:
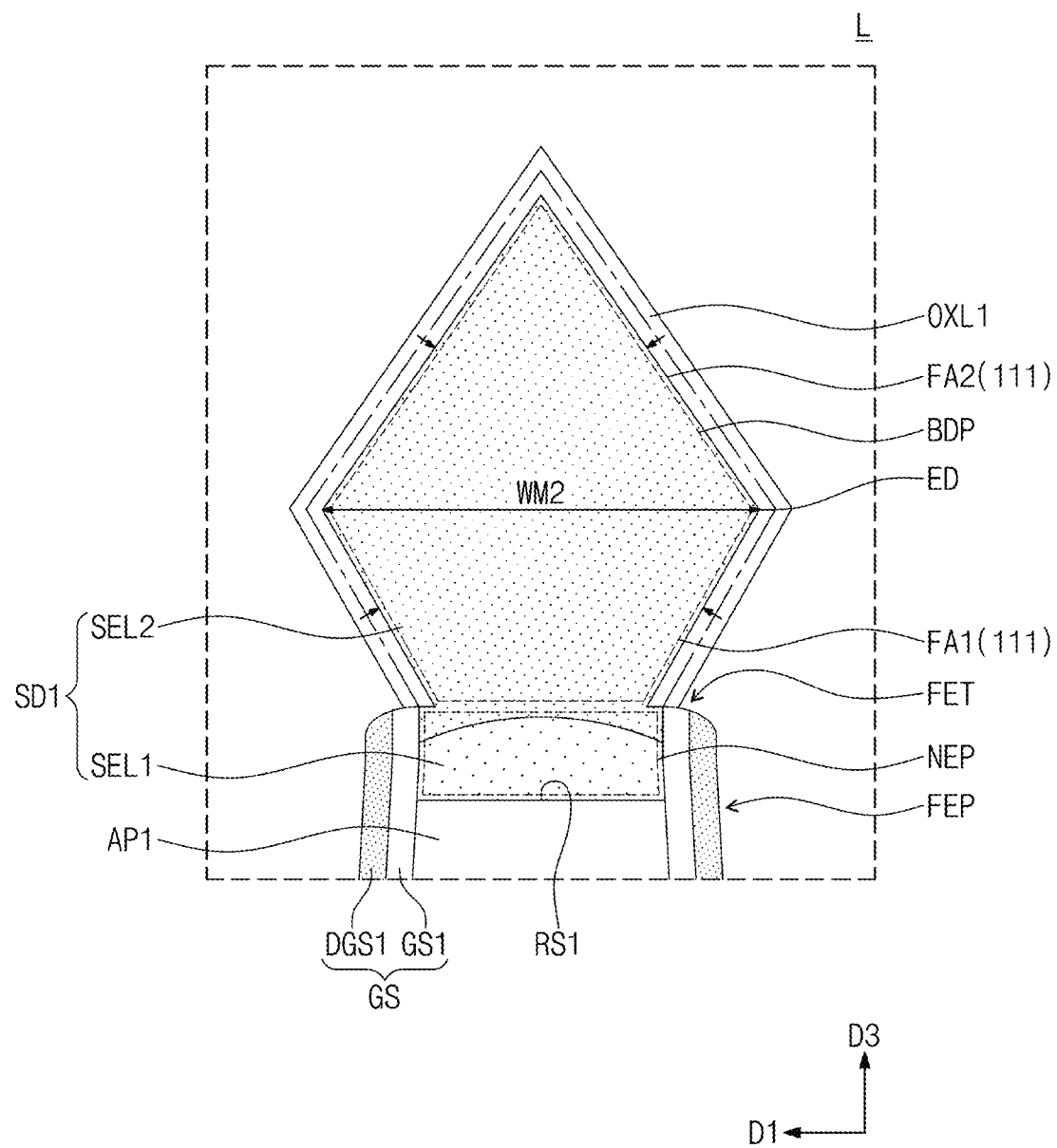

FIGS. 18A and 18B are sectional views illustrating a portion 'L' of FIG. 10C, according to an embodiment. The selective oxidation process of the first source/drain pattern SD1 will be described in more detail with reference to FIGS. 18A and 18B.

Referring to FIG. 18A, the first semiconductor layer SEL1 may be formed on the first active pattern AP1 through a first SEG process, and the second semiconductor layer SEL2 may be formed on the first semiconductor layer SEL1 through a second SEG process. The first source/drain pattern SD1 may include the neck portion NEP, which is enclosed by the fence portion FEP, and the body portion BDP, which is provided on the neck portion NEP. The neck portion NEP may be formed through a process of growing the first source/drain pattern SD1 along the fence portion FEP during the SEG process.

The body portion BDP may include the first facet FA1 that is a {111} crystalline facet. The first facet FA1 may be extended from the uppermost portion FET of the fence portion FEP toward the edge ED. In other words, the first facet FA1 may not be offset from the uppermost portion FET of the fence portion FEP and may be very close to or in contact with the uppermost portion FET. The first source/drain pattern SD1 may have a first largest width WM1.

Referring to FIG. 18B, a selective oxidation process may be performed on the first source/drain pattern SD1 to form the first oxide layer OXL1 on the first and second facets FA1 and FA2 of the first source/drain pattern SD1.

Since the first oxide layer OXL1 is formed as a result of the oxidation of an exposed portion of the first source/drain pattern SD1, a size of the first source/drain pattern SD1 may be reduced. For example, each of the first and second facets FA1 and FA2 may be reduced in a <111> direction. Thus, a height of the first source/drain pattern SD1 may be reduced. The first source/drain pattern SD1 may have a second largest width WM2 that is smaller than the first largest width WM1.

Since the first facet FA1 of the first source/drain pattern SD1 is reduced in the <111> direction, the neck portion NEP may have the top surface NEP_T that is covered with the first oxide layer OXL1. The first facet FA1 may be offset from the uppermost portion FET of the fence portion FEP by the top surface NEP_T of the neck portion NEP.

According to an embodiment, a volume and a largest width of a source/drain pattern may be reduced through a selective oxidation process of a source/drain pattern. Since the volume of the source/drain pattern is reduced, a parasitic capacitance between the gate electrode and the source/drain pattern may be reduced, and this may make it possible to electric characteristics of the semiconductor device. In addition, since, as a result of the reduction of the volume of the source/drain pattern, a contact failure between adjacent ones of the source/drain patterns is prevented, it may be possible to improve reliability and higher density of the semiconductor device.

Figure 11A:
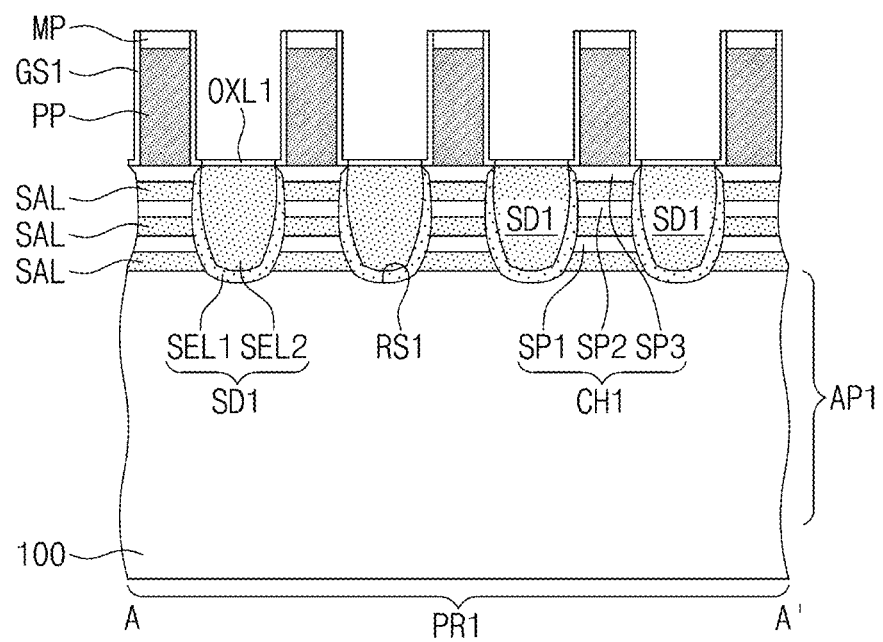
Figure 11B:
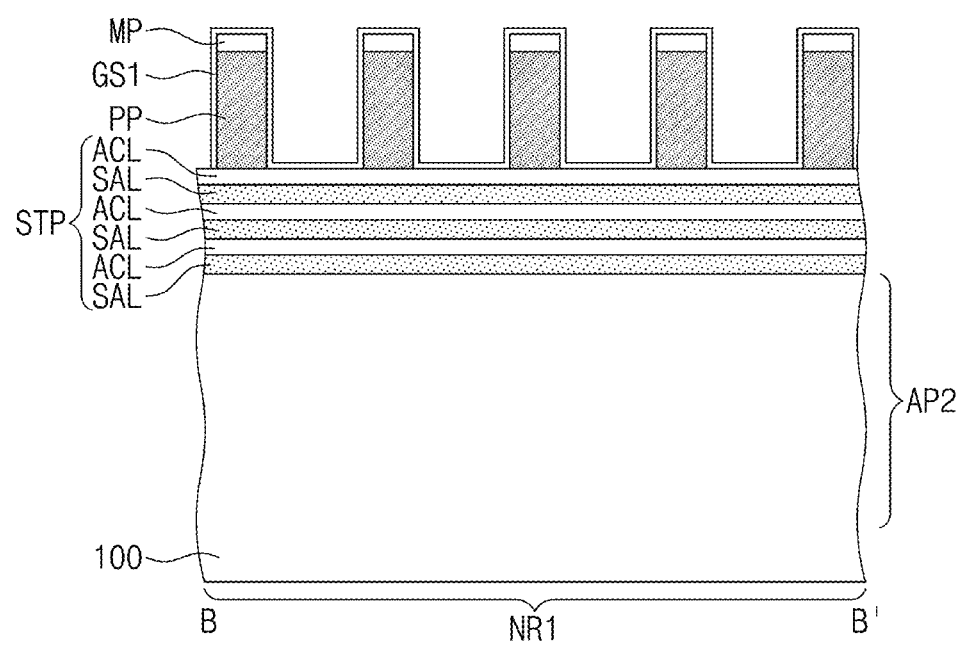
Figure 11C:
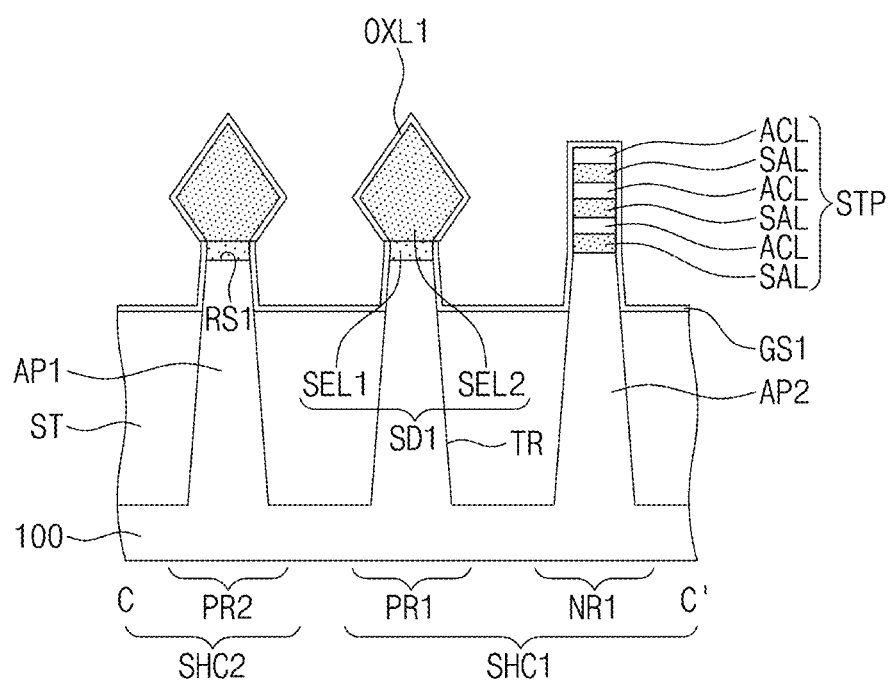

Referring to FIGS. 11A to 11C, the first disposable spacer DGS1 may be selectively removed. The removal of the first disposable spacer DGS1 may include a phosphoric acid strip process of selectively removing a Si nitride layer.

Meanwhile, not only Si nitride but also a semiconductor material (e.g., SiGe) may be etched by the phosphoric acid. According to an embodiment, the first oxide layer OXL1 may be formed on an exposed surface of the first source/drain pattern SD1 to protect the first source/drain pattern SD1 during the etching process. Accordingly, it may be possible to prevent a process defect, in which the first source/drain pattern SD1 is unintentionally etched during a removal process of the first disposable spacer DGS1, and thereby to improve the reliability of the semiconductor device.

Figure 12A:
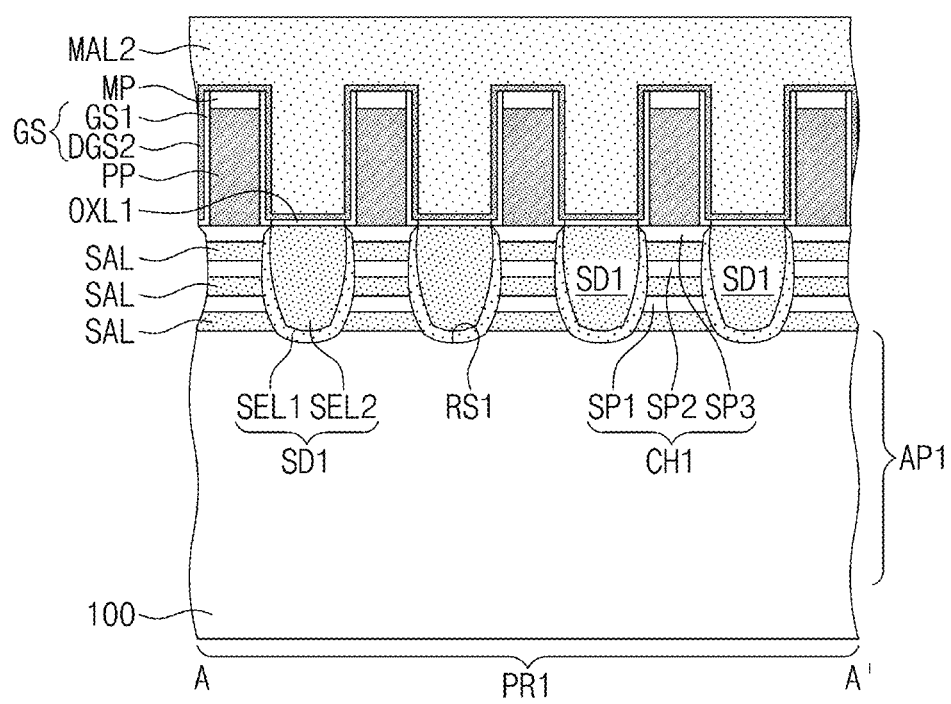
Figure 12A:
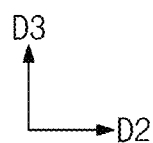
Figure 12B:
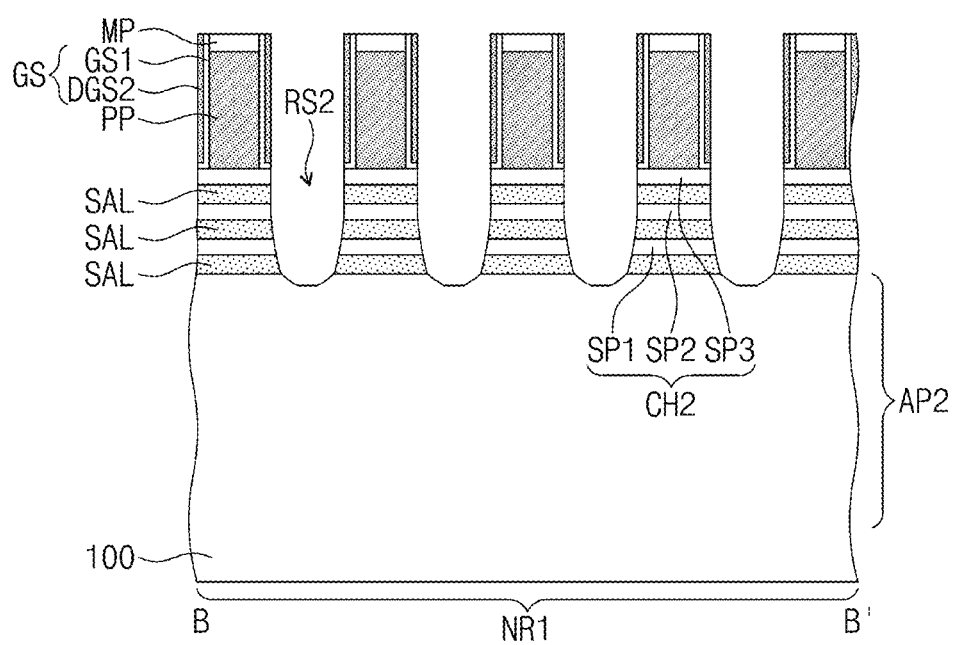
Figure 12B:
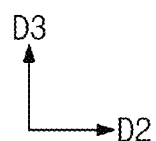
Figure 12C:
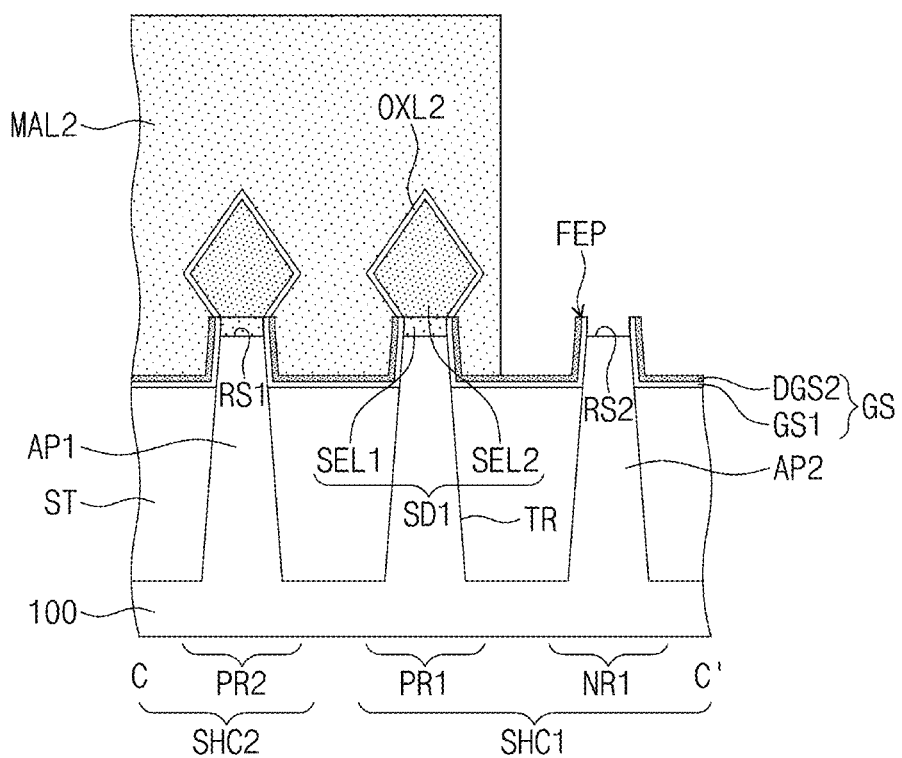

Referring to FIGS. 12A to 12C, a second disposable spacer DGS2 may be conformally formed on the substrate 100. The second disposable spacer DGS2 may be formed of or include SiN. The second disposable spacer DGS2 may be formed on a remaining portion of the first spacer GS1, and the first spacer GS1 and the second disposable spacer DGS2 may constitute the spacer GS.

A second mask layer MAL2 may be formed on the first and second PMOSFET regions PR1 and PR2 of the substrate 100. The second mask layer MAL2 may be formed to expose the first and second NMOSFET regions NR1 and NR2.

The second recess RS2 may be formed by etching a portion of the stacking pattern STP, which is located between the sacrificial patterns PP on the second active pattern AP2, using the second mask layer MAL2 as an etch mask. The formation of the second recess RS2 may include etching the stacking pattern STP on the second active pattern AP2 using the hard mask pattern MP and the spacer GS as an etch mask. The second recess RS2 may be formed between a pair of the sacrificial patterns PP.

An upper portion of the spacer GS on the first and second NMOSFET regions NR1 and NR2 may be removed or recessed during the formation of the second recesses RS2. In detail, referring to FIG. 12C, the spacer GS on the second active pattern AP2 may be recessed to have a reduced height.

Since the spacer GS is recessed, the fence portion FEP covering an upper side surface of the second active pattern AP2 may be formed. In an embodiment, the top surface of the fence portion FEP may be higher than the bottom surface of the second recess RS2. In an embodiment, the top surface of the fence portion FEP may be lower than the bottom surface of the second recess RS2. By adjusting the height of the fence portion FEP, it may be possible to control the largest width WM of the second source/drain pattern SD2 previously described with reference to FIG. 6A.

Figure 9A:
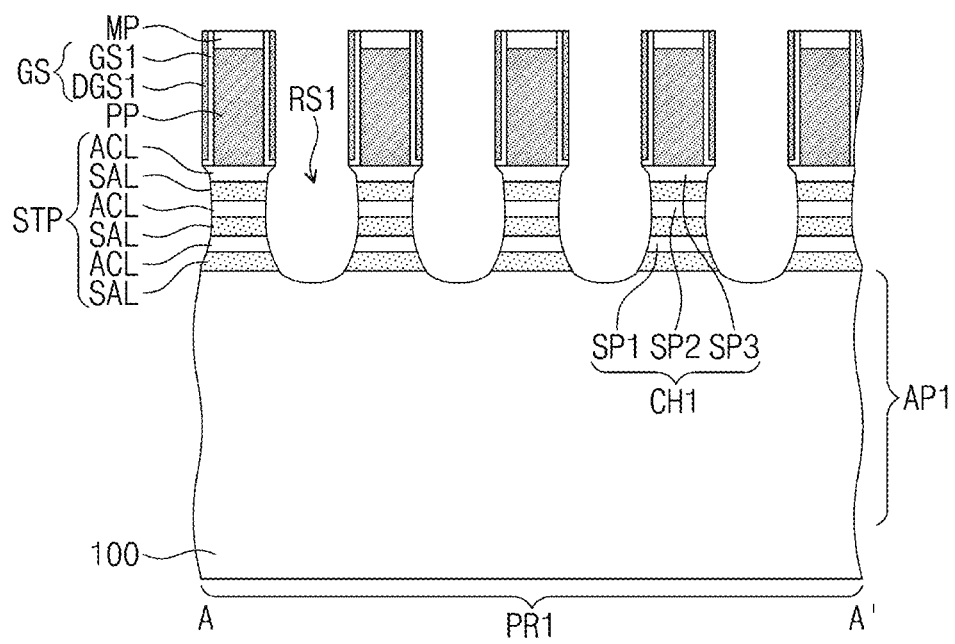
Figure 9A:
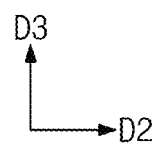
Figure 9B:
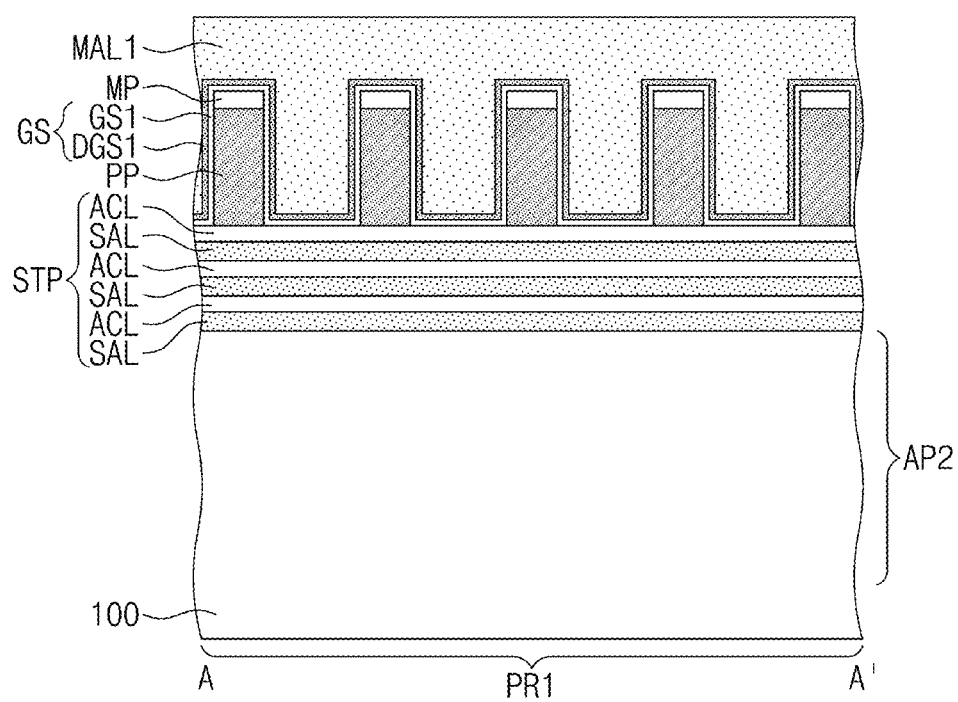
Figure 9B:
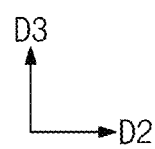
Figure 9C:
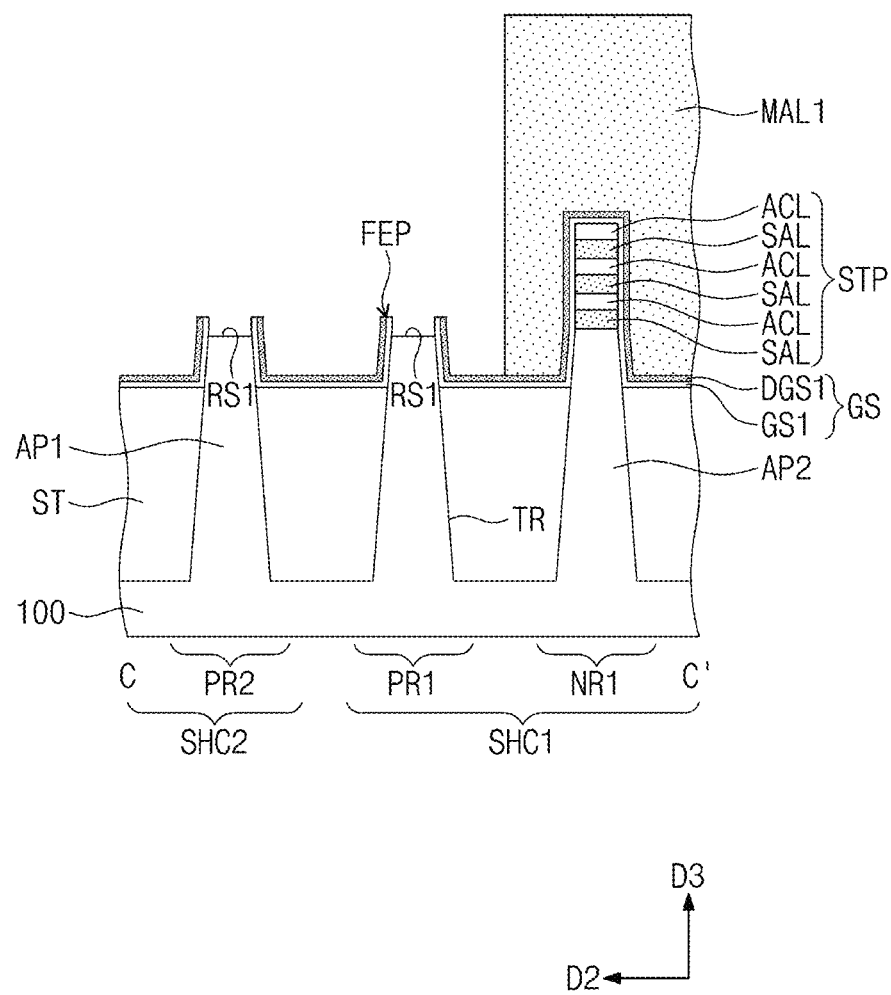
Figure 9D:
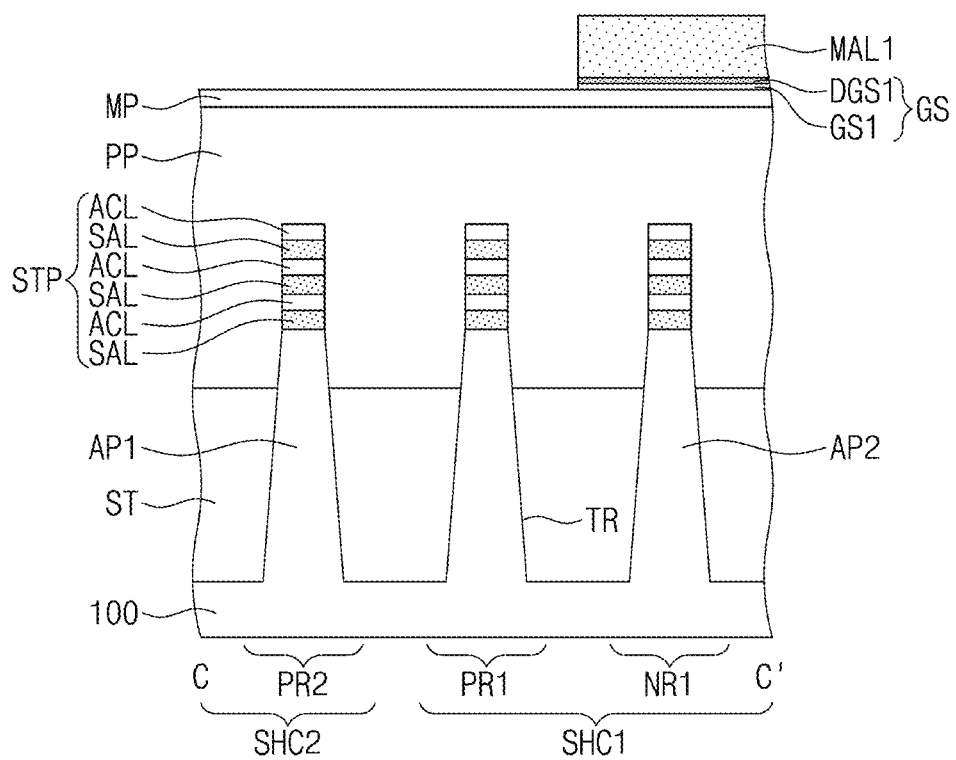
Figure 9D:
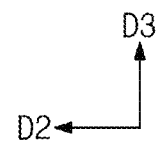

A height of the fence portion FEP on the second active pattern AP2 may be equal to or different from a height of the fence portion FEP on the first active pattern AP1 previously described with reference to FIG. 9C. The heights of the fence portions FEP on the first and second active patterns AP1 and AP2 may be independently adjusted.

The first to third semiconductor patterns SP1, SP2, and SP3, which are sequentially stacked between adjacent ones of the second recesses RS2, may be formed from the active layers ACL on the second active pattern AP2. The first to third semiconductor patterns SP1, SP2, and SP3 between adjacent ones of the second recesses RS2 may constitute the second channel pattern CH2.

Figure 13A:
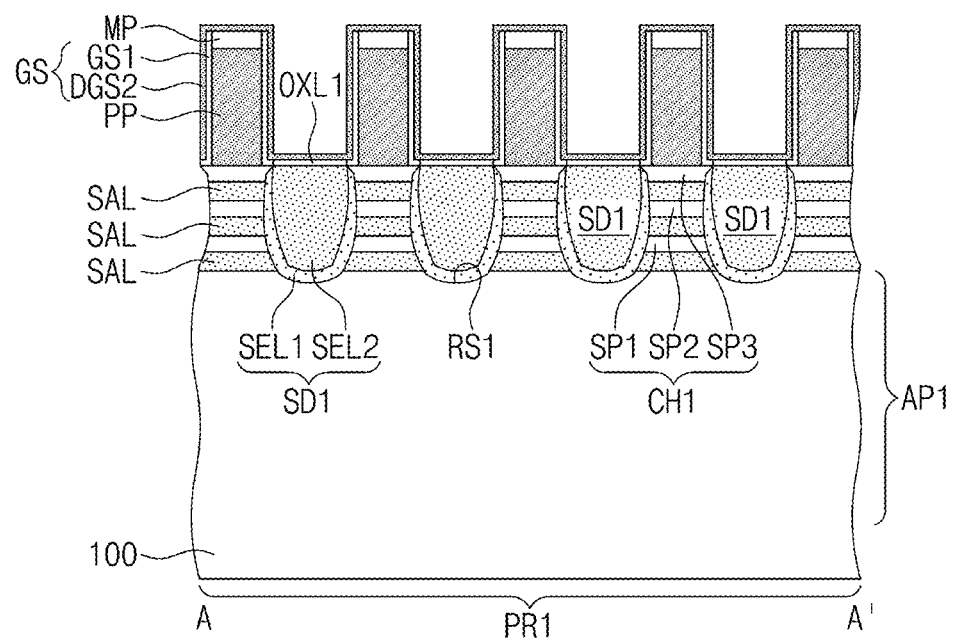
Figure 13A:
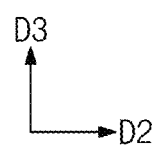
Figure 13B:
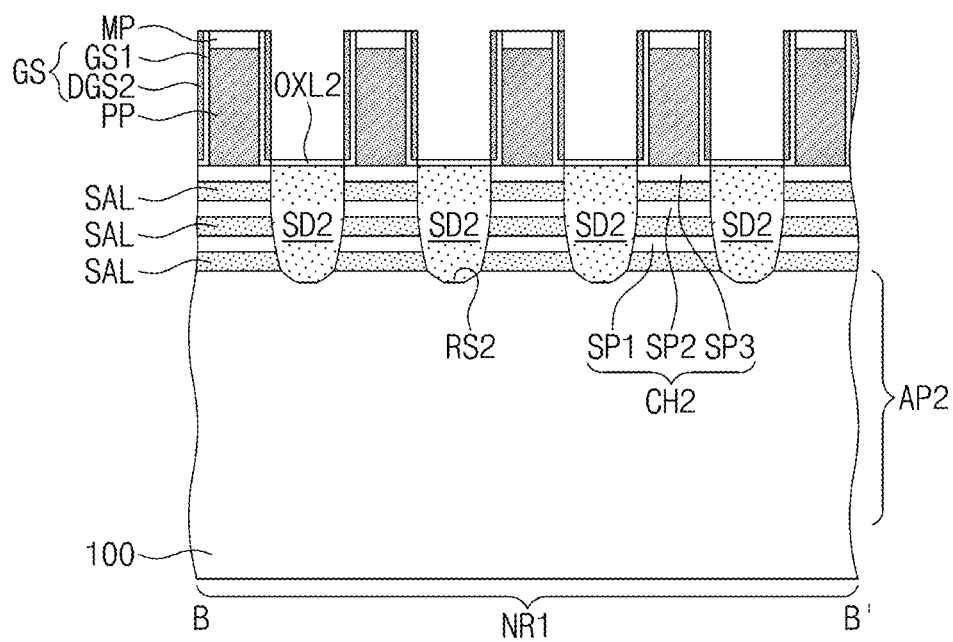
Figure 13B:
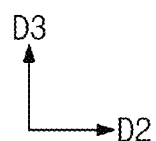
Figure 13C:
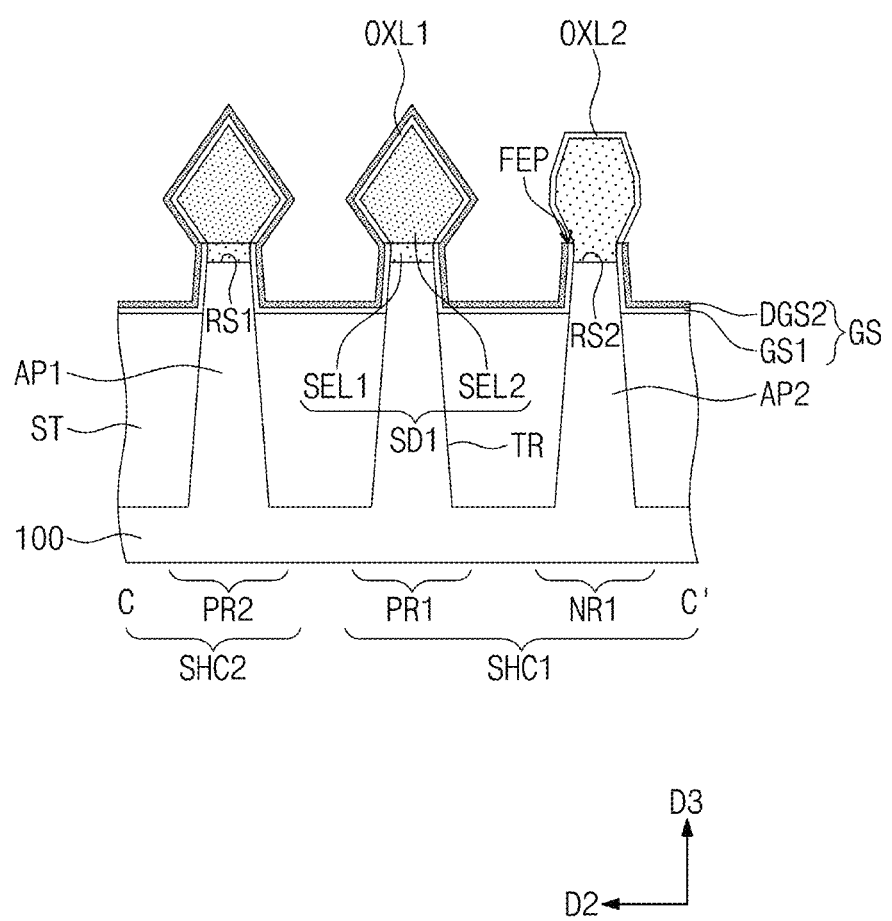

Referring to FIGS. 13A to 13C, the second mask layer MAL2 may be selectively removed. The second source/drain patterns SD2 may be formed in the second recesses RS2, respectively. In detail, the second source/drain pattern SD2 may be formed by performing a third SEG process, in which an inner surface of the second recess RS2 is used as a seed layer. In an embodiment, the second source/drain pattern SD2 may be formed of or include the same semiconductor material (e.g., Si) as the substrate 100.

The second source/drain pattern SD2 may be doped to have a second conductivity type (e.g., n-type). During the third SEG process, any semiconductor layer may not be grown, because the first and second PMOSFET regions PR1 and PR2 are covered with the spacer GS. The inner spacers IP may be respectively formed between the second source/drain pattern SD2 and the sacrificial layers SAL.

After the formation of the second source/drain patterns SD2, a selective oxidation process may be performed to selectively oxidize an exposed surface of each of the second source/drain patterns SD2. As a result of the selective oxidation of the second source/drain pattern SD2, a second oxide layer OXL2 may be selectively formed on the surface of the second source/drain pattern SD2. In an embodiment, the second oxide layer OXL2 may be formed by the substantially same method as that for the first oxide layer OXL1 described above.

Figure 14A:
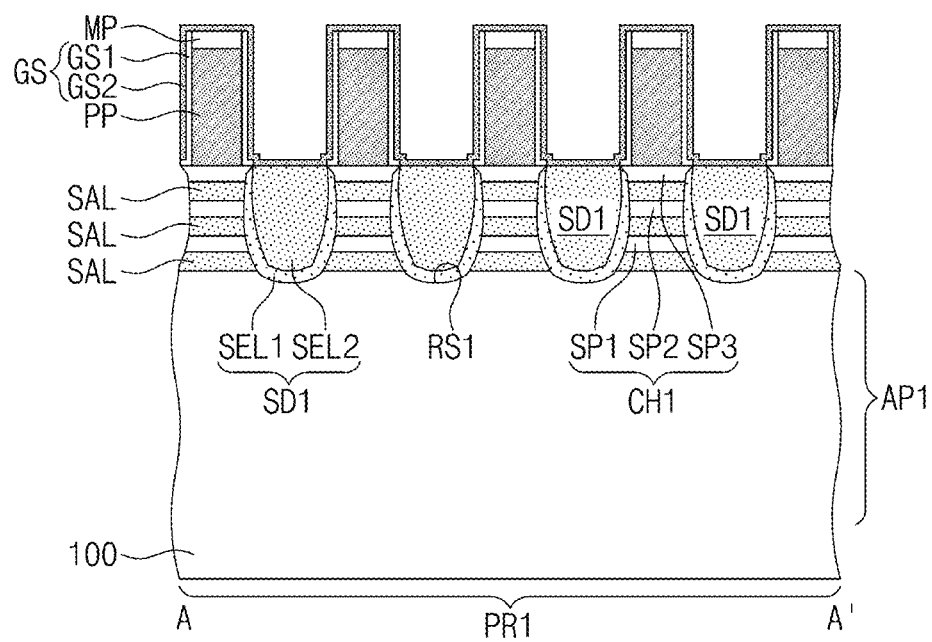
Figure 14A:
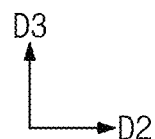
Figure 14B:
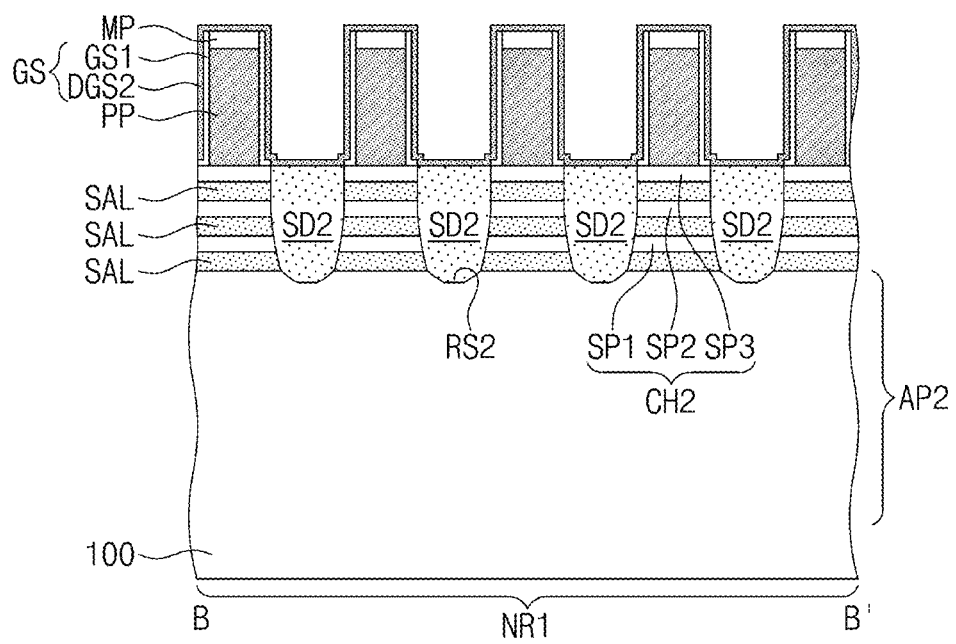
Figure 14C:
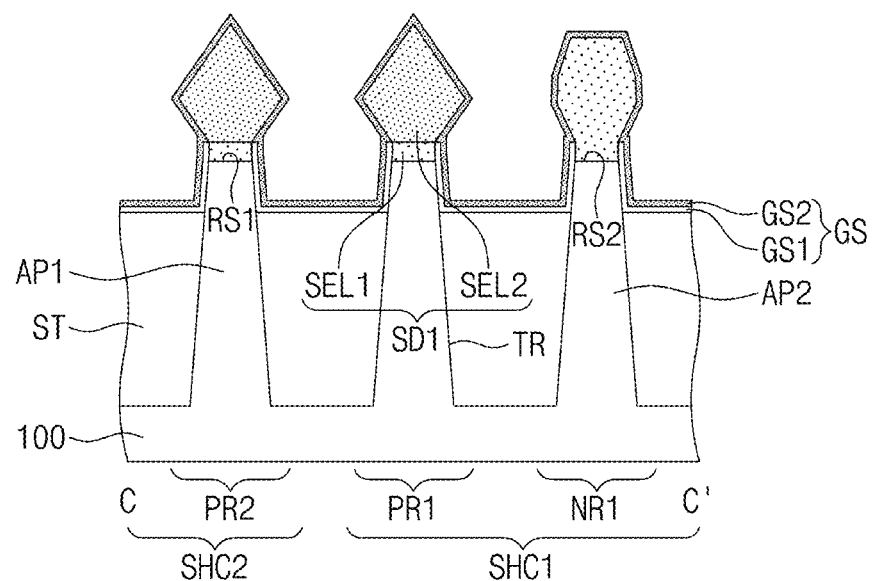
Figure 14C:
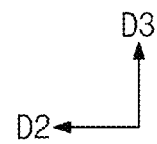
Figure 15A:
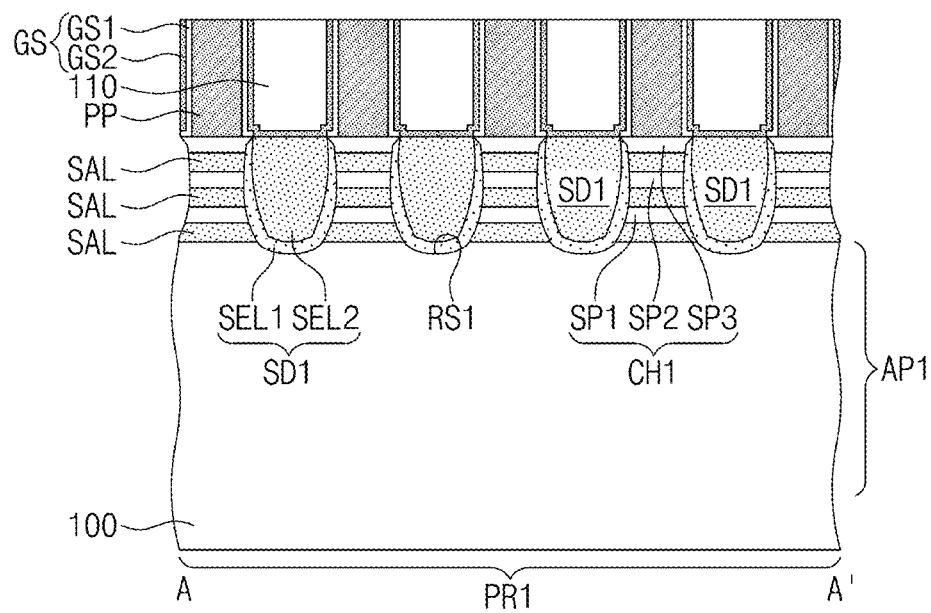
Figure 15A:
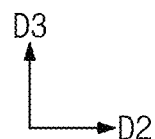
Figure 15B:
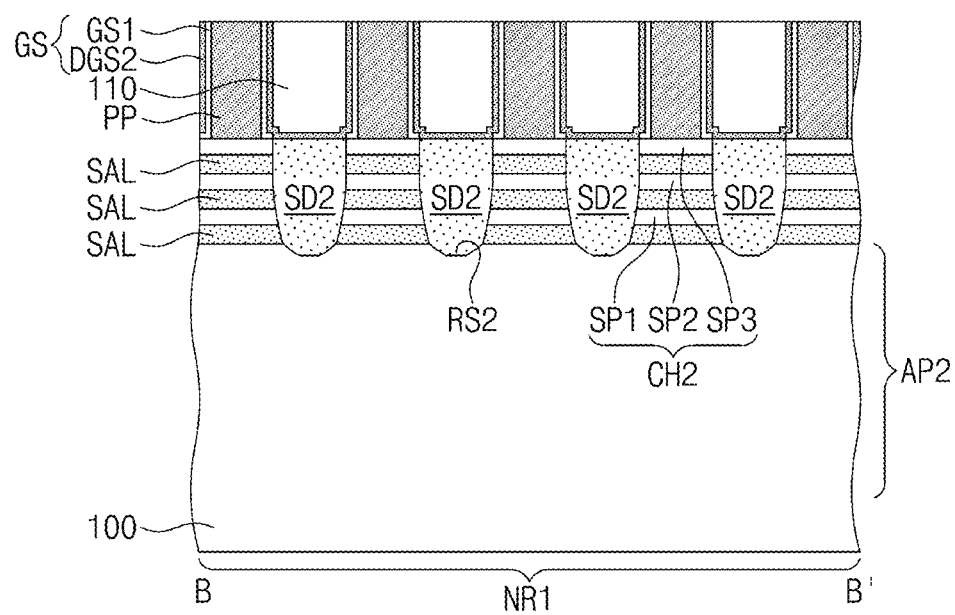
Figure 15C:
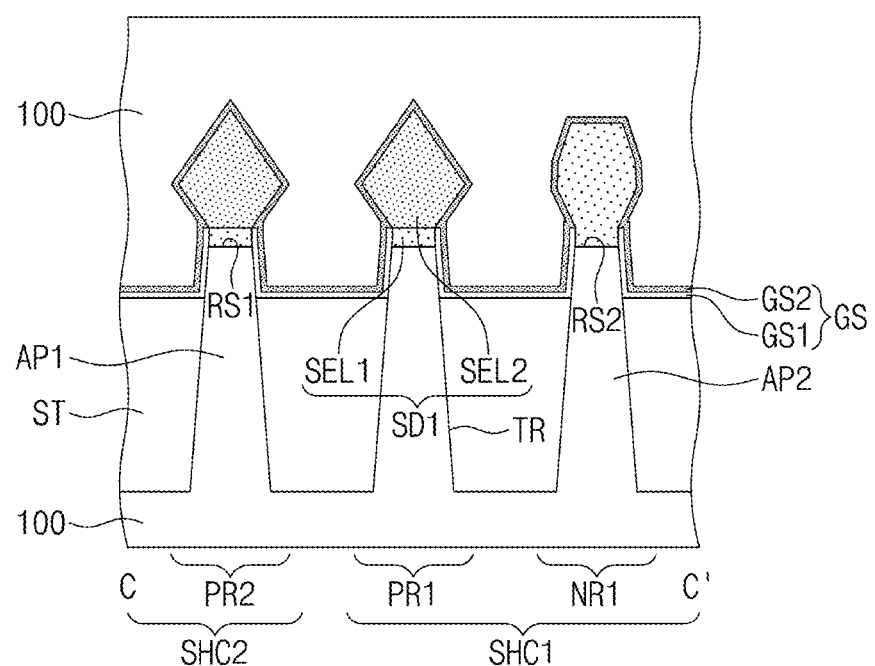
Figure 15C:
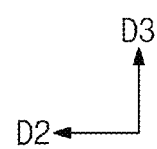
Figure 15D:
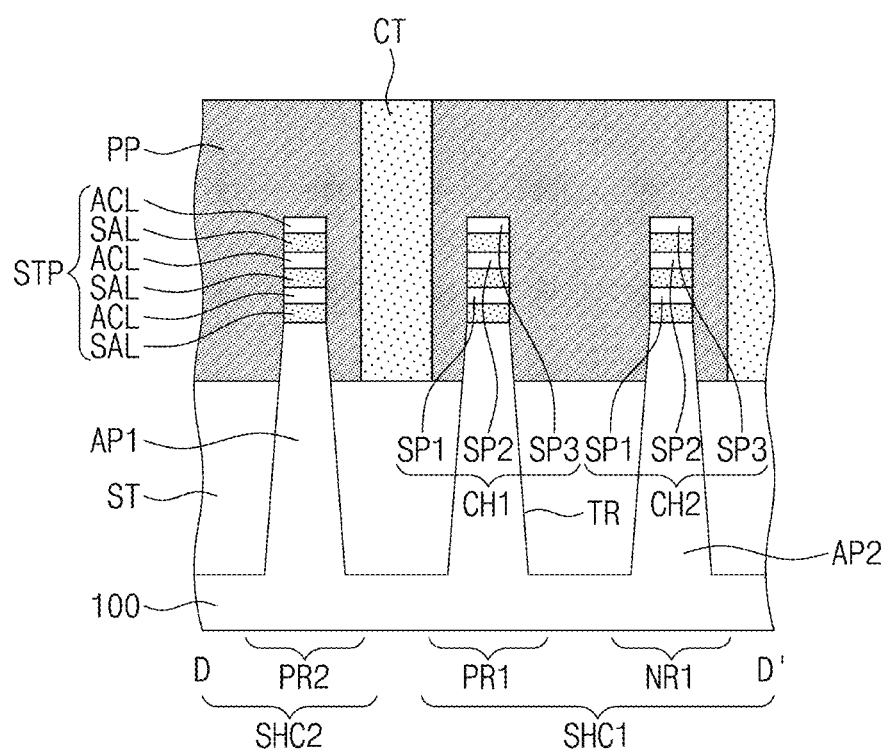

Referring to FIGS. 14A to 14C, the second disposable spacer DGS2 may be selectively removed. The removal of the second disposable spacer DGS2 may include a phosphoric acid strip process of selectively removing a Si nitride layer. As described above, during the phosphoric acid strip process, the first and second source/drain patterns SD1 and SD2 may be protected by the first and second oxide layers OXL1 and OXL2, respectively.

In an embodiment, the first and second oxide layers OXL1 and OXL2 may be selectively removed. In another embodiment, the first and second oxide layers OXL1 and OXL2 may not be removed or may be left.

The second spacer GS2 may be conformally formed on the substrate 100. The second spacer GS2 may be formed on the first spacer GS1 and the first and second source/drain patterns SD1 and SD2. The first spacer GS1 and the second spacer GS2 may constitute the spacer GS. The second spacer GS2 may be formed of or include a material (e.g., SiN) having a good etch resistant property.

Each of the first and second disposable spacers DGS1 and DGS2 described above may be used as an etch mask in a process of forming the first and second recesses RS1 and RS2 and may be damaged during this process. In the case where each of the first and second disposable spacers DGS1 and DGS2 is not removed and is used as the spacer GS, durability of the spacer GS may be deteriorated, and in this case, a process defect may occur in a subsequent process.

According to an embodiment, after the formation of the first and second source/drain patterns SD1 and SD2, a new second spacer GS2 of the same structure may be formed on the substrate 100. Accordingly, it may be possible to realize the spacer GS having high durability and to prevent a process defect from occurring in a subsequent process. In addition, since the spacers GS of the same material and the same thickness are provided in common on PMOS and NMOS regions, it may be possible to improve uniformity in electric characteristics of the semiconductor device.

Referring to FIGS. 15A to 15D, the first interlayer insulating layer 110 may be formed to cover the hard mask patterns MP and the spacers GS. As an example, the first interlayer insulating layer 110 may include a Si oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. All of the hard mask patterns MP may be removed during the planarization process. Accordingly, the first interlayered insulating layer 110 may have a top surface that is coplanar with the top surfaces of the sacrificial patterns PP and the top surfaces of the spacers GS.

A photolithography process may be performed to selectively open a region of the sacrificial pattern PP. For example, a partial region of the sacrificial pattern PP on a border of the first single height cell SHC1 may be selectively opened. The opened region of the sacrificial pattern PP may be selectively etched and removed. The gate cutting pattern CT may be formed by filling a space, which is formed by removing the sacrificial pattern PP, with an insulating material.

Referring to FIGS. 16A to 16D, the exposed sacrificial patterns PP may be selectively removed. As a result of the removal of the sacrificial patterns PP, an outer region ORG exposing the first and second channel patterns CH1 and CH2 may be formed (e.g., FIG. 16D). The removal of the sacrificial patterns PP may include a wet etching process which is performed using an etching solution capable of selectively etching polySi.

Figure 16A:
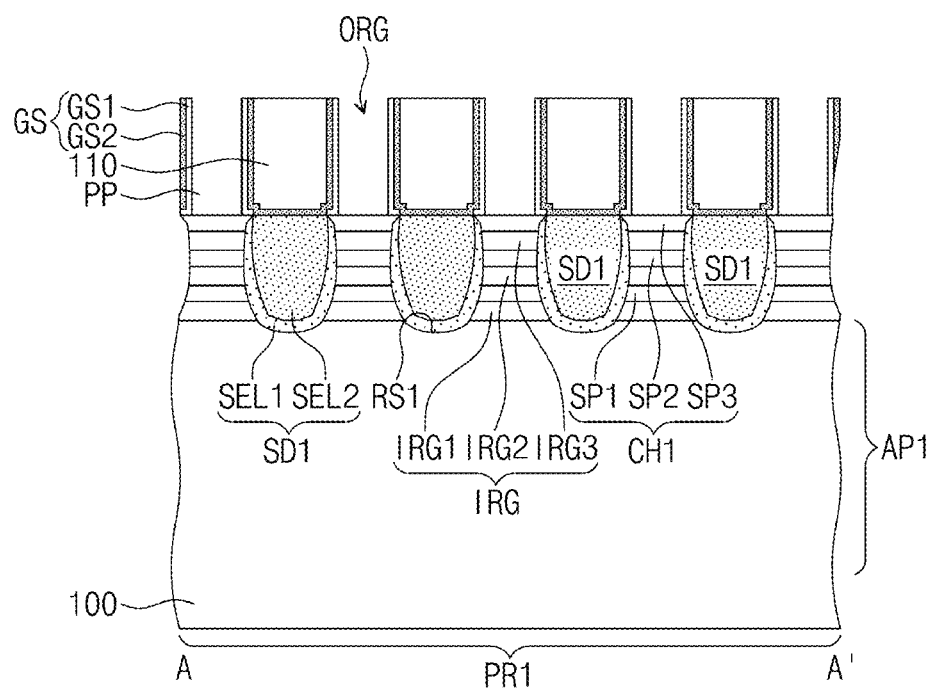
Figure 16B:
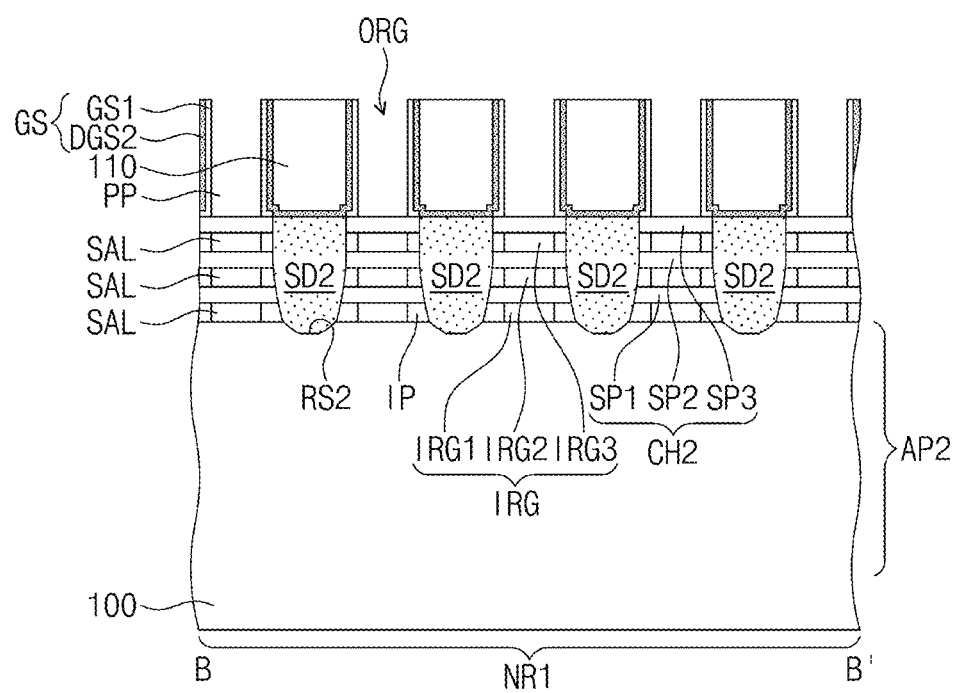
Figure 16C:
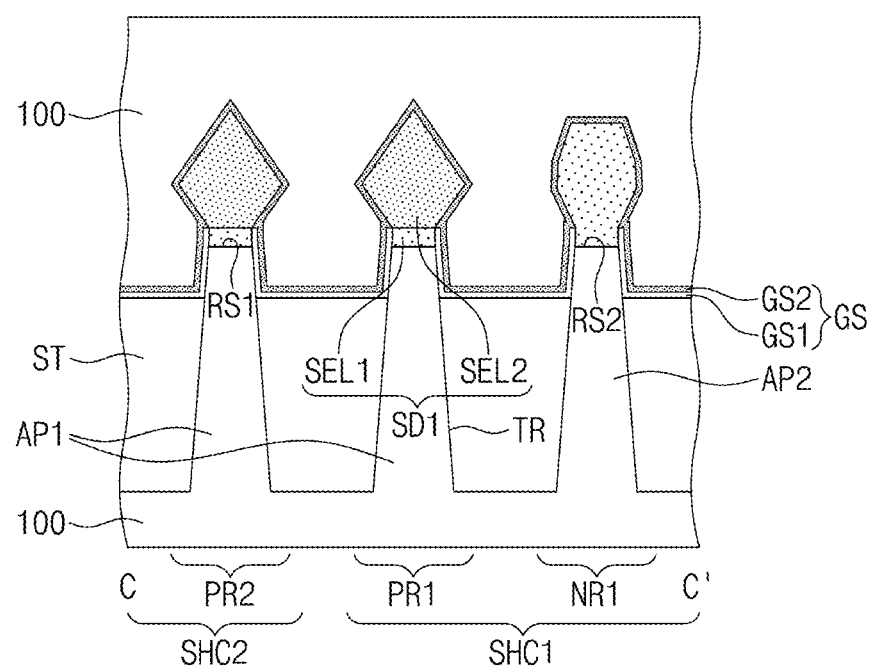
Figure 16C:
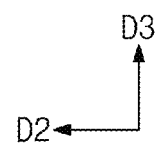
Figure 16D:
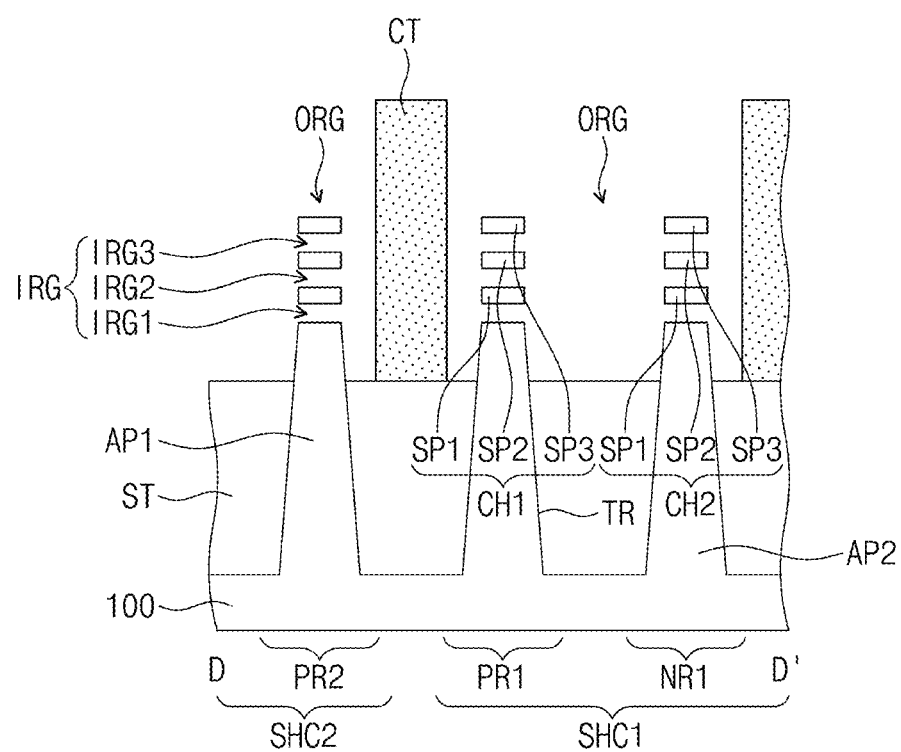
Figure 16D:
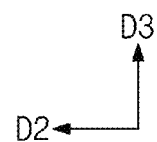
Figure 17A:
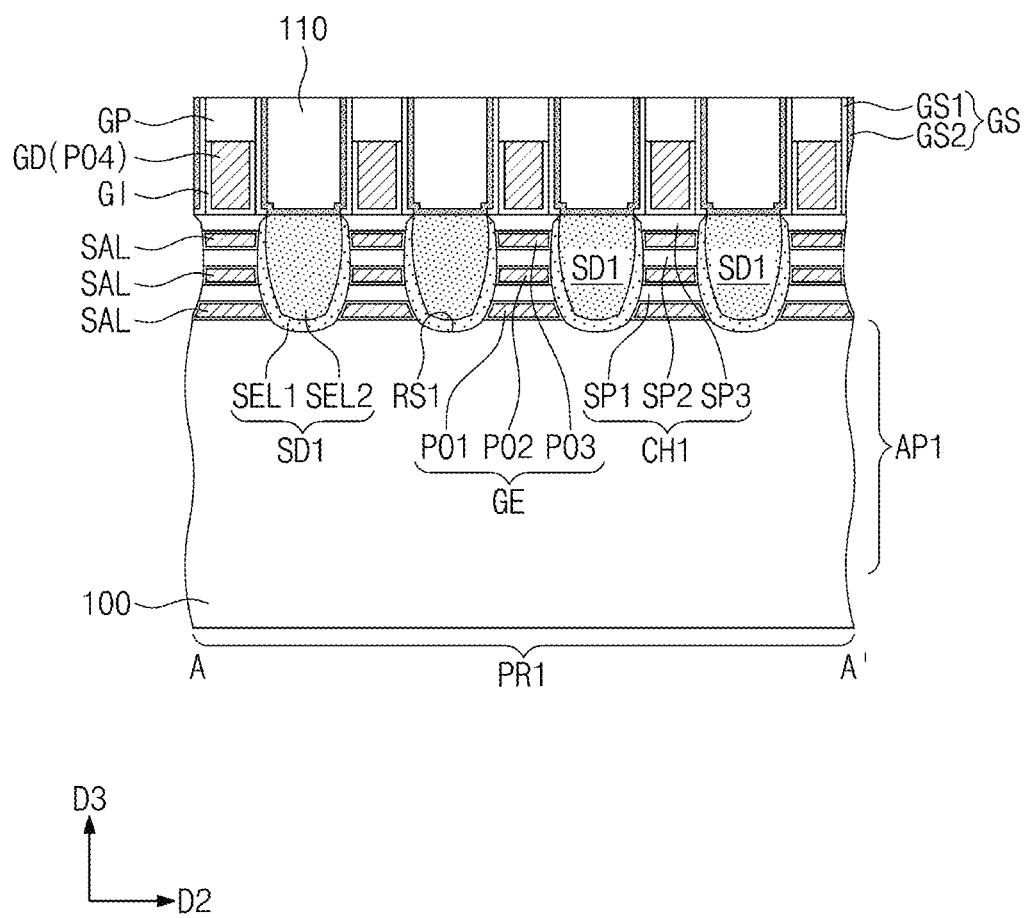
Figure 17B:
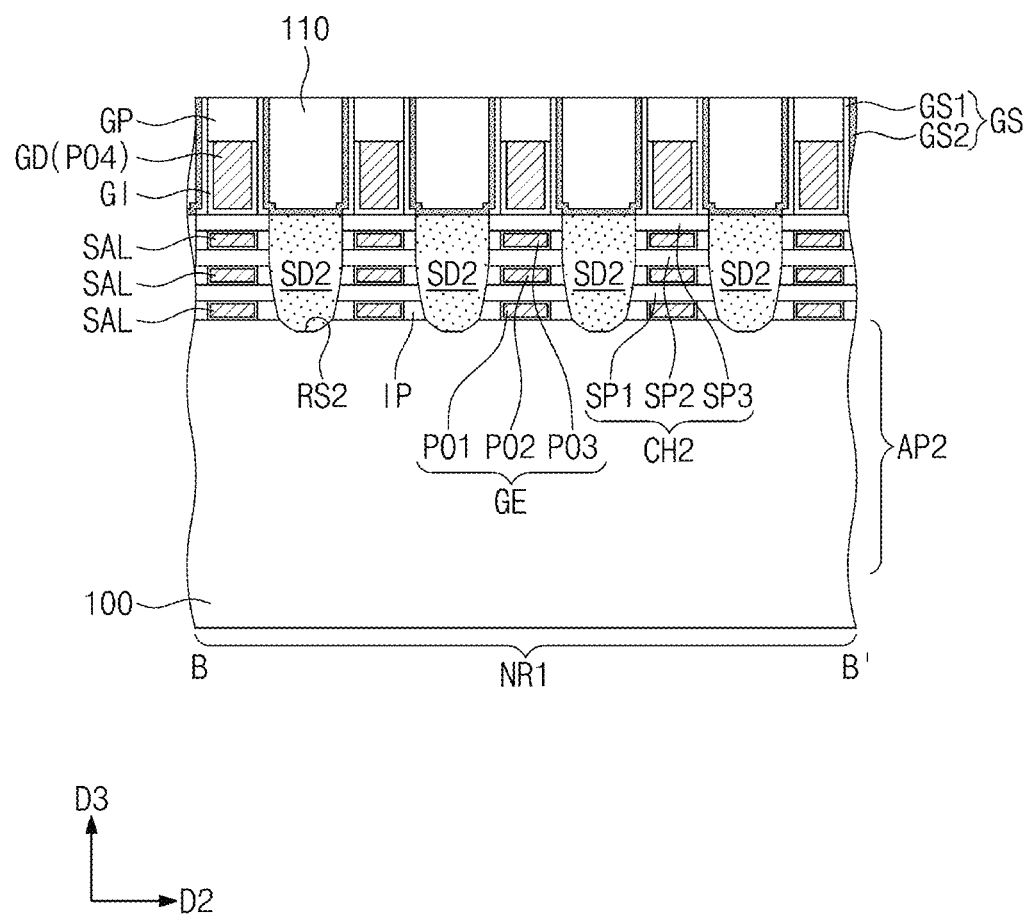
Figure 17C:
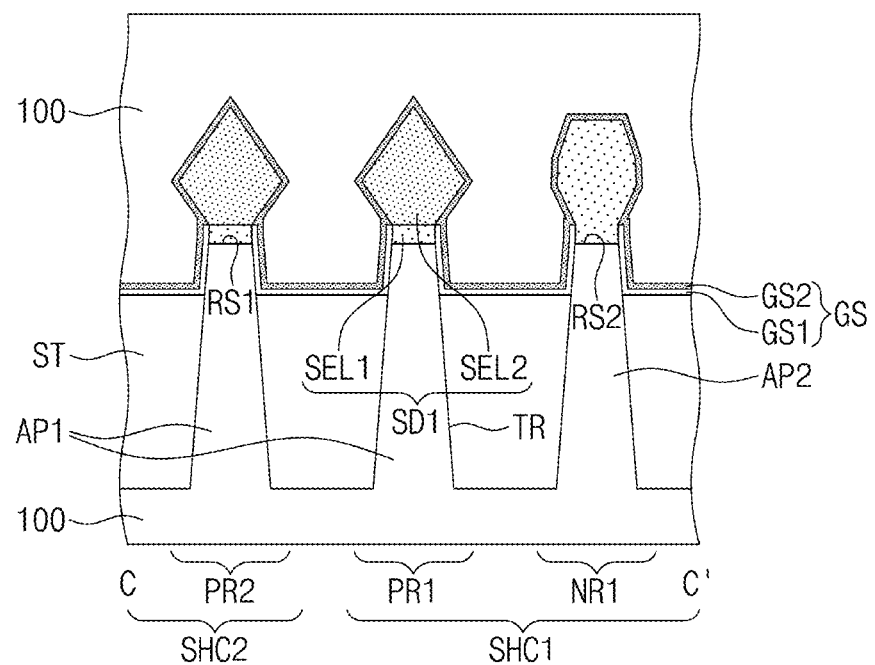
Figure 17C:
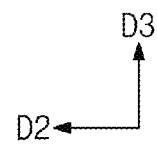
Figure 17D:
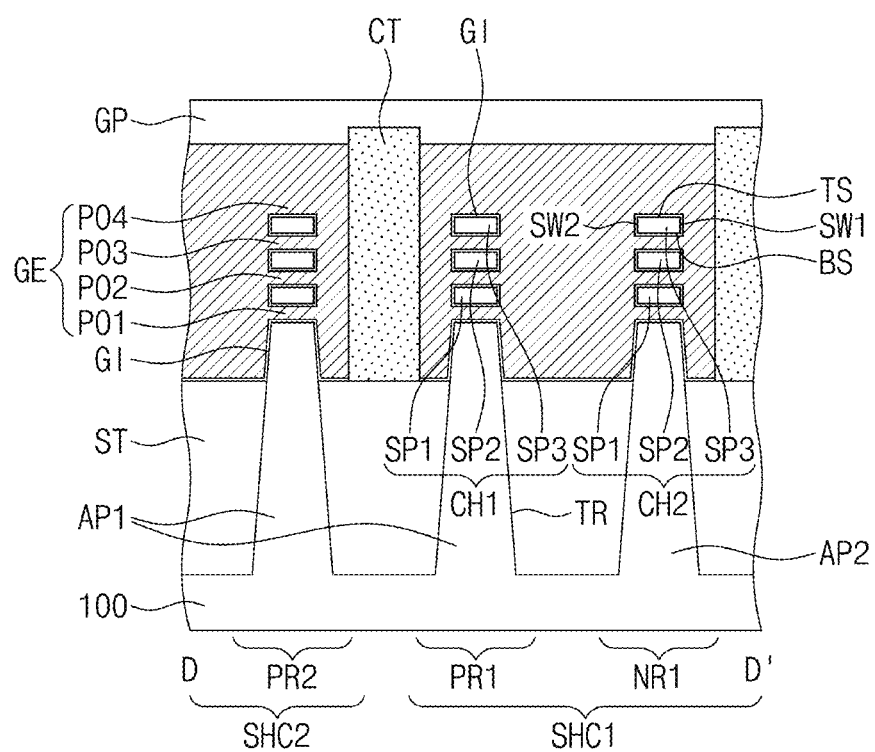
Figure 17D:
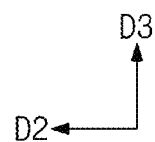

The sacrificial layers SAL exposed through the outer region ORG may be selectively removed to form inner regions IRG (e.g., FIG. 16D). In detail, by performing a process of selectively etching the sacrificial layers SAL, it may be possible to leave the first to third semiconductor patterns SP1, SP2, and SP3 and to remove only the sacrificial layers SAL. The etching process may be chosen to have a high etch rate for a material (e.g., SiGe) having a relatively high Ge concentration. For example, the etching process may have a high etch rate for Si—Ge whose Ge concentration is higher than about 10%.

The sacrificial layers SAL on the first and second PMOSFET regions PR1 and PR2 and the first and second NMOSFET regions NR1 and NR2 may be removed during the etching process. The etching process may be a wet etching process. An etchant material, which is used in the etching process, may be chosen to quickly remove the sacrificial layer SAL having a relatively high Ge concentration. Meanwhile, the first source/drain pattern SD1 on the first and second PMOSFET regions PR1 and PR2 may be protected from the etching process by the first semiconductor layer SEL1 having a relatively low Ge concentration.

Since the sacrificial layers SAL are selectively removed, the first to third semiconductor patterns SP1, SP2, and SP3 may be left on each of the first and second active patterns AP1 and AP2. Empty regions, which are formed by removing the sacrificial layers SAL, may form first to third inner regions IRG1, IRG2, and IRG3, respectively. In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 17A to 17D, the gate insulating layer GI may be conformally formed on the exposed first to third semiconductor patterns SP1, SP2, and SP3. The gate electrode GE may be formed on the gate insulating layer GI. The gate electrode GE may include the first to third portions PO1, PO2, and PO3, which are respectively formed in the first to third inner regions IRG1, IRG2, and IRG3, and the fourth portion PO4, which is formed in the outer region ORG.

The gate electrode GE may be recessed to have a reduced height. During the recessing of the gate electrode GE, an upper portion of the gate cutting pattern CT may also be slightly recessed. The gate capping pattern GP may be formed on the recessed gate electrode GE.

Referring back to FIGS. 4 and 5A to 5D, the second interlayer insulating layer 120 may be formed on the first interlayer insulating layer 110. The second interlayer insulating layer 120 may include a Si oxide layer. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

A pair of the division structures DB may be formed at both sides of each of the first and second single height cells SHC1 and SHC2. The division structure DB may penetrate the second interlayer insulating layer 120 and the gate electrode GE and may be extended into the active pattern AP1 or AP2. The division structure DB may be formed of or include an insulating material (e.g., Si oxide or Si nitride).

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

Figure 19:
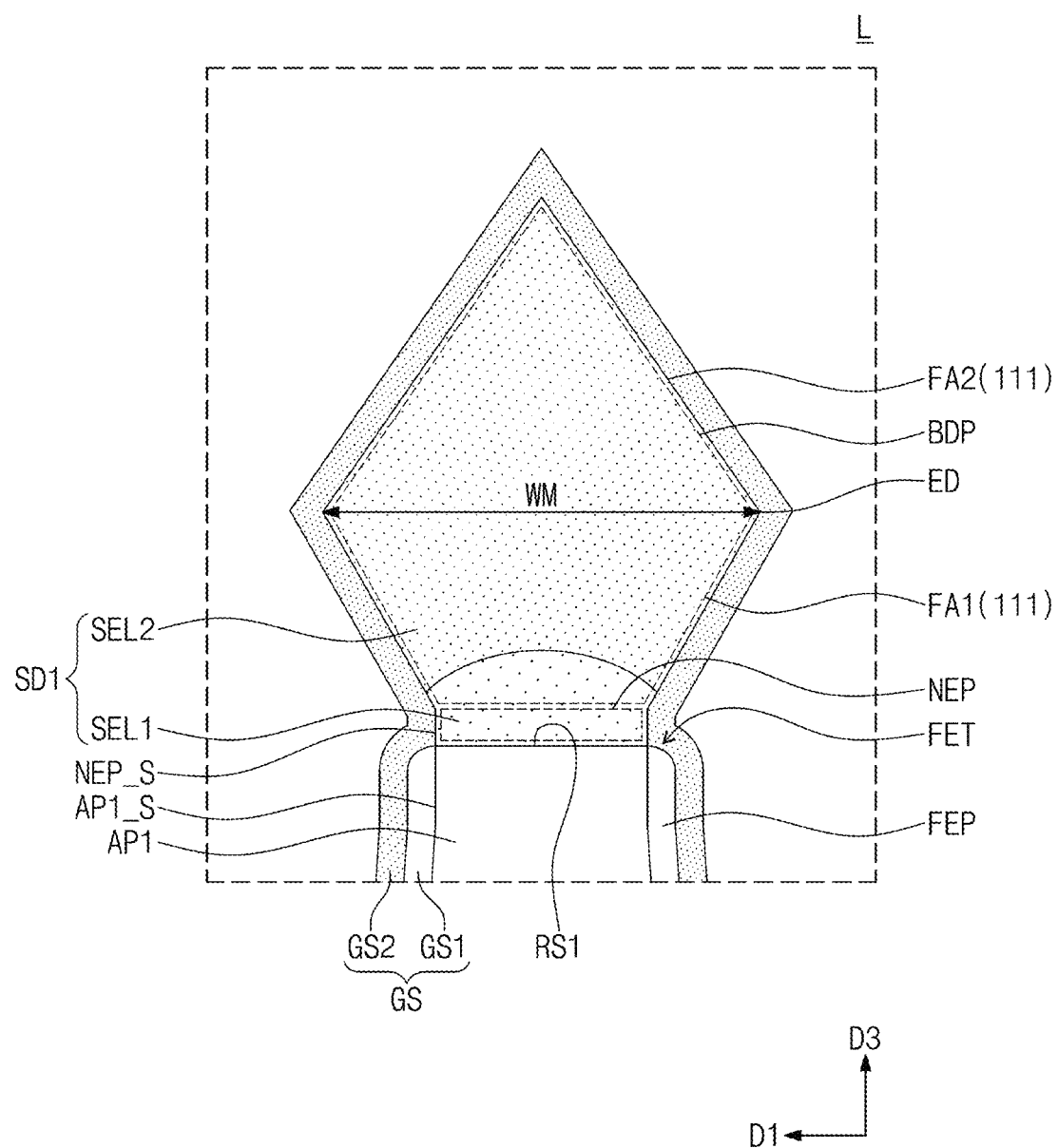
FIGS. 19 and 20 are sectional views illustrating a portion (e.g., the portion L of FIG. 5C) of a semiconductor device according to an embodiment.
Figure 20:
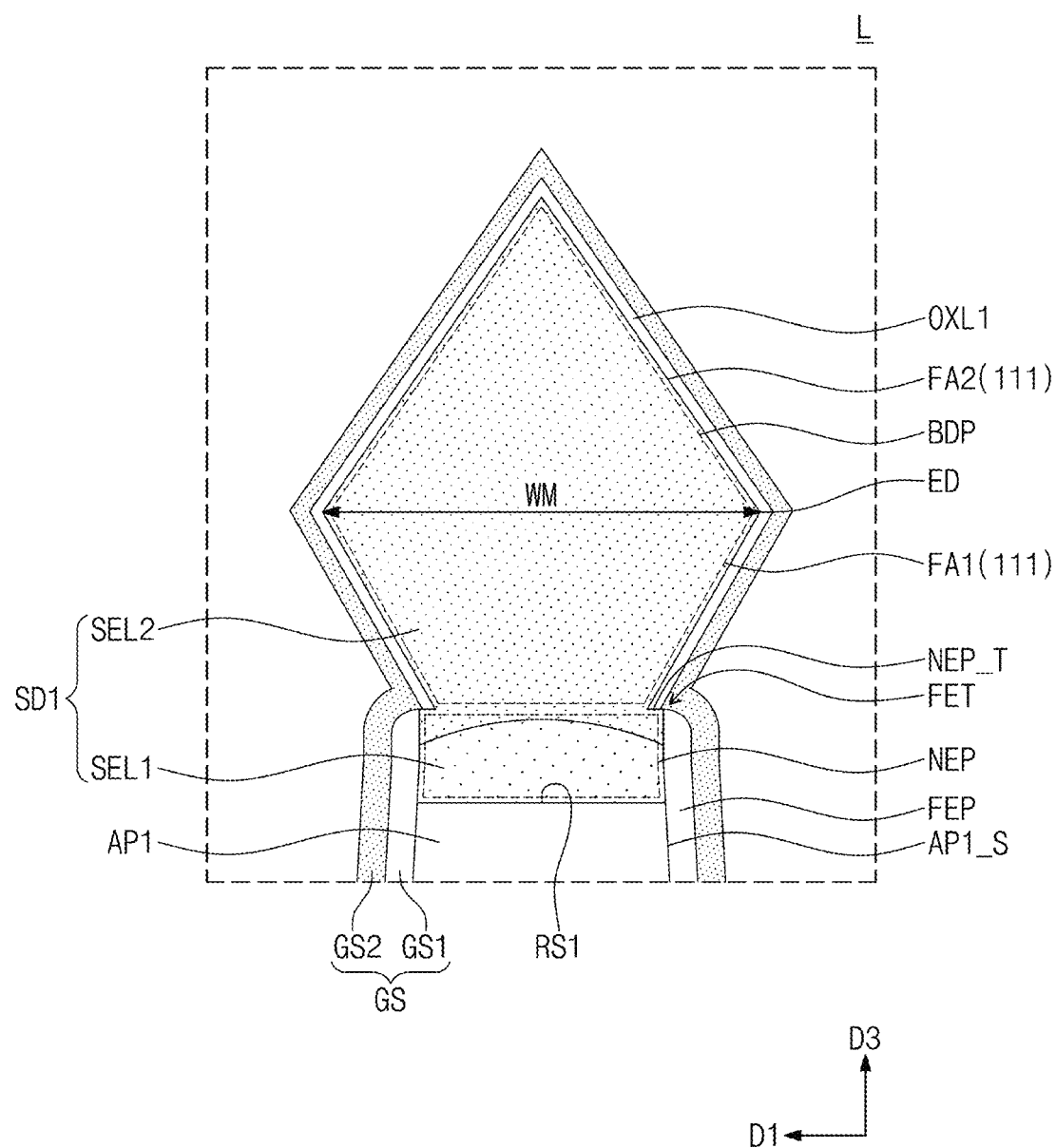

FIGS. 19 and 20 are sectional views illustrating a portion (e.g., the portion L of FIG. 5C) of a semiconductor device according to an embodiment. For concise description, an element previously described with reference to FIGS. 4, 5A to 5D, 6A, and 6B may be identified by the same reference number without repeating an overlapping description thereof.

Referring to FIG. 19, the uppermost portion FET of the fence portion FEP of the first spacer GS1 may be located at a level that is equal to or lower than the bottom surface of the first recess RS1. The neck portion NEP of the first source/drain pattern SD1 may vertically protrude relative to the uppermost portion FET of the fence portion FEP. The side surface NEP_S of the neck portion NEP may not be covered with the fence portion FEP. The side surface NEP_S of the neck portion NEP may be covered with the second spacer GS2. The side surface NEP_S of the neck portion NEP and the side surface AP1_S of the first active pattern AP1 may be aligned to each other.

The first facet FA1 of the body portion BDP may be vertically spaced apart from the uppermost portion FET of the fence portion FEP. The side surface NEP_S of the neck portion NEP may be exposed between the first facet FA1 of the body portion BDP and the uppermost portion FET of the fence portion FEP. In other words, the first facet FA1 of the body portion BDP may be spaced apart from the uppermost portion FET of the fence portion FEP by the side surface NEP_S of the neck portion NEP.

The neck portion NEP of the first source/drain pattern SD1 may include only the first semiconductor layer SEL1. The body portion BDP of the first source/drain pattern SD1 may include may include the second semiconductor layer SEL2 and an upper portion of the first semiconductor layer SEL1.

In the case where the uppermost portion FET of the fence portion FEP is formed at a level that is equal to or lower than the bottom surface of the first recess RS1, the selective oxidation process described with reference to FIGS. 18A and 18B may be performed on the first source/drain pattern SD1, and in this case, the first source/drain pattern SD1 may have the structure of FIG. 19.

Referring to FIG. 20, the first oxide layer OXL1 may be interposed between the body portion BDP of the first source/drain pattern SD1 and the second spacer GS2. In other words, the first oxide layer OXL1 may directly cover the first and second facets FA1 and FA2 of the body portion BDP. The first oxide layer OXL1 may cover at least a portion of the top surface NEP_T of the neck portion NEP.

Unlike that described with reference to FIGS. 14A to 14C, in the case where the process of removing the first and second oxide layers OXL1 and OXL2 is not performed or the first and second oxide layers OXL1 and OXL2 are insufficiently removed, the first oxide layer OXL1 of FIG. 20 may be left between the first source/drain pattern SD1 and the second spacer GS2.

Figure 21:
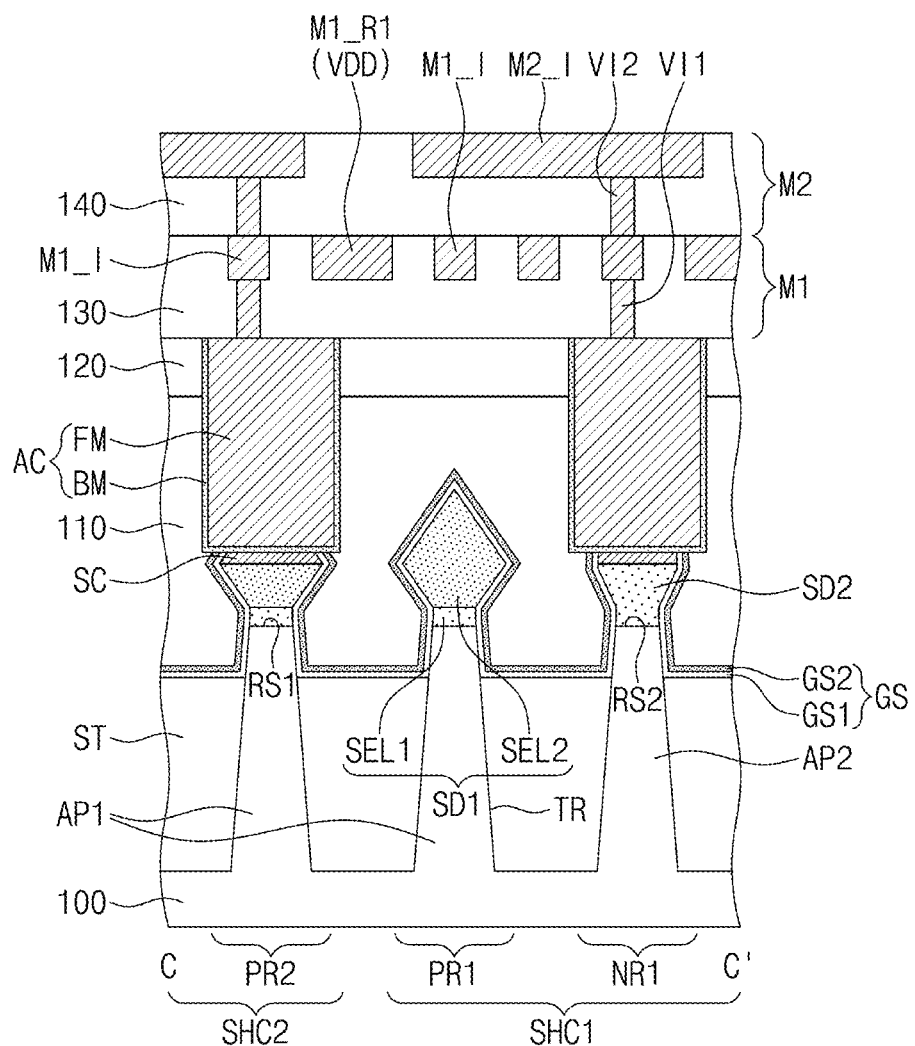
FIG. 21 is a sectional view which is taken along the line C-C' of FIG. 4 to illustrate a semiconductor device according to an embodiment.

FIG. 21 is a sectional view which is taken along the line C-C' of FIG. 4 to illustrate a semiconductor device according to an embodiment. Referring to FIG. 21, the spacer GS may include the first spacer GS1 and the second spacer GS2 on the first spacer GS1. The first spacer GS1 may directly cover a surface of each of the first and second source/drain patterns SD1 and SD2. That is, the first spacer GS1 may not include the fence portion FEP of FIG. 5C. The first spacer GS1 may be extended from upper side surfaces of the first and second active patterns AP1 and AP2 to regions on the first and second source/drain patterns SD1 and SD2, without any cut portion.

Figure 22A:
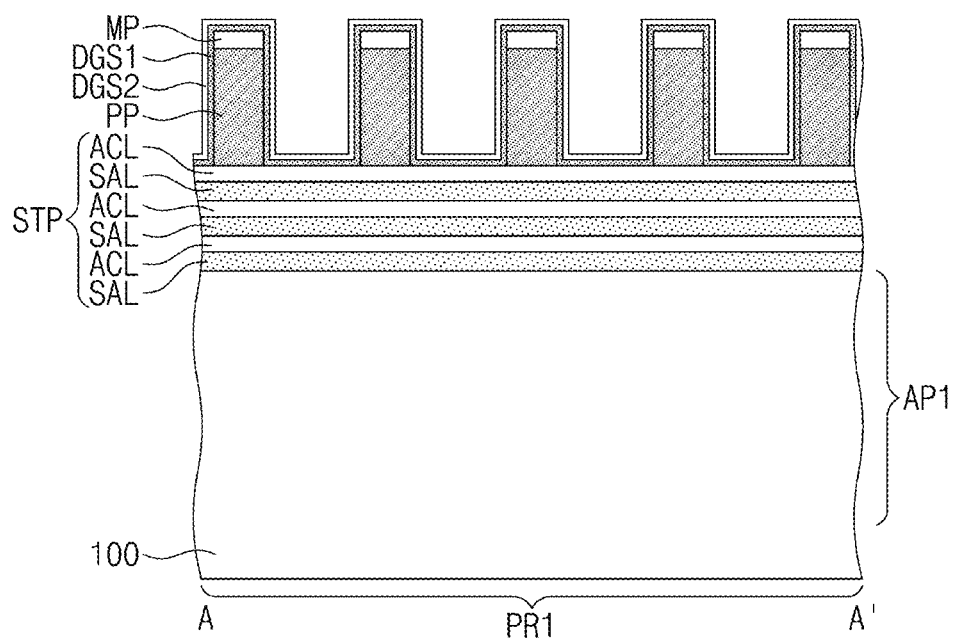
FIGS. 22A, 22B, 23A and 23B are sectional views illustrating a method of fabricating a semiconductor device according to an embodiment.
Figure 22A:
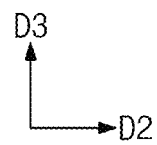
Figure 22B:
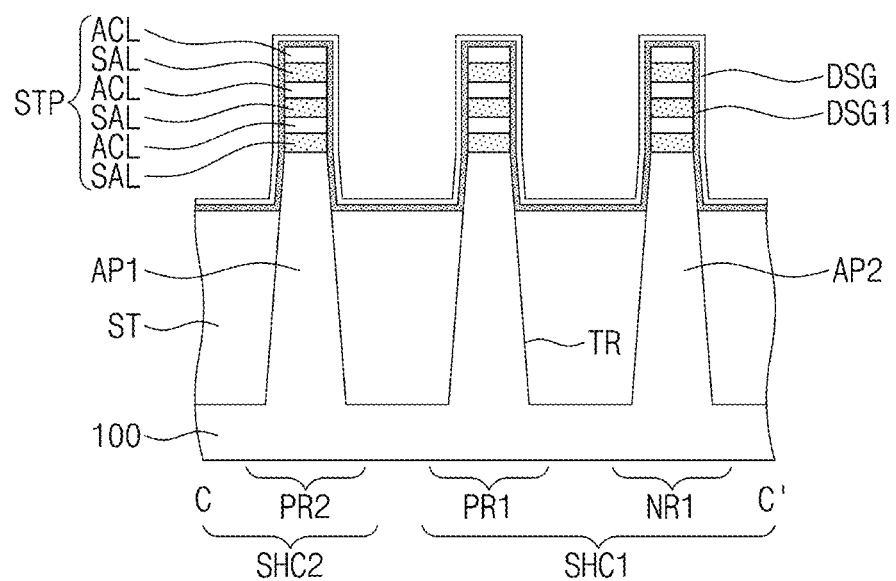
Figure 22B:
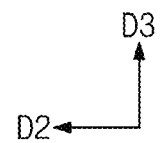
Figure 23A:
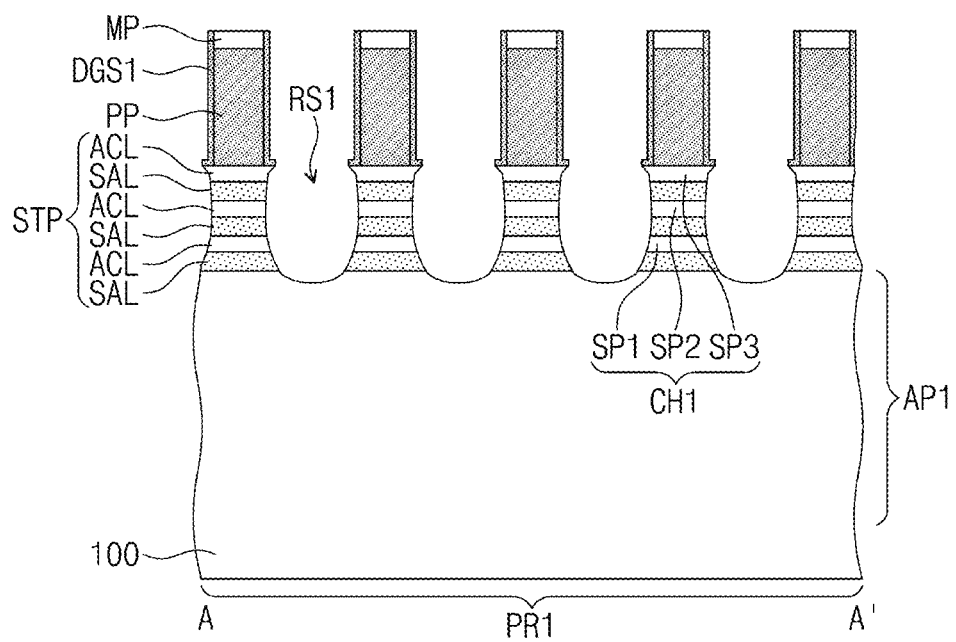
Figure 23B:
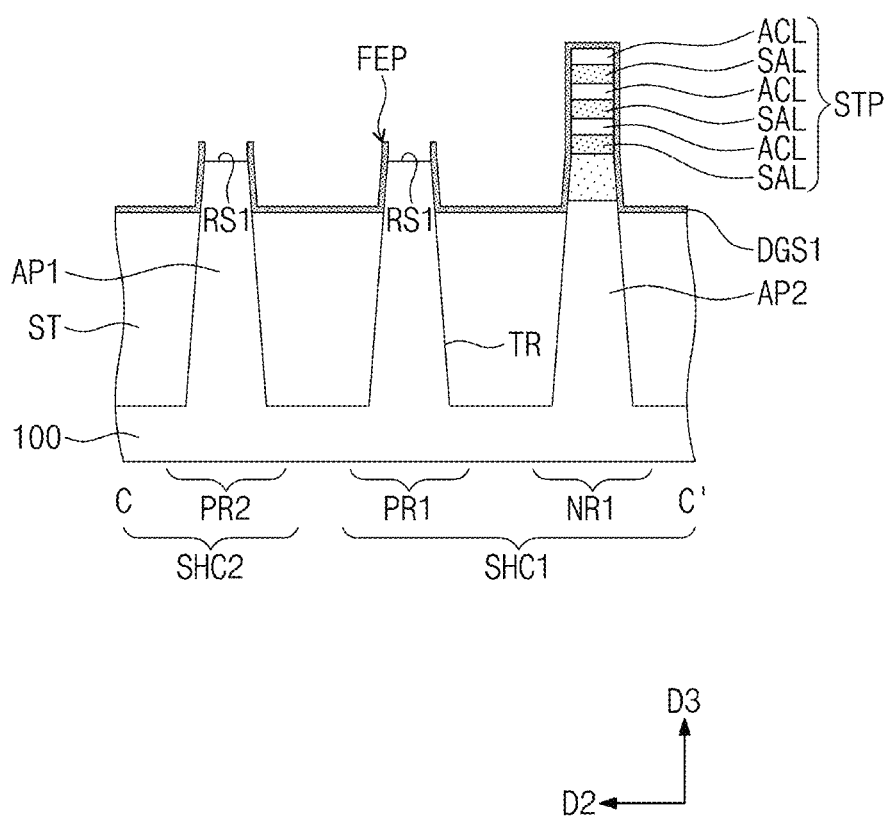
Figure 24A:
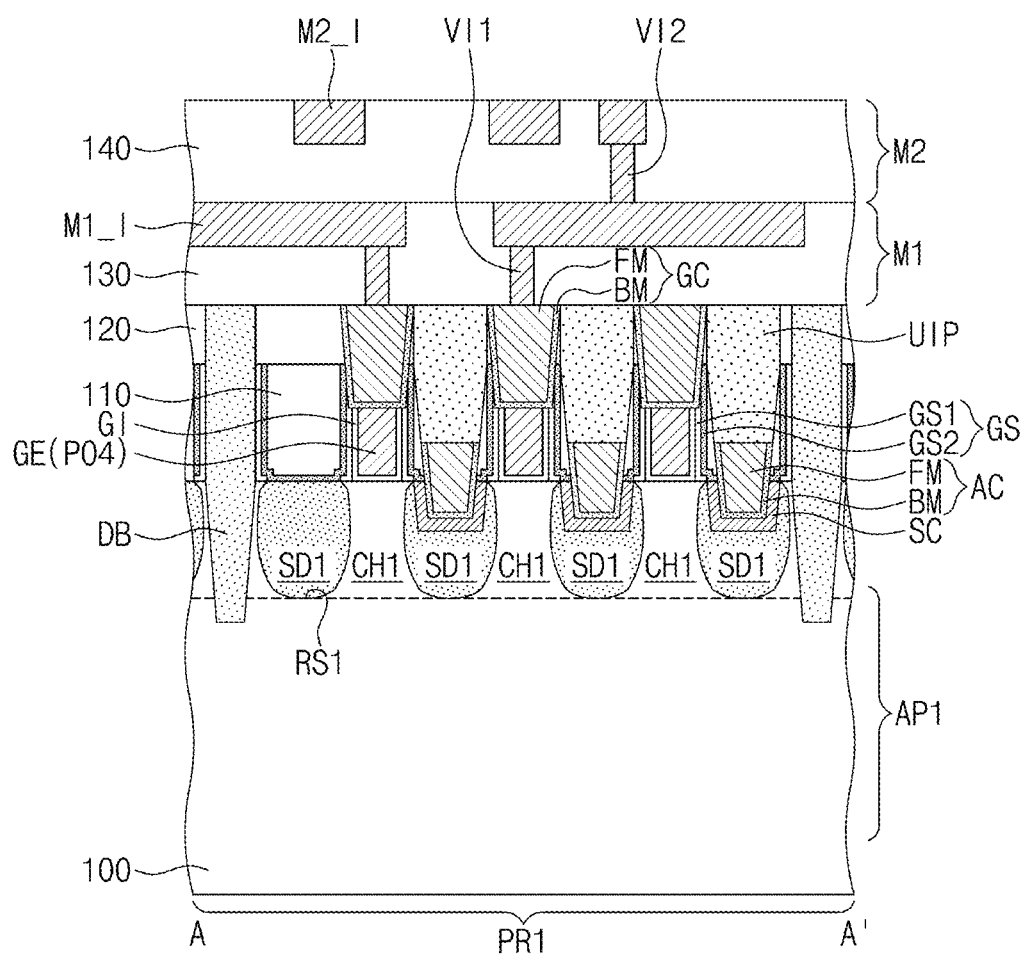
FIGS. 24A, 24B, 24C and 24D are sectional views, which are respectively taken along the lines A-A', B-B', C-C', and D-D' of FIG. 4 to illustrate a semiconductor device according to an embodiment.
Figure 24B:
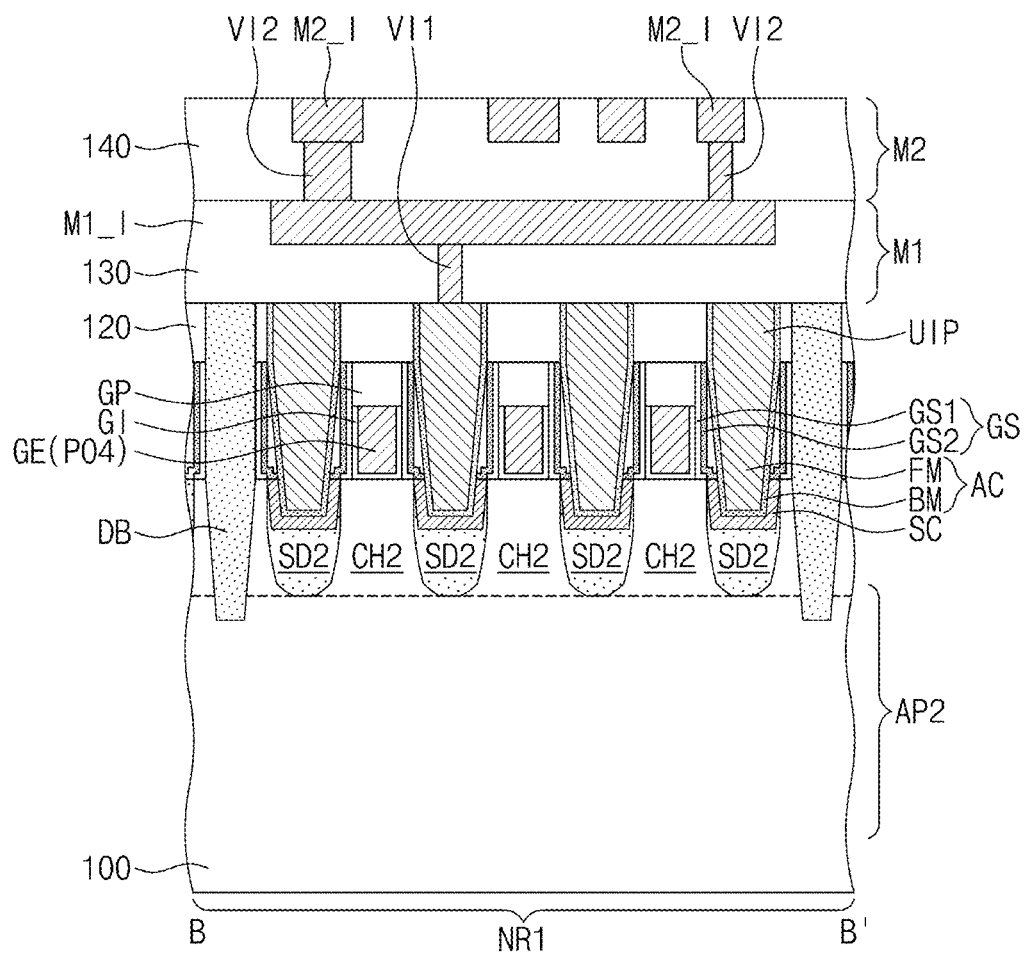
Figure 24C:
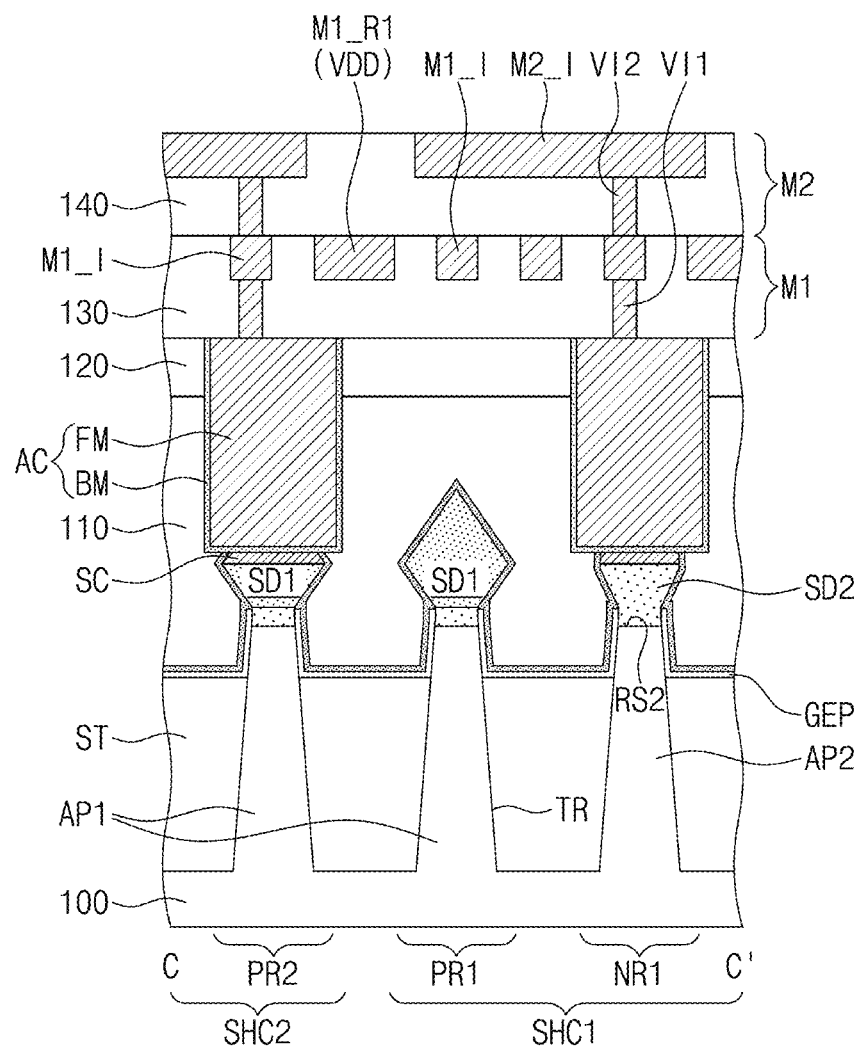
Figure 24D:
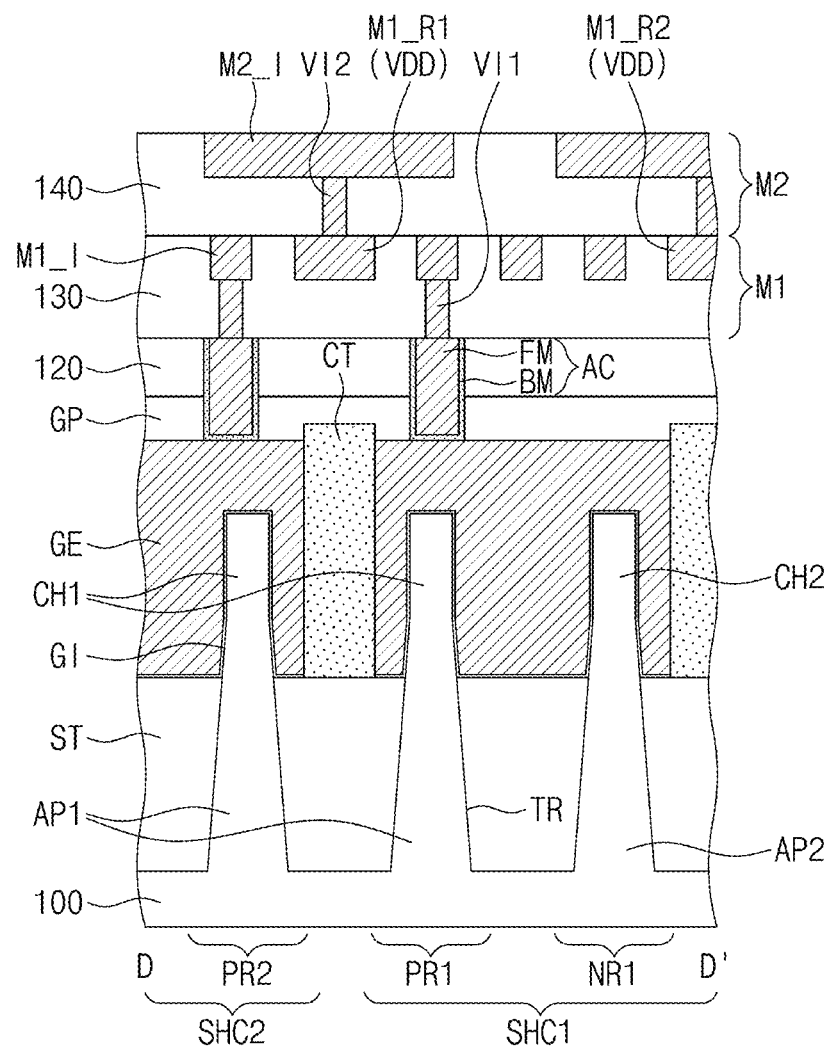

FIGS. 22A, 22B, 23A and 23B are sectional views illustrating a method of fabricating a semiconductor device according to an embodiment. In detail, FIGS. 22A and 23A are sectional views corresponding to the line A-A' of FIG. 4. FIGS. 22B and 23B are sectional views corresponding to the line C-C' of FIG. 4.

Referring to FIGS. 22A and 22B, the first disposable spacer DGS1 and the second disposable spacer DGS2 may be sequentially formed on the sacrificial patterns PP. The first spacer GS1 may be omitted, unlike the structure described with reference to FIGS. 8A to 8C. For example, the first disposable spacer DGS1 may be formed of or include Si nitride, and the second disposable spacer DGS2 may be formed of or include Si oxide.

Referring to FIGS. 23A and 23B, the first recesses RS1 may be formed. After the formation of the first recesses RS1, the second disposable spacer DGS2 may be selectively removed. A remaining portion of the first disposable spacer DGS1 may constitute the fence portion FEP.

Thereafter, the first source/drain patterns SD1 may be formed, a selective oxidation process may be performed on the first source/drain patterns SD1, and the remaining portion of the first disposable spacer DGS1 may be fully removed. The first disposable spacer DGS1 and the second disposable spacer DGS2 may be sequentially formed on the substrate 100.

The second source/drain patterns SD2 may be formed in the same manner as described above. After the full removal of the disposable spacer, the first and second spacers GS1 and GS2 may be sequentially formed on the substrate 100, as shown in FIG. 21. That is, in the fabrication method according to the present embodiment, by removing the used spacer after the formation of the first and second source/drain patterns SD1 and SD2 and forming a new spacer, it may be possible to improve reliability of the device.

FIGS. 24A, 24B, 24C and 24D are sectional views, which are respectively taken along the lines A-A', B-B', C-C', and D-D' of FIG. 4 to illustrate a semiconductor device according to an embodiment. In the following description, an element previously described with reference to FIGS. 4 and 5A to 5D may be identified by the same reference number without repeating an overlapping description thereof, for concise description.

Referring to FIGS. 4 and 24A to 24D, the device isolation layer ST may define the first active pattern AP1 and the second active pattern AP2 in an upper portion of the substrate 100. The first active pattern AP1 may be defined on each of the first and second PMOSFET regions PR1 and PR2, and the second active pattern AP2 may be defined on each of the first NMOSFET region NR1 and the second NMOSFET region NR2.

The device isolation layer ST may cover a side surface of a lower portion of each of the first and second active patterns AP1 and AP2. An upper portion of each of the first and second active patterns AP1 and AP2 may protrude above the device isolation layer ST (e.g., FIG. 24D).

The first active pattern AP1 may include the first source/drain patterns SD1, which are provided in an upper portion thereof, and the first channel pattern CH1, which is provided between the first source/drain patterns SD1. The second active pattern AP2 may include the second source/drain patterns SD2, which are provided in an upper portion thereof, and the second channel pattern CH2, which is provided between the second source/drain patterns SD2.

Referring back to FIG. 24D, each of the first and second channel patterns CH1 and CH2 may not include the stacked first to third semiconductor patterns SP1, SP2, and SP3 previously described with reference to FIGS. 5A to 5D. Each of the first and second channel patterns CH1 and CH2 may be shaped like a single semiconductor pillar that protrudes above the device isolation layer ST.

The gate electrode GE may be provided on a top surface and opposite side surfaces of each of the first and second channel patterns CH1 and CH2. In other words, the transistor according to the present embodiment may be a three-dimensional field-effect transistor (e.g., FinFET), in which the gate electrode GE is provided to three-dimensionally surround the channel patterns.

The first interlayer insulating layer 110 and the second interlayer insulating layer 120 may be provided on the substrate 100. The active contacts AC may be provided to penetrate the first and second interlayer insulating layers 110 and 120 and to be connected to the first and second source/drain patterns SD1 and SD2, respectively. The gate contact GC may be provided to penetrate the second interlayer insulating layer 120 and the gate capping pattern GP and to be connected to the gate electrode GE. The active and gate contacts AC and GC may be substantially the same as those in the previous embodiment described with reference to FIGS. 4 and 5A to 5D.

The third interlayer insulating layer 130 may be provided on the second interlayer insulating layer 120. The fourth interlayer insulating layer 140 may be provided on the third interlayer insulating layer 130. The first metal layer M1 may be provided in the third interlayer insulating layer 130. The second metal layer M2 may be provided in the fourth interlayer insulating layer 140. The first and second metal layers M1 and M2 may be substantially the same as those in the previous embodiment described with reference to FIGS. 4 and 5A to 5D.

In a semiconductor device according to an embodiment, since a spacer is formed to have the same multi-layered structure on PMOSFET/NMOSFET regions, it may be possible to improve electric characteristics of a semiconductor device. Furthermore, it may be possible to effectively prevent a process failure, which may occur in a process of forming the spacer of the same structure on the PMOSFET/NMOSFET regions, and thereby to realize high reliability of the semiconductor device.

In detail, according to an embodiment, a selective oxidation process may be performed on a source/drain pattern to remove a disposable spacer and form a new spacer. Accordingly, it may be possible to prevent a process defect and to reduce a volume and a largest width of the source/drain pattern. Since the volume of the source/drain pattern is reduced, a parasitic capacitance between a gate electrode and the source/drain pattern may be decreased. Since the largest width of the source/drain pattern is reduced, it may be possible to prevent a short failure, in which adjacent ones of the source/drain patterns are in contact with each other. As a result, it may be possible to improve electric and reliability characteristics of the semiconductor device and to increase an integration density of the semiconductor device.

According to some embodiments, a disposable spacer (e.g., SiN) is formed, and an oxide layer is formed to protect a source/drain epitaxial pattern when the disposable spacer is removed. Furthermore, the oxide layer may be formed on the epitaxial pattern, thereby providing an epitaxial pattern with a unique structure. According to some embodiments, an MBCFET includes an epitaxial pattern of e-SiGe that is spaced apart from a spacer, with a fence of the spacer being located at a level lower than a neck portion of the e-SiGe. An oxide layer is uniquely left directly covering a surface of the e-SiGe pattern.

At least one of the components, elements, modules or units (collectively "components" in this paragraph) represented by a block in the drawings may be embodied as various numbers of hardware, software and/or firmware structures that execute respective functions described above. At least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above example embodiments may be implemented in algorithms that execute on one or more processors. Furthermore, the components represented by a block or processing steps may employ any number of related art techniques for electronics configuration, signal processing and/or control, data processing and the like.

While the disclosed embodiments have been particularly shown and described, it will be understood by one of ordinary skill in the art that variations in form and detail may be made therein without departing from the spirit and scope of the attached claims.

What is claimed is:

1. A semiconductor device, comprising:
an active pattern provided on a substrate;
a source/drain pattern provided on the active pattern;
a channel pattern configured to be connected to the source/drain pattern;
a gate electrode configured to be extended in a first direction and to cross the channel pattern; and
a first gate spacer provided on a side surface of the gate electrode,
wherein the first gate spacer comprises a fence portion provided on a side surface of the active pattern and below the source/drain pattern,
wherein the source/drain pattern comprises a body portion and a neck portion between the body portion and the active pattern,
wherein the body portion comprises a crystalline surface configured to be slantingly extended from the neck portion, and
wherein the crystalline surface is configured to be spaced apart from an uppermost portion of the fence portion.

2. The semiconductor device of claim 1, wherein the neck portion comprises a top surface that is exposed between the crystalline surface and the uppermost portion of the fence portion.

3. The semiconductor device of claim 2, further comprising a second gate spacer provided on the first gate spacer,
wherein the second gate spacer is configured to cover the crystalline surface and the top surface of the neck portion.

4. The semiconductor device of claim 1, further comprising:
a second gate spacer provided on the first gate spacer and the source/drain pattern; and
an oxide layer provided between the crystalline surface and the second gate spacer.

5. The semiconductor device of claim 4, wherein the oxide layer is configured to directly cover the crystalline surface.

6. The semiconductor device of claim 1, wherein a side surface of the neck portion is configured to be aligned to the side surface of the active pattern, and
wherein the fence portion of the first gate spacer is configured to cover the side surface of the neck portion and the side surface of the active pattern.

7. The semiconductor device of claim 1, wherein the neck portion is configured to protrude vertically relative to the uppermost portion of the fence portion,
wherein the crystalline surface is configured to be spaced apart from the uppermost portion of the fence portion, and
wherein a side surface of the neck portion is provided between the crystalline surface and the uppermost portion of the fence portion.

8. The semiconductor device of claim 7, further comprising a second gate spacer provided on the first gate spacer,
wherein the first gate spacer is configured to cover the side surface of the active pattern, and
wherein the second gate spacer is configured to cover the side surface of the neck portion.

9. The semiconductor device of claim 1, wherein the channel pattern comprises a plurality of semiconductor patterns configured to be stacked to be vertically spaced apart from each other, and
wherein the gate electrode is configured to enclose each of the semiconductor patterns of the plurality of semiconductor patterns.

10. The semiconductor device of claim 1, wherein the neck portion of the source/drain pattern comprises a first semiconductor layer,
wherein the body portion of the source/drain pattern comprises a second semiconductor layer,
wherein a germanium concentration of the first semiconductor layer is from about 0% to about 10%, and
wherein a germanium concentration of the second semiconductor layer is from about 30% to about 70%.

11. A semiconductor device, comprising:
an active pattern provided on a substrate;
a source/drain pattern provided on the active pattern;
a channel pattern configured to be connected to the source/drain pattern;
a gate electrode configured to be extended in a first direction and to cross the channel pattern;
a first spacer provided on the active pattern; and
a second spacer provided on the source/drain pattern,
wherein the source/drain pattern comprises a body portion and a neck portion of a semiconductor material between the body portion and the active pattern,
wherein the body portion comprises a crystalline surface configured to be slantingly extended from the neck portion,
wherein a top surface of the neck portion is exposed between the crystalline surface and the first spacer, and
wherein the second spacer is configured to cover the top surface of the neck portion.

12. The semiconductor device of claim 11, wherein the channel pattern comprises a plurality of semiconductor patterns configured to be stacked to be vertically spaced apart from each other, and
wherein the gate electrode is configured to enclose each of the semiconductor patterns of the plurality of semiconductor patterns.

13. The semiconductor device of claim 11, wherein the first spacer comprises a fence portion configured to cover a side surface of the neck portion, and
wherein an uppermost portion of the fence portion is located at a level that is equal to or lower than the top surface of the neck portion.

14. The semiconductor device of claim 11, wherein a dielectric constant of the first spacer is less than a dielectric constant of the second spacer.

15. The semiconductor device of claim 11, further comprising an oxide layer provided between the crystalline surface and the second spacer.

16. A semiconductor device, comprising:
a first active pattern and a second active pattern which are respectively provided on p-type metal-oxide-semiconductor (MOS) field-effect transistor (FET) (MOSFET) (PMOSFET) and n-type MOSFET (NMOSFET) regions of a substrate;
a device isolation layer configured to fill a trench between the first active pattern and the second active pattern;

a first source/drain pattern and a second source/drain pattern provided on the first active pattern and the second active pattern, respectively;

a first channel pattern provided on the first active pattern and configured to be connected to the first source/drain pattern;

a second channel pattern provided on the second active pattern and configured to be connected to the second source/drain pattern, wherein the first channel pattern comprises a first semiconductor pattern, a second semiconductor pattern, and a third semiconductor pattern, configured to be sequentially stacked to be spaced apart from each other, and wherein the second channel pattern comprises a fourth semiconductor pattern, a fifth semiconductor pattern, and a sixth semiconductor pattern configured to be sequentially stacked to be spaced apart from each other;

a gate electrode configured to be extended from a first region on the first channel pattern to a second region on the second channel pattern, the gate electrode configured to enclose each of the first to sixth semiconductor patterns;

a gate insulating layer provided between the channel patterns and the gate electrode;

a gate spacer provided on a side surface of the gate electrode;

a gate capping pattern provided on a top surface of the gate electrode;

a first interlayer insulating layer provided on the gate capping pattern;

an active contact configured to penetrate the first interlayer insulating layer and configured to be coupled to at least one of the first source/drain pattern and the second source/drain pattern;

a gate contact configured to penetrate the first interlayer insulating layer and configured to be coupled to the gate electrode;

a second interlayer insulating layer provided on the first interlayer insulating layer;

a first metal layer provided in the second interlayer insulating layer, the first metal layer comprising first interconnection lines configured to be electrically connected to the active contact and the gate contact;

a third interlayer insulating layer provided on the second interlayer insulating layer; and a second metal layer provided in the third interlayer insulating layer, wherein the second metal layer comprises second interconnection lines configured to be electrically connected to the first interconnection lines, wherein the gate spacer comprises a first gate spacer and a second gate spacer provided on the first gate spacer, wherein a dielectric constant of the first gate spacer is less than a dielectric constant of the second gate spacer, wherein the first gate spacer is configured to be extended from a side surface of the first active pattern to a side surface of the second active pattern while covering a top surface of the device isolation layer, and wherein the second gate spacer is configured to be extended from the first source/drain pattern to the second source/drain pattern along the first gate spacer.

17. The semiconductor device of claim 16, wherein the first source/drain pattern comprises a body portion and a neck portion between the body portion and the first active pattern, wherein the first gate spacer comprises a fence portion configured to cover a side surface of the neck portion, wherein the body portion comprises a crystalline surface configured to be slantingly extended from the neck portion, and wherein the crystalline surface is configured to be spaced apart from the fence portion.

18. The semiconductor device of claim 17, wherein the neck portion comprises a top surface that is exposed between the crystalline surface and the fence portion, and wherein the second gate spacer is configured to cover the exposed top surface of the neck portion.

19. The semiconductor device of claim 16, wherein the first source/drain pattern comprises a body portion and a neck portion between the body portion and the first active pattern, wherein the first gate spacer comprises a fence portion configured to cover the side surface of the first active pattern, wherein the neck portion is configured to protrude vertically relative to the fence portion, wherein the body portion comprises a crystalline surface configured to be slantingly extended from the neck portion, wherein the crystalline surface is configured to be spaced apart from the fence portion, and wherein a side surface of the neck portion is provided between the crystalline surface and the fence portion.

20. The semiconductor device of claim 19, wherein the second gate spacer is configured to cover the side surface of the neck portion.

* * * * *